(12) United States Patent
Obu et al.

(10) Patent No.: US 11,121,153 B1
(45) Date of Patent: Sep. 14, 2021

(54) THREE-DIMENSIONAL MEMORY DEVICES CONTAINING STRUCTURES FOR CONTROLLING GATE-INDUCED DRAIN LEAKAGE CURRENT AND METHOD OF MAKING THE SAME

(71) Applicant: SANDISK TECHNOLOGIES LLC, Addison, TX (US)

(72) Inventors: Tomoyuki Obu, Yokkaichi (JP); Shinsuke Yada, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/800,097

(22) Filed: Feb. 25, 2020

(51) Int. Cl.
*H01L 21/00* (2006.01)
*H01L 27/11582* (2017.01)
(Continued)

(52) U.S. Cl.
CPC .. *H01L 27/11582* (2013.01); *H01L 21/02236* (2013.01); *H01L 21/31111* (2013.01); *H01L 27/11519* (2013.01); *H01L 27/11526* (2013.01); *H01L 27/11548* (2013.01); *H01L 27/11556* (2013.01); *H01L 27/11565* (2013.01);
(Continued)

(58) Field of Classification Search
CPC ......... H01L 27/11582; H01L 29/40114; H01L 29/40117; H01L 21/02236; H01L 21/31111; H01L 27/11519; H01L 27/11556; H01L 27/11565; H01L 29/0688; H01L 29/1037; H01L 29/41741; H01L 29/4234; H01L 29/66545; H01L 29/6656;
(Continued)

(56) References Cited

U.S. PATENT DOCUMENTS 9,799,670 B2 10/2017 Nishikawa et al.
9,831,266 B2 11/2017 Kai et al.
(Continued)

FOREIGN PATENT DOCUMENTS

KR 10-1082098 B1 11/2011
KR 10-2014-0017750 A 2/2014
(Continued)

OTHER PUBLICATIONS

USPTO Office Communication, Notice of Allowance and Fee(s) Due for U.S. Appl. No. 16/800,078, dated Feb. 17, 2021, 14 pages.
(Continued)

*Primary Examiner* — Richard A Booth
(74) *Attorney, Agent, or Firm* — The Marbury Law Group PLLC

(57) ABSTRACT

An alternating stack of insulating layers and sacrificial material layers is formed over a substrate. Memory openings are formed through the alternating stack. A layer stack including a charge storage layer, a tunneling dielectric layer, a semiconductor material layer, and a dielectric material layer is formed in the memory openings. The dielectric material layer may include a doped silicate glass layer. A doped silicate glass pillar can be formed at a bottom portion of each memory opening, and a bottom portion of the semiconductor material layer can be converted into a source region by outdiffusion of dopants from the doped silicate glass pillar. Alternatively, the semiconductor material layer can be heavily doped, and can be recessed to form a source region.

13 Claims, 57 Drawing Sheets

(51) Int. Cl.

| | |
|---|---|
| *H01L 29/66* | (2006.01) |
| *H01L 27/11519* | (2017.01) |
| *H01L 29/10* | (2006.01) |
| *H01L 29/06* | (2006.01) |
| *H01L 21/311* | (2006.01) |
| *H01L 21/28* | (2006.01) |
| *H01L 21/02* | (2006.01) |
| *H01L 27/11573* | (2017.01) |
| *H01L 27/11575* | (2017.01) |
| *H01L 27/11526* | (2017.01) |
| *H01L 27/11548* | (2017.01) |
| *H01L 27/11556* | (2017.01) |
| *H01L 27/11565* | (2017.01) |
| *H01L 29/423* | (2006.01) |
| *H01L 29/788* | (2006.01) |
| *H01L 29/792* | (2006.01) |
| *H01L 29/417* | (2006.01) |

(52) U.S. Cl.
CPC .. *H01L 27/11573* (2013.01); *H01L 27/11575* (2013.01); *H01L 29/0688* (2013.01); *H01L 29/1037* (2013.01); *H01L 29/40114* (2019.08); *H01L 29/40117* (2019.08); *H01L 29/41741* (2013.01); *H01L 29/4234* (2013.01); *H01L 29/42324* (2013.01); *H01L 29/6656* (2013.01); *H01L 29/66545* (2013.01); *H01L 29/66825* (2013.01); *H01L 29/66833* (2013.01); *H01L 29/7883* (2013.01); *H01L 29/7889* (2013.01); *H01L 29/7926* (2013.01)

(58) Field of Classification Search
CPC ......... H01L 29/66825; H01L 29/66833; H01L 29/7883; H01L 29/7889; H01L 29/7926
See application file for complete search history.

(56) References Cited

U.S. PATENT DOCUMENTS

| | | | |
|---|---|---|---|
| 9,876,031 | B1 | 1/2018 | Shimizu et al. |
| 9,917,100 | B2 | 3/2018 | Zhang et al. |
| 9,935,123 | B2 | 4/2018 | Nishikawa et al. |
| 9,985,098 | B2 | 5/2018 | Matsumoto et al. |
| 10,008,570 | B2 | 6/2018 | Yu et al. |
| 10,020,363 | B2 | 7/2018 | Ogawa et al. |
| 10,115,681 | B1 | 10/2018 | Ariyoshi |
| 10,199,359 | B1 | 2/2019 | Sakakibara et al. |
| 10,224,340 | B2 | 3/2019 | Hada et al. |
| 10,290,650 | B1 | 5/2019 | Iwai |
| 10,381,373 | B2 | 8/2019 | Okizumi et al. |
| 2018/0374866 | A1 | 12/2018 | Makala et al. |
| 2019/0333581 | A1 | 10/2019 | Diep et al. |
| 2019/0371807 | A1 | 12/2019 | Niskikawa et al. |
| 2019/0386108 | A1 | 12/2019 | Nishikawa et al. |
| 2020/0006371 | A1* | 1/2020 | Huo ............... H01L 27/1157 |
| 2020/0027835 | A1 | 1/2020 | Hsu et al. |
| 2020/0098781 | A1* | 3/2020 | Xiao ............... H01L 27/11582 |
| 2021/0134835 | A1* | 5/2021 | Liu ............... H01L 21/31116 |

FOREIGN PATENT DOCUMENTS

| | | |
|---|---|---|
| KR | 10-2019-0034864 A | 2/2014 |
| WO | WO2016-093947 A1 | 6/2016 |

OTHER PUBLICATIONS

Notification of Transmittal of the International Search Report and Written Opinion of the International Search Authority for International Patent Application No. PCT/US2020/037877, dated Nov. 19, 2020, 11 pages.
Endoh et al., "Novel Ultra High Density Memory with a Stacked-Surrounding Gate Transistor (S-SGT) Structured Cell," IEDM Proc., (2001), 33-36.
U.S. Appl. No. 16/697,560, filed Nov. 27, 2019, SanDisk Technologies LLC.
U.S. Appl. No. 16/406,335, filed May 8, 2019, SanDisk Technologies LLC.
U.S. Appl. No. 16/394,233, filed Apr. 25, 2019, SanDisk Technologies LLC.
U.S. Appl. No. 16/407,310, filed May 9, 2019, SanDisk Technologies LLC.
U.S. Appl. No. 16/408,722, filed May 10, 2019, SanDisk Technologies LLC.
U.S. Appl. No. 16/268,183, filed Feb. 5, 2019, SanDisk Technologies LLC.
U.S. Appl. No. 16/268,132, filed Feb. 5, 2019, SanDisk Technologies LLC.
U.S. Appl. No. 16/241,221, filed Jan. 7, 2019, SanDisk Technologies LLC.
U.S. Appl. No. 16/241,171, filed Jan. 7, 2019, SanDisk Technologies LLC.
U.S. Appl. No. 16/200,115, filed Nov. 26, 2018, SanDisk Technologies LLC.
U.S. Appl. No. 16/196,026, filed Nov. 20, 2018, SanDisk Technologies LLC.

* cited by examiner

THREE-DIMENSIONAL MEMORY DEVICES CONTAINING STRUCTURES FOR CONTROLLING GATE-INDUCED DRAIN LEAKAGE CURRENT AND METHOD OF MAKING THE SAME

FIELD

The present disclosure relates generally to the field of semiconductor devices, and particularly to three-dimensional memory devices containing structures for controlling gate-induced drain leakage current and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell," IEDM Proc. (2001) 33-36.

SUMMARY

According to an aspect of the present disclosure, a three-dimensional memory device is provided, which comprises: a source contact layer located over a substrate and comprising a doped semiconductor material; an alternating stack of insulating layers and electrically conductive layers located over the source contact layer; memory openings vertically extending through the alternating stack and the source contact layer; and memory opening fill structures located in the memory openings, wherein each of the memory opening fill structures comprises: a memory film including a first tubular portion that vertically extends through the alternating stack; a semiconductor channel contacting an inner sidewall of the memory film; a source region adjoined to a bottom end of the semiconductor channel and contacting the source contact layer; and a doped silicate glass pillar laterally surrounded by the source region and located below a horizontal plane including a bottommost surface of the alternating stack.

According to another aspect of the present disclosure, a method of forming a three-dimensional memory device is provided, which comprises: forming an alternating stack of insulating layers and sacrificial material layers over a substrate; forming memory openings through the alternating stack; sequentially depositing a layer stack comprising a charge storage layer, a tunneling dielectric layer, a semiconductor channel material layer, and a doped silicate glass layer in the memory openings; removing portions of the doped silicate glass layer located at levels of the alternating stack, wherein remaining portions of the doped silicate glass layer comprise doped silicate glass pillars; forming semiconductor channels in the memory openings by removing portions of the semiconductor channel material layer located outside the memory openings; converting a lower portion of each semiconductor channel into a source region by outdiffusing dopants from the doped silicate glass pillars to adjacent portions of the semiconductor channels; and replacing the sacrificial material layers with electrically conductive layers.

According to yet another aspect of the present disclosure, a three-dimensional memory device is provided, which comprises: a source contact layer located over a substrate and comprising a doped semiconductor material; an alternating stack of insulating layers and electrically conductive layers located over the source contact layer; memory openings vertically extending through the alternating stack and the source contact layer; and memory opening fill structures located in the memory openings, wherein each of the memory opening fill structures comprises: a memory film including a first tubular portion that vertically extends through the alternating stack; a semiconductor channel contacting an inner sidewall of the memory film; a source region adjoined to a bottom end of the semiconductor channel and contacting the source contact layer; a dielectric pillar laterally surrounded by the source region; and a dielectric core laterally surrounded by a vertically-extending portion of the semiconductor channel and vertically spaced from the dielectric pillar by a bottom portion of the semiconductor channel.

According to still another aspect of the present disclosure, a method of forming a three-dimensional memory device is provided, which comprises: forming an alternating stack of insulating layers and sacrificial material layers over a substrate; forming memory openings through the alternating stack and a source-level sacrificial layer; sequentially depositing a layer stack comprising a charge storage layer, a tunneling dielectric layer, a source material layer, and a dielectric fill material layer in the memory openings; forming a dielectric pillar in each memory opening by recessing the dielectric fill material layer; forming a source region in each memory opening by recessing the source material layer; forming a semiconductor channel in each memory opening over a respective one of the source regions and a respective one of the dielectric pillars; and replacing the sacrificial material layers with electrically conductive layers.

DETAILED DESCRIPTION

Figure 1A:
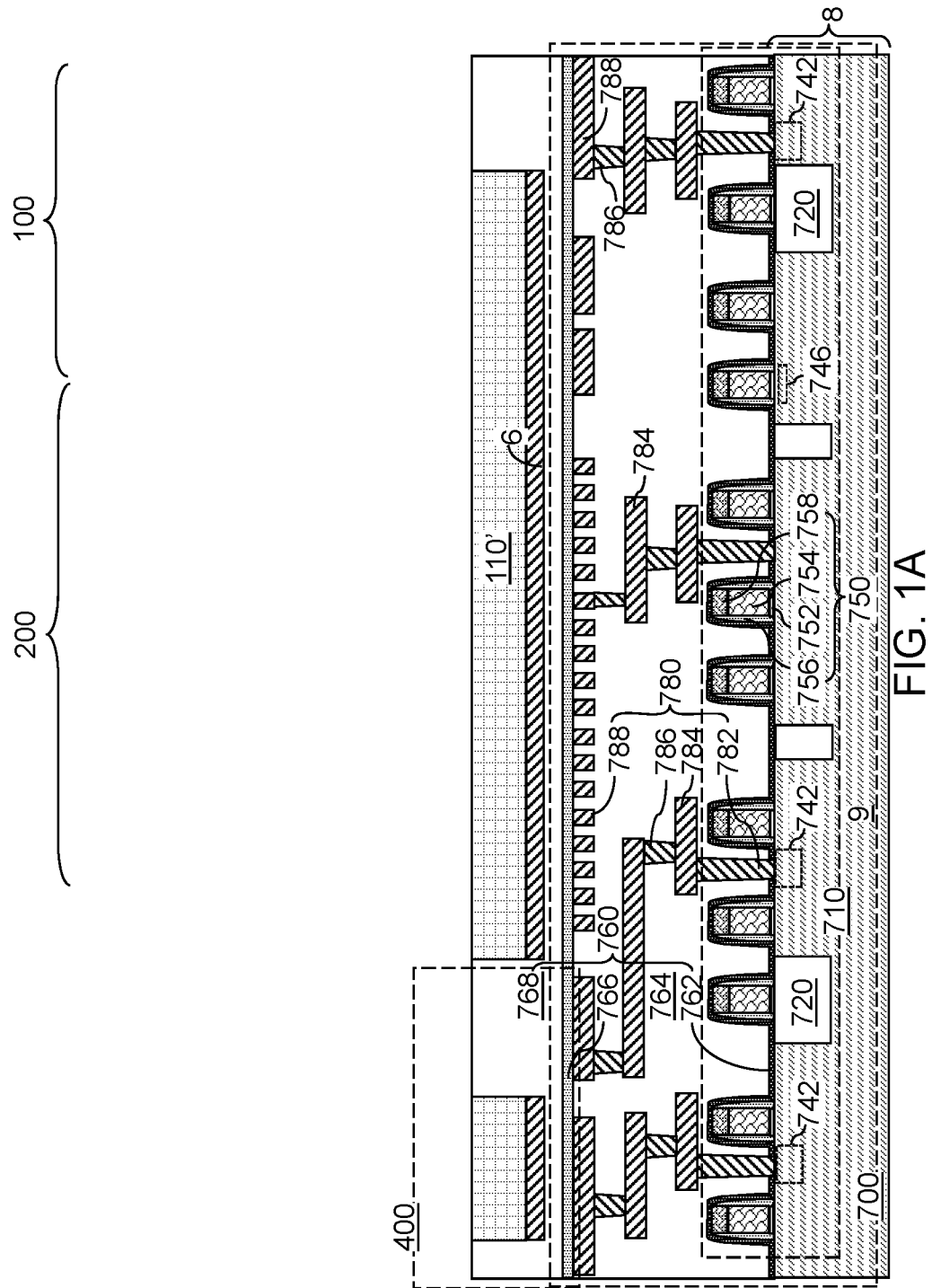
FIG. 1A is a vertical cross-sectional view of an first exemplary structure after formation of semiconductor devices, lower level dielectric layers, lower metal interconnect structures, and in-process source level material layers on a semiconductor substrate according to a first embodiment of the present disclosure.

As discussed above, embodiments of the present disclosure are directed to three-dimensional memory devices containing structures for controlling gate-induced drain leakage current and methods of manufacturing the same, the various aspects of which are described herein in detail. The embodiments of the present disclosure may be used to form various semiconductor devices such as three-dimensional monolithic memory array devices comprising a plurality of NAND memory strings. The drawings are not drawn to scale.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
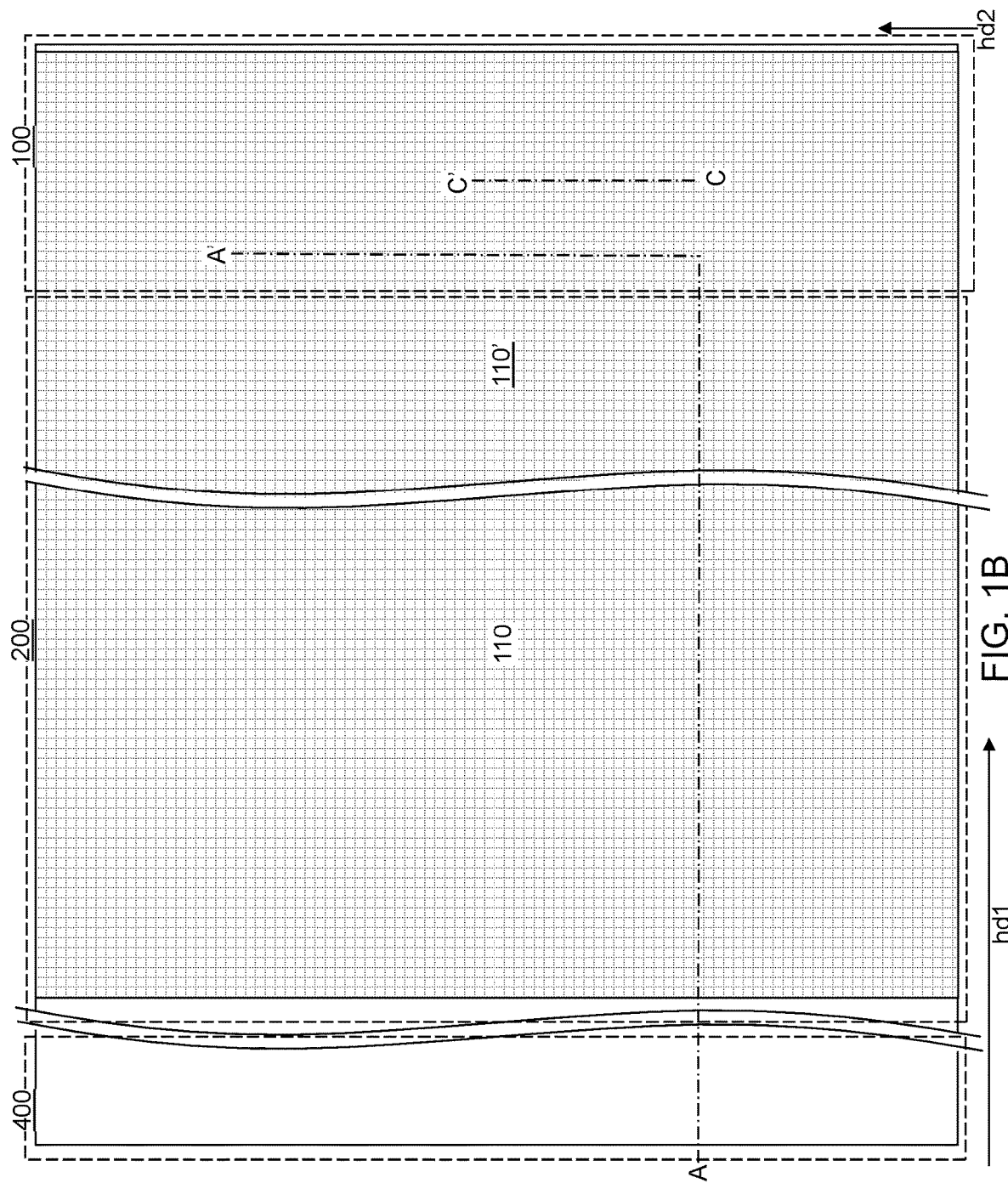
FIG. 1B is a top-down view of the first exemplary structure of FIG. 1A. The hinged vertical plane A-A' is the plane of the vertical cross-sectional view of FIG. 1A.
Figure 1C:
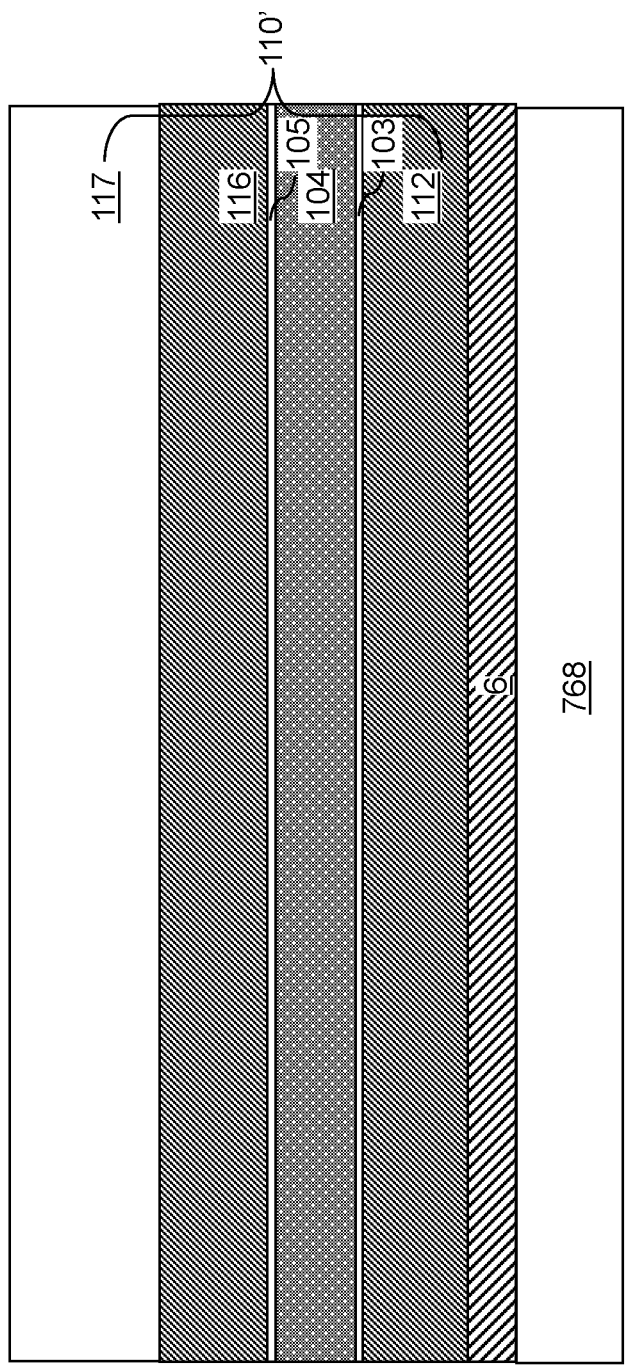
FIG. 1C is a magnified view of the in-process source level material layers along the vertical plane C-C' of FIG. 1B.

Referring to FIGS. 1A-1C, a first exemplary structure according to a first embodiment of the present disclosure is illustrated. FIG. 1C is a magnified view of an in-process source-level material layers 110' illustrated in FIGS. 1A and 1B. The first exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer 766 (e.g., hydrogen diffusion barrier) that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, and a source-level insulating layer 117.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of semiconductor channels to be subsequently formed. For example, if the semiconductor channels to be subsequently formed have a doping of a first conductivity type, the lower source-level semiconductor layer 112 and the upper source-level semiconductor layer 116 have a doping of a second conductivity type that is the opposite of the first conductivity type. If the first conductivity type is p-type, then the second conductivity type in n-type, and vice versa. For example, if the first conductivity type is p-type, then the lower source-level semiconductor layer 112 and the upper source-level semiconductor layer 116 may be doped with n-type dopants such as arsenic or phosphorus. The atomic concentration of dopants of the second conductivity type in the lower source-level semiconductor layer 112 and the upper source-level semiconductor layer 116 can be in a range from $5.0\times10^{18}/cm^3$ to $2.0\times10^{21}/cm^3$, although lesser and greater atomic concentrations can also be employed. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a dielectric material such as silicon nitride. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
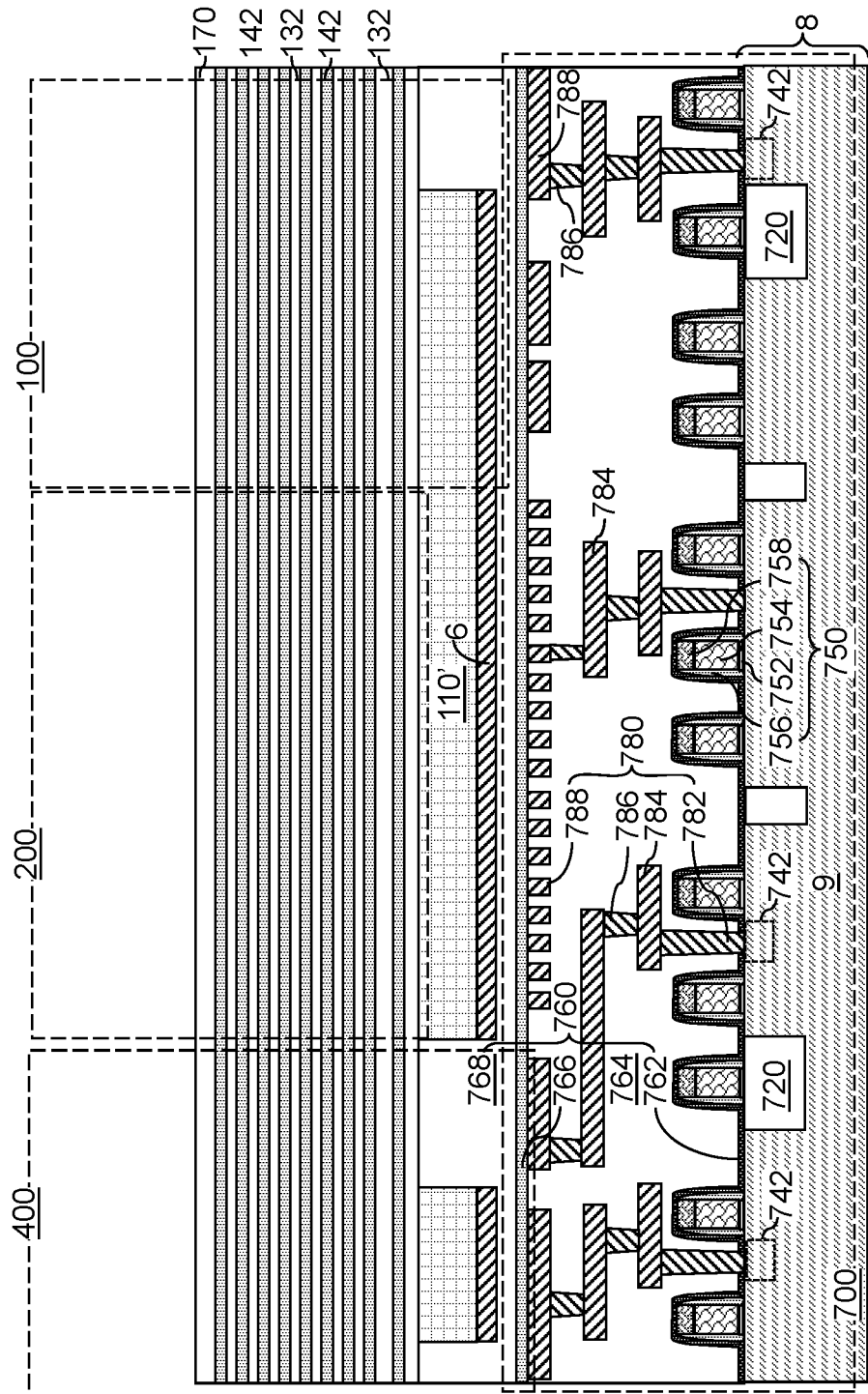
FIG. 2 is a vertical cross-sectional view of the first exemplary structure after formation of a first-tier alternating stack of first insulting layers and first spacer material layers according to the first embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
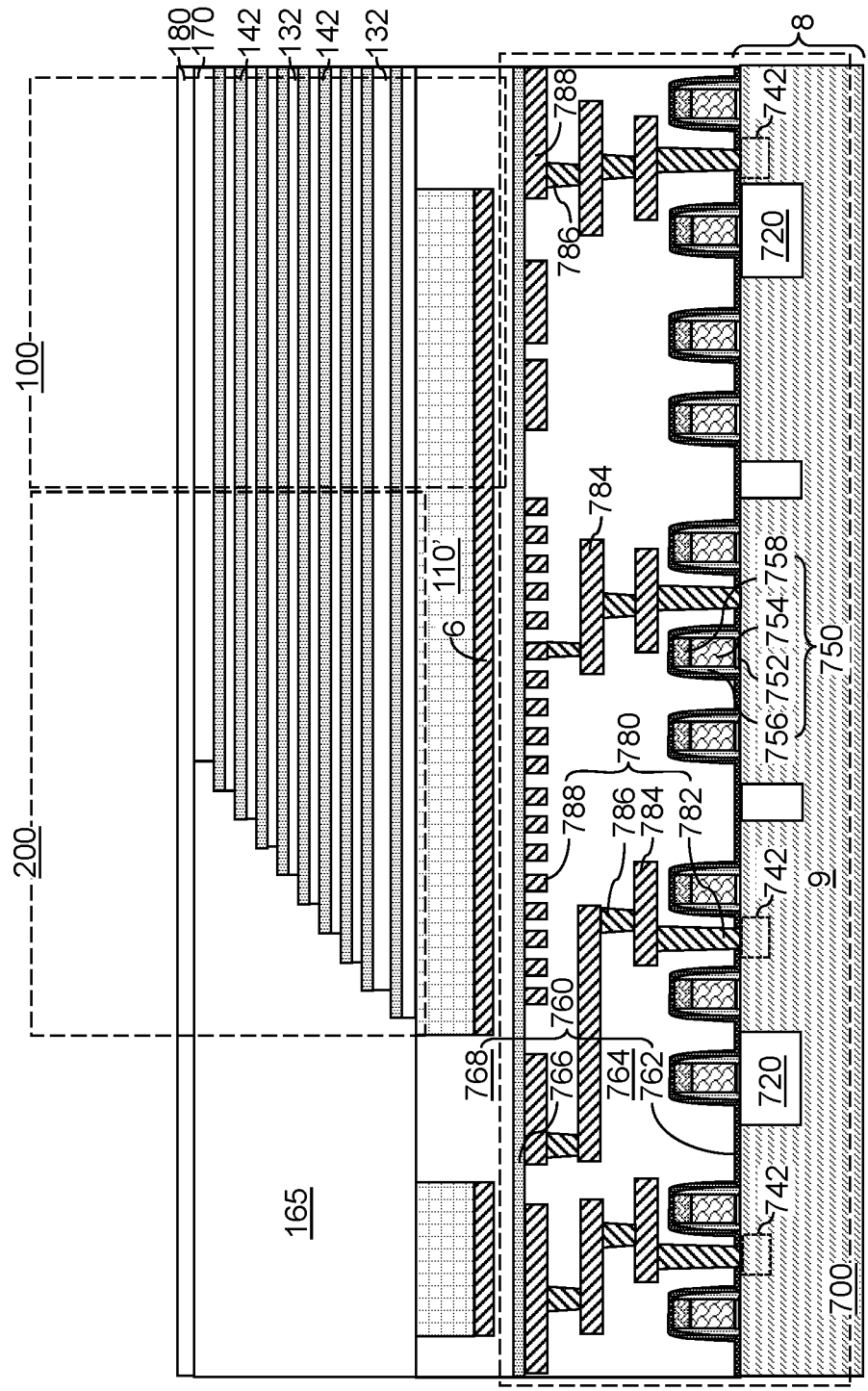
FIG. 3 is a vertical cross-sectional view of the first exemplary structure after patterning a first-tier staircase region, a first retro-stepped dielectric material portion, and an inter-tier dielectric layer according to the first embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitutes a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
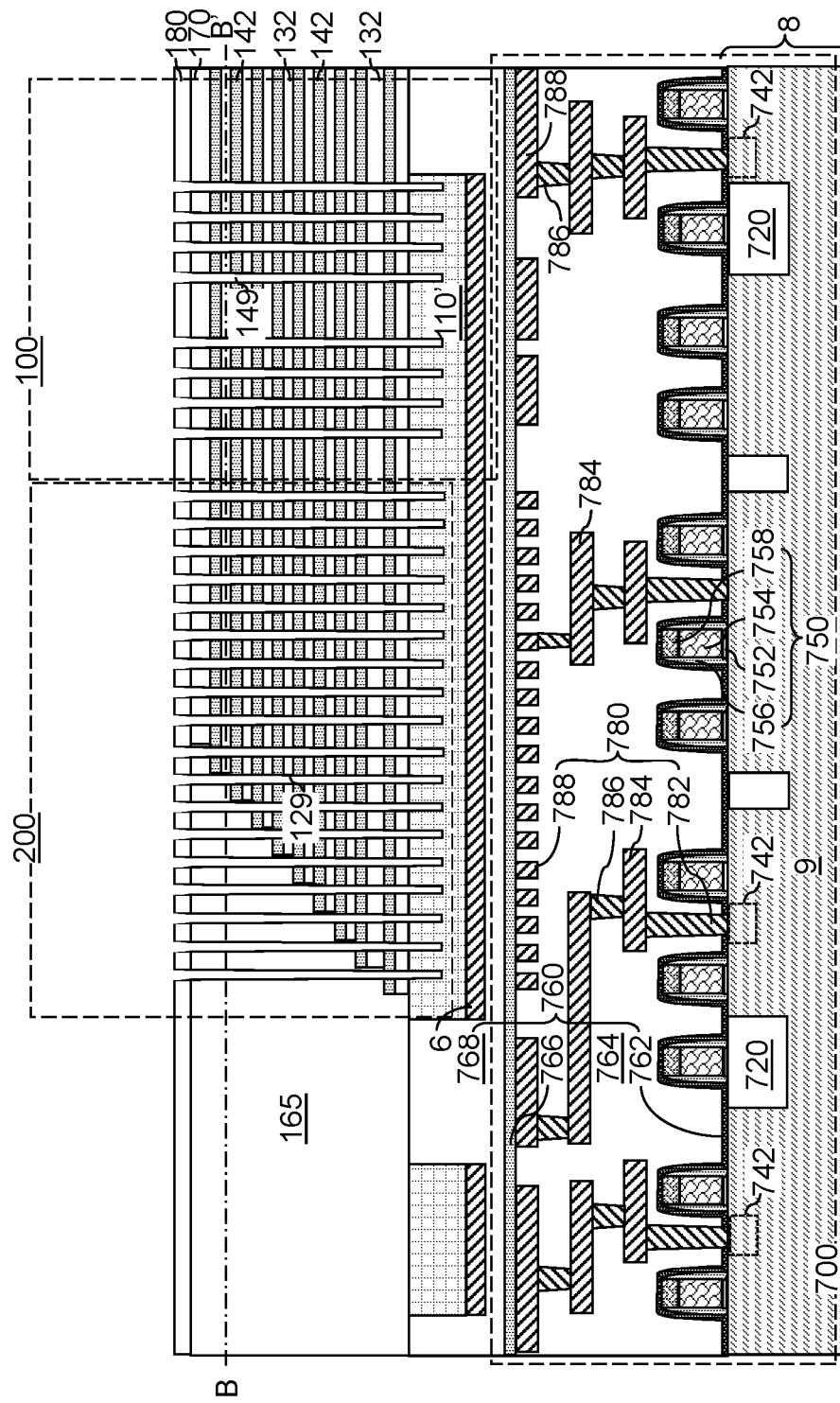
FIG. 4A is a vertical cross-sectional view of the first exemplary structure after formation of first-tier memory openings and first-tier support openings according to the first embodiment of the present disclosure.
Figure 4B:
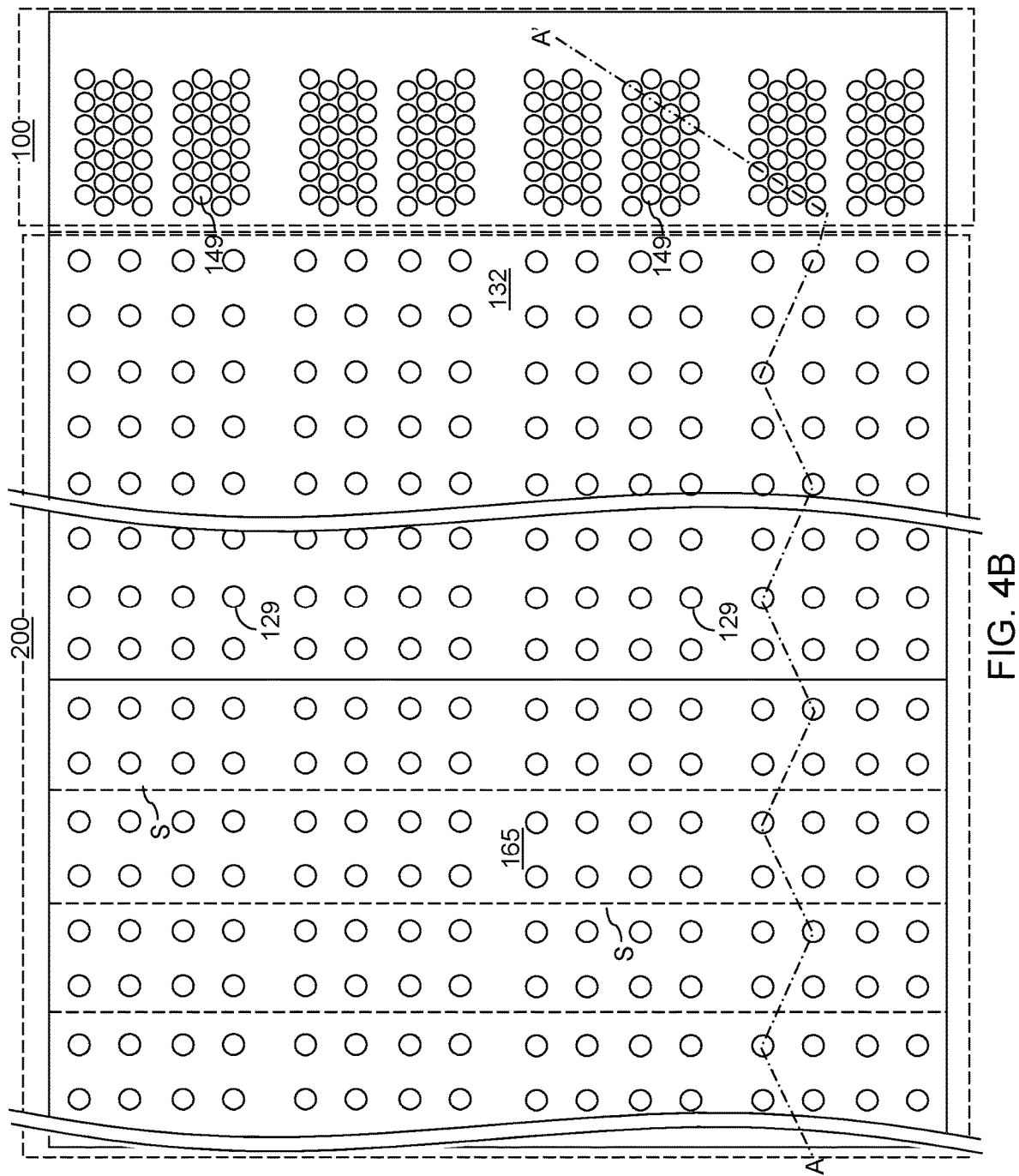
FIG. 4B is a horizontal cross-sectional view of the first exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
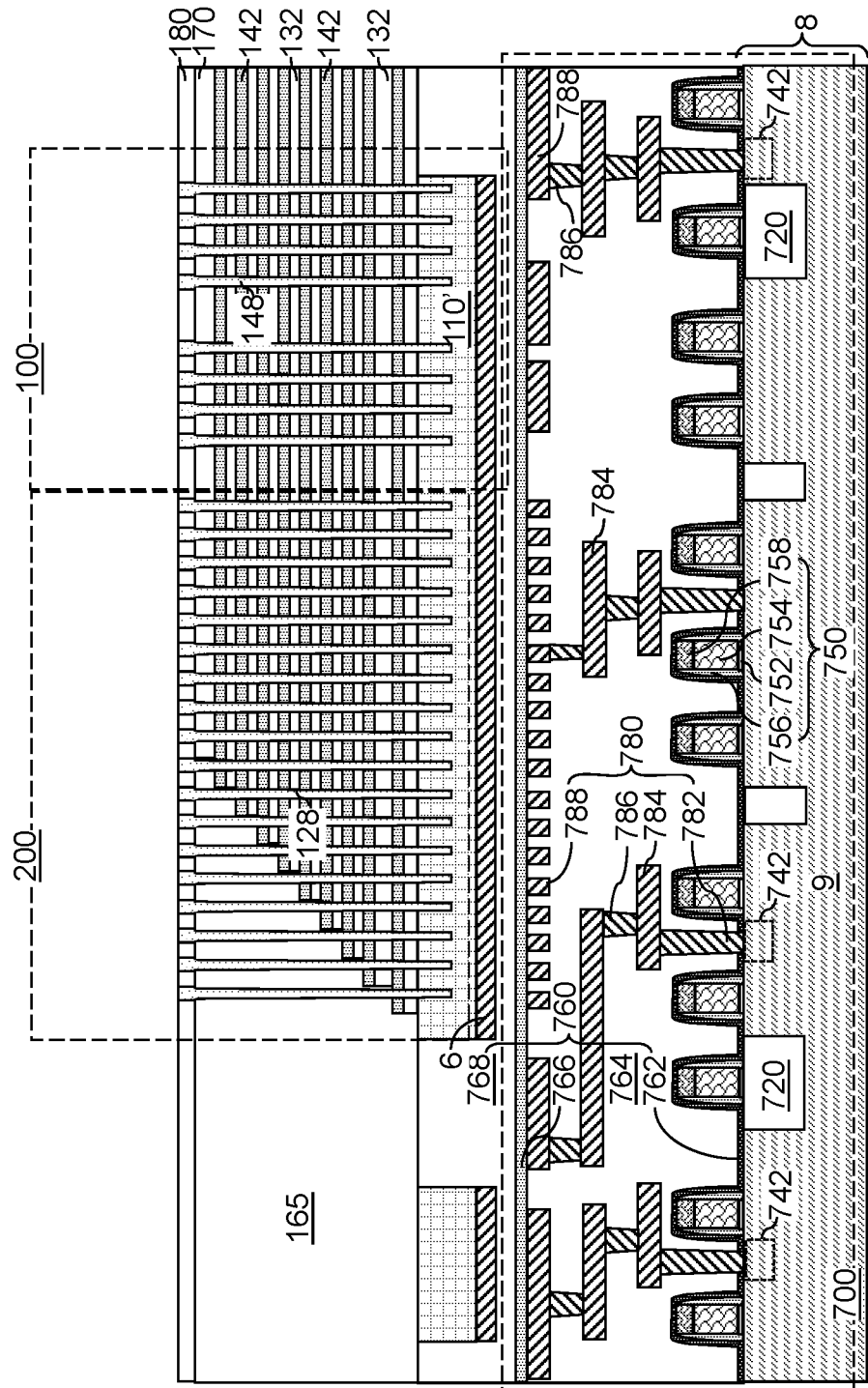
FIG. 5 is a vertical cross-sectional view of the first exemplary structure after formation of various sacrificial fill structures according to the first embodiment of the present disclosure.

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
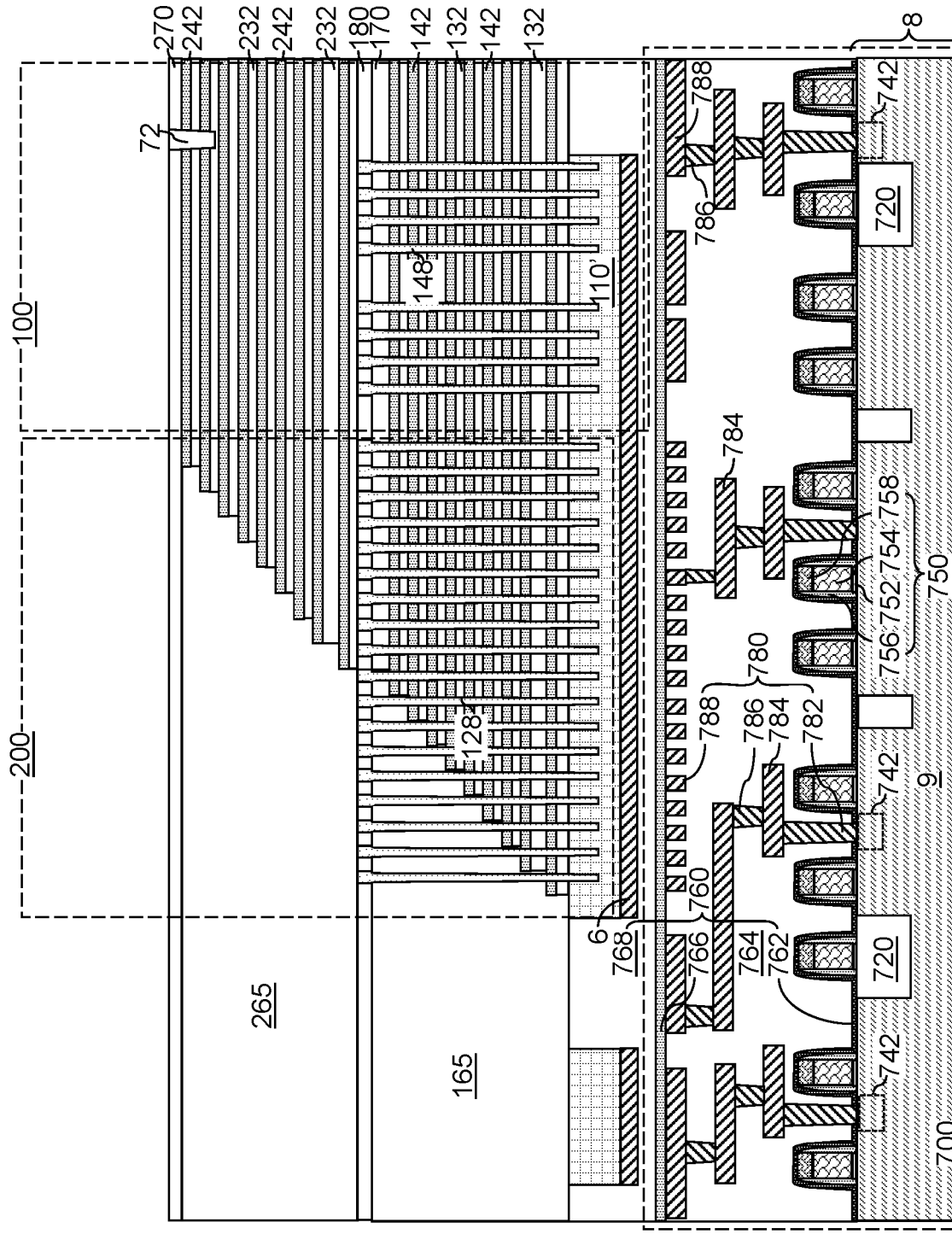
FIG. 6 is a vertical cross-sectional view of the first exemplary structure after formation of a second-tier alternating stack of second insulating layers and second spacer material layers, second stepped surfaces, and a second retro-stepped dielectric material portion according to the first embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200. A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
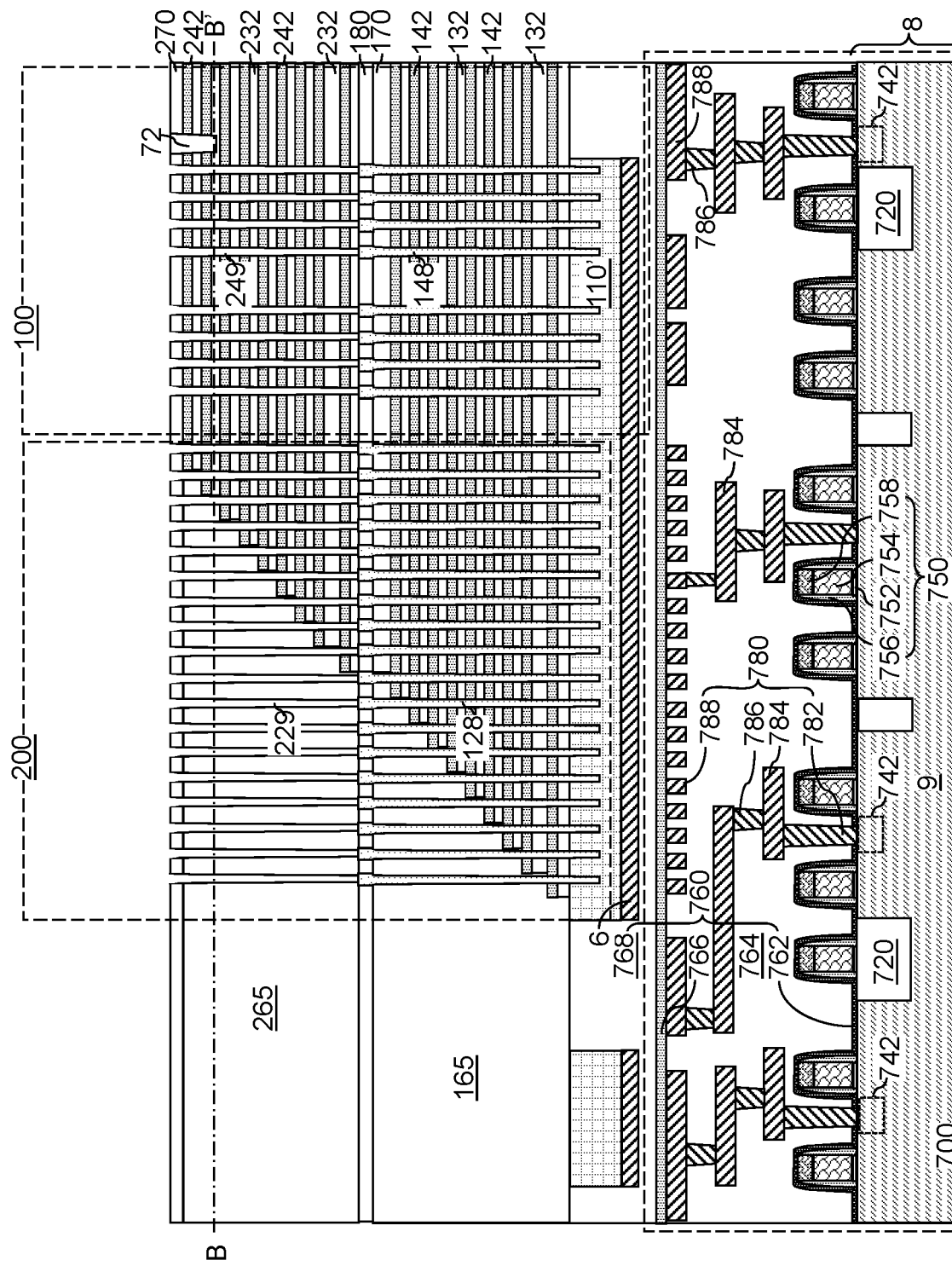
FIG. 7A is a vertical cross-sectional view of the first exemplary structure after formation of second-tier memory openings and second-tier support openings according to the first embodiment of the present disclosure.
Figure 7B:
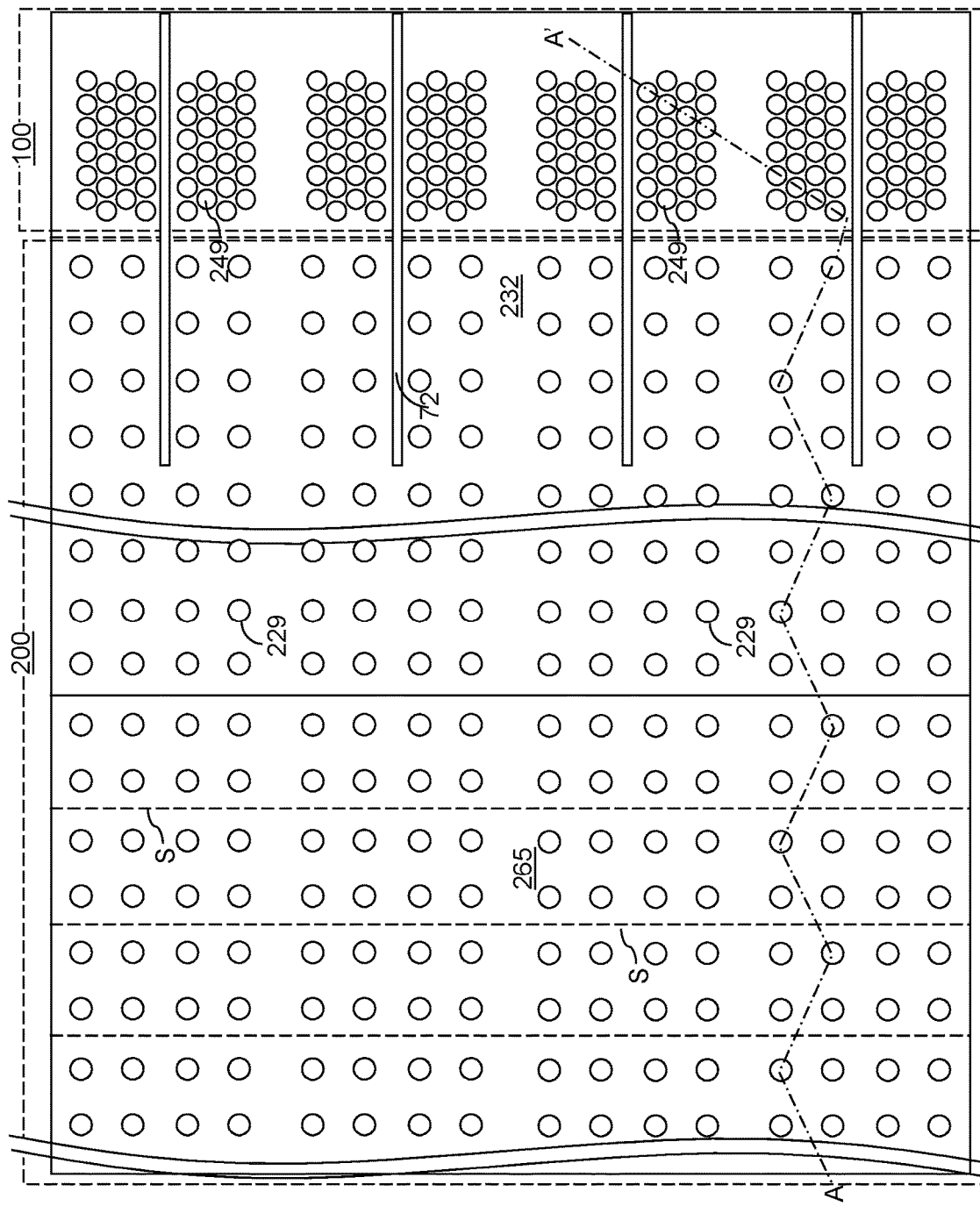
FIG. 7B is a horizontal cross-sectional view of the first exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
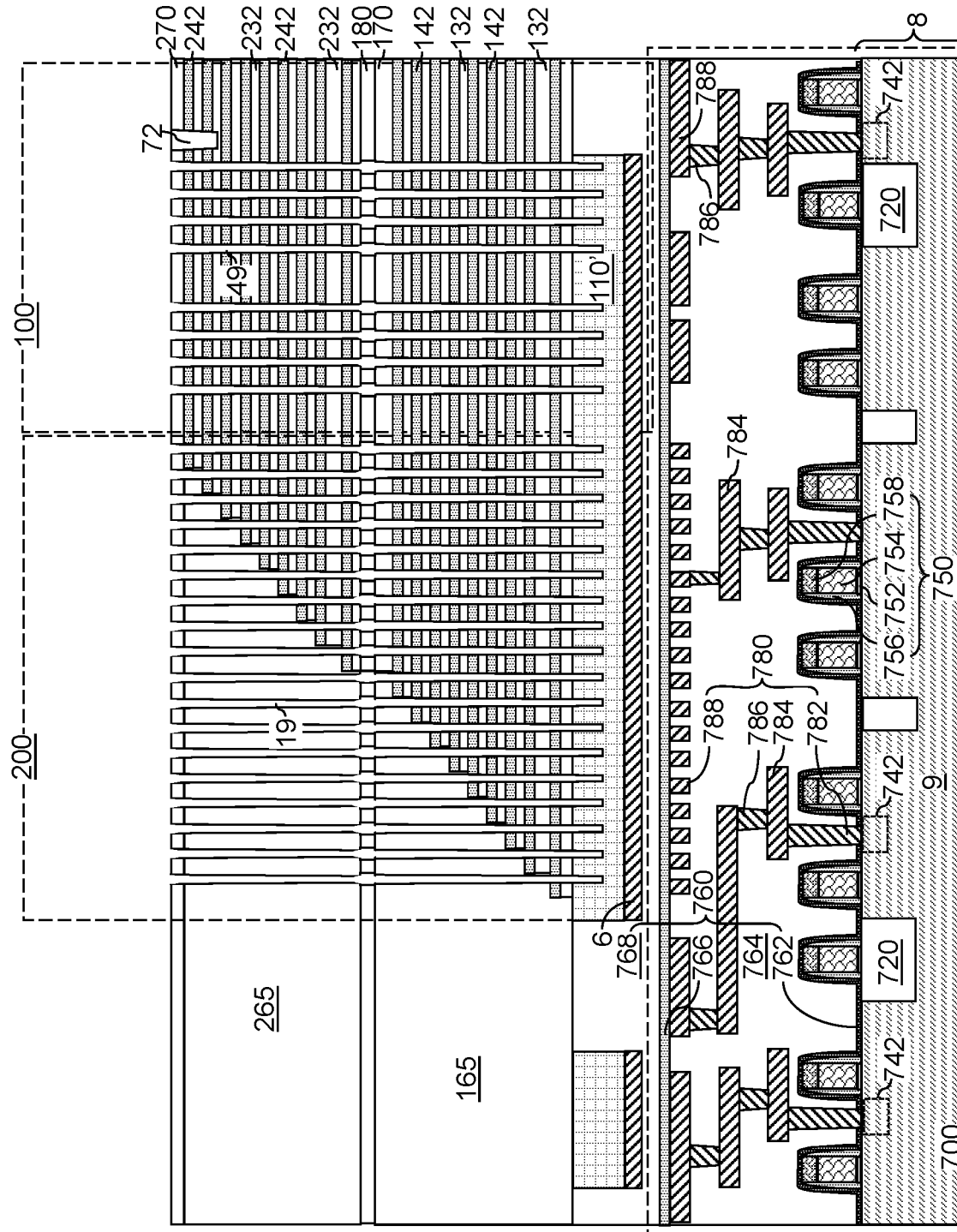
FIG. 8 is a vertical cross-sectional view of the first exemplary structure after formation of inter-tier memory openings and inter-tier support openings according to the first embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

Figure 9A:
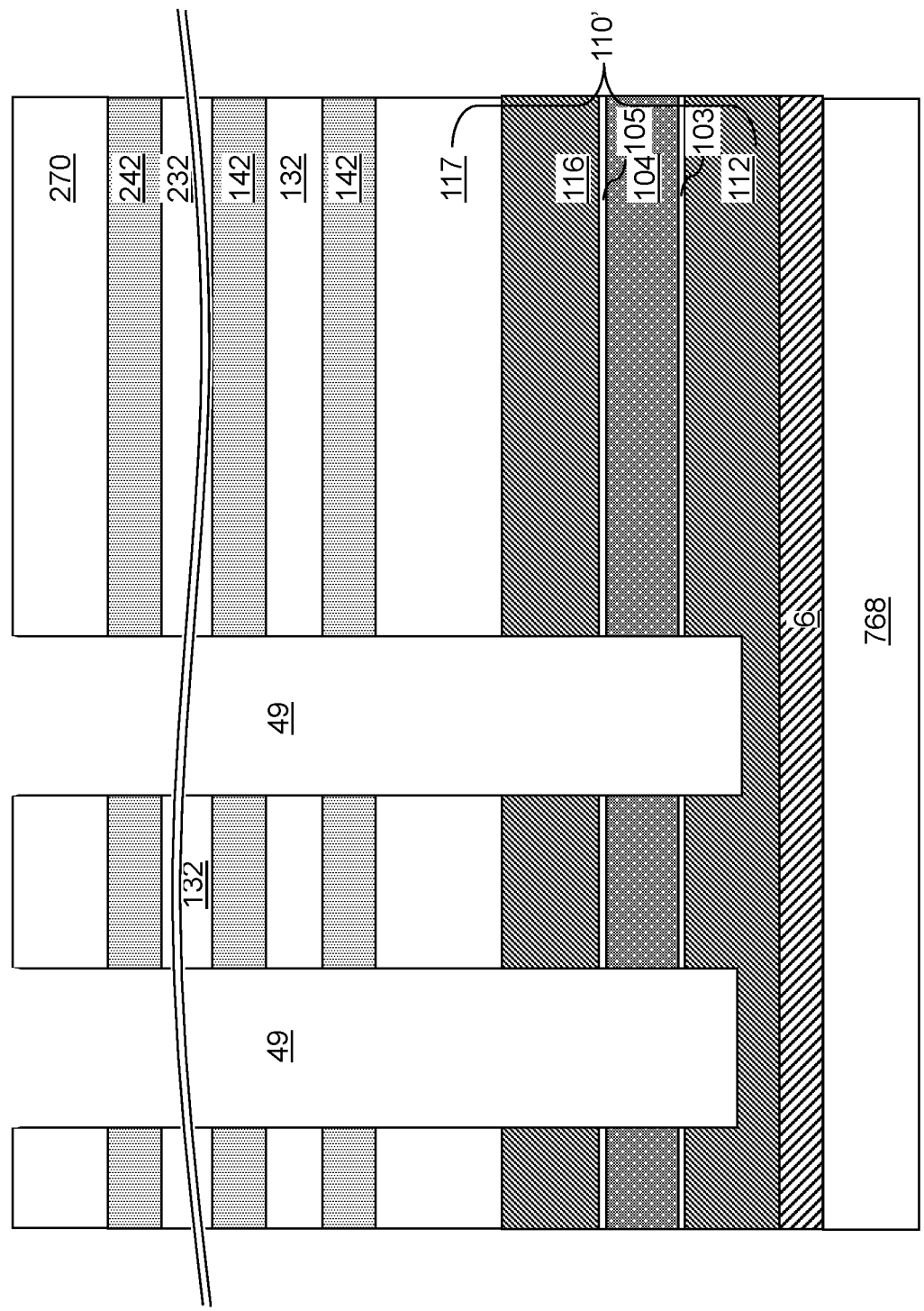
FIGS. 9A-9I illustrate sequential vertical cross-sectional views of a region including a pair of memory openings during formation of memory opening fill structures according to the first embodiment of the present disclosure.

FIGS. 9A-9I illustrate sequential vertical cross-sectional views of a region including a pair of memory openings 49 during formation of memory opening fill structures. The same structural change occurs in each of the memory openings 49 and the support openings 19. FIG. 9A illustrates the region including the pair of memory openings 49 at the processing steps of FIG. 8.

While the present disclosure is described employing an embodiment in which memory openings 49 and support openings 19 vertically extend through a first alternating stack (132, 142) and a second alternating stack (232, 242) into the in-process source-level material layers 110', embodiments are expressly contemplated herein in which the memory openings 49 and the support openings 19 vertically extend a single alternating stack of insulating layers and spacer material layers, or through three or more alternating stacks of insulating layers and sacrificial material layers. Generally, at least one alternating stack of insulating layers and sacrificial material layers can be formed over the in-process source-level material layers 110', and the memory openings 49 and the support openings 19 can be formed through the at least one alternating stack and into the in-process source-level material layers 110'.

Figure 9B:
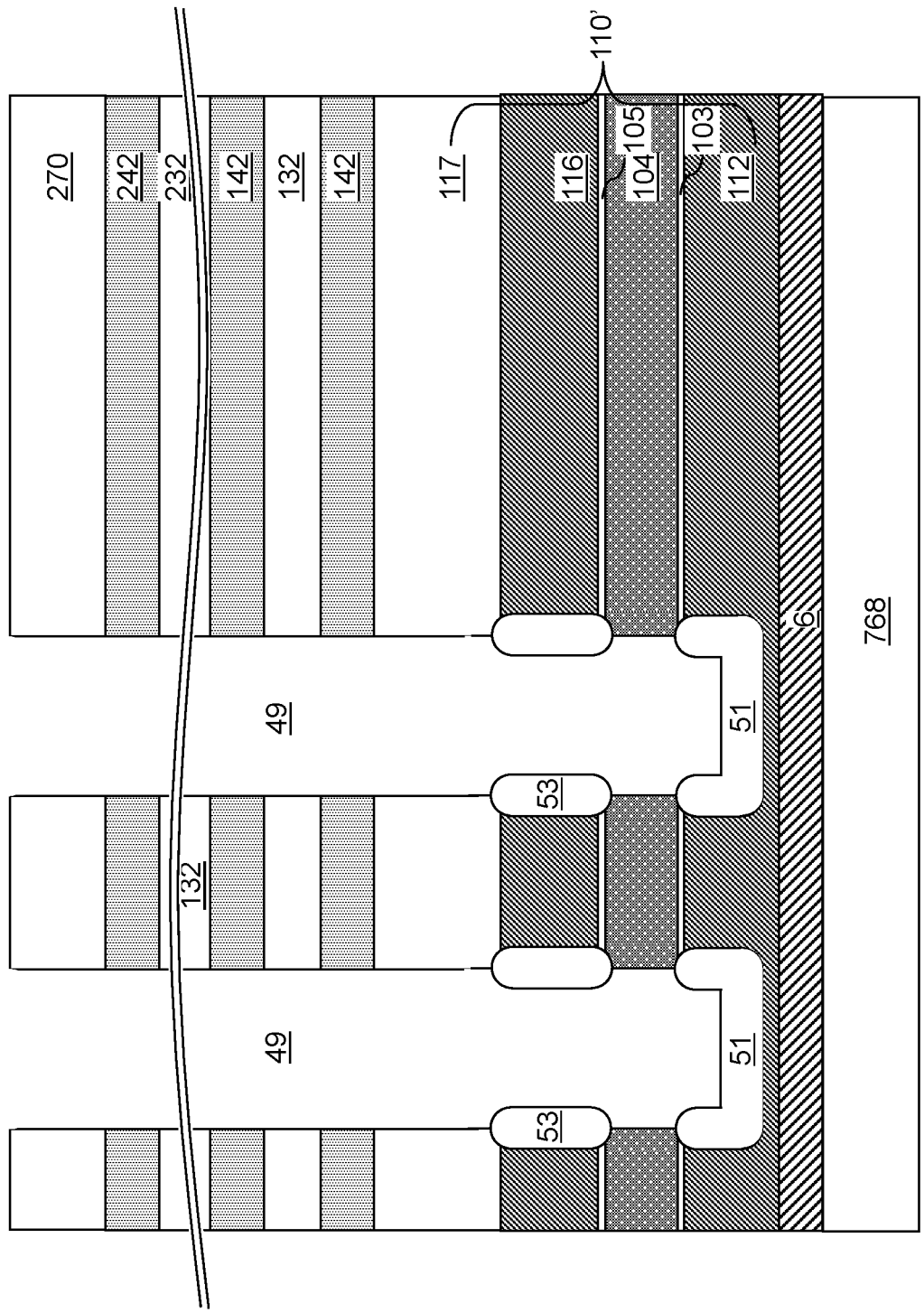

Referring to FIG. 9B, a selective oxidation process can be performed to convert surfaces portions of the upper source-level semiconductor layer 116 and surface portions of the lower source-level semiconductor layer 112 that are physically exposed to the memory openings 49 and the support openings 19. The source-level sacrificial layer 104 includes a dielectric material having an oxidation rate that is at least one order of magnitude lower than the oxidation rate of the materials of the upper source-level semiconductor layer 116 and the lower source-level semiconductor layer 112. For example, the lower source-level semiconductor layer 112 and the upper source-level semiconductor layer 116 can include a doped semiconductor material such as doped silicon having a doping of the second conductivity type, and the source-level sacrificial layer 104 can include silicon nitride. The oxidation process may include a thermal oxidation process or a plasma oxidation process.

Tubular semiconductor oxide spacers 53 can be formed by oxidizing physically exposed surface portions of the upper source-level semiconductor layer 116 around each memory opening 49, and semiconductor oxide material portions 51 can be formed by oxidizing physically exposed surface portions of the lower source-level semiconductor layer 112 around each of the memory openings 49. Portions of the tubular semiconductor oxide spacers 53 and the semiconductor oxide material portions 51 can have a uniform thickness in a range from 5% to 25% of the lateral dimension (such as the diameter or the minor axis) of each memory opening 49 at the level of the lower source-level semiconductor layer 112. For example, the uniform thickness may be in a range from the 10 nm to 100 nm.

Each tubular semiconductor oxide spacer 53 can include a cylindrical inner sidewall, an upper annular convex inner surface segment adjoined to an upper periphery of the cylindrical inner sidewall, and a lower annular convex inner surface segment adjoined to a lower periphery of the cylindrical inner sidewall. Each semiconductor oxide material portion 51 can include a planar portion having a uniform vertical thickness, and a tubular portion adjoined to an upper periphery of the planar portion.

Figure 9C:
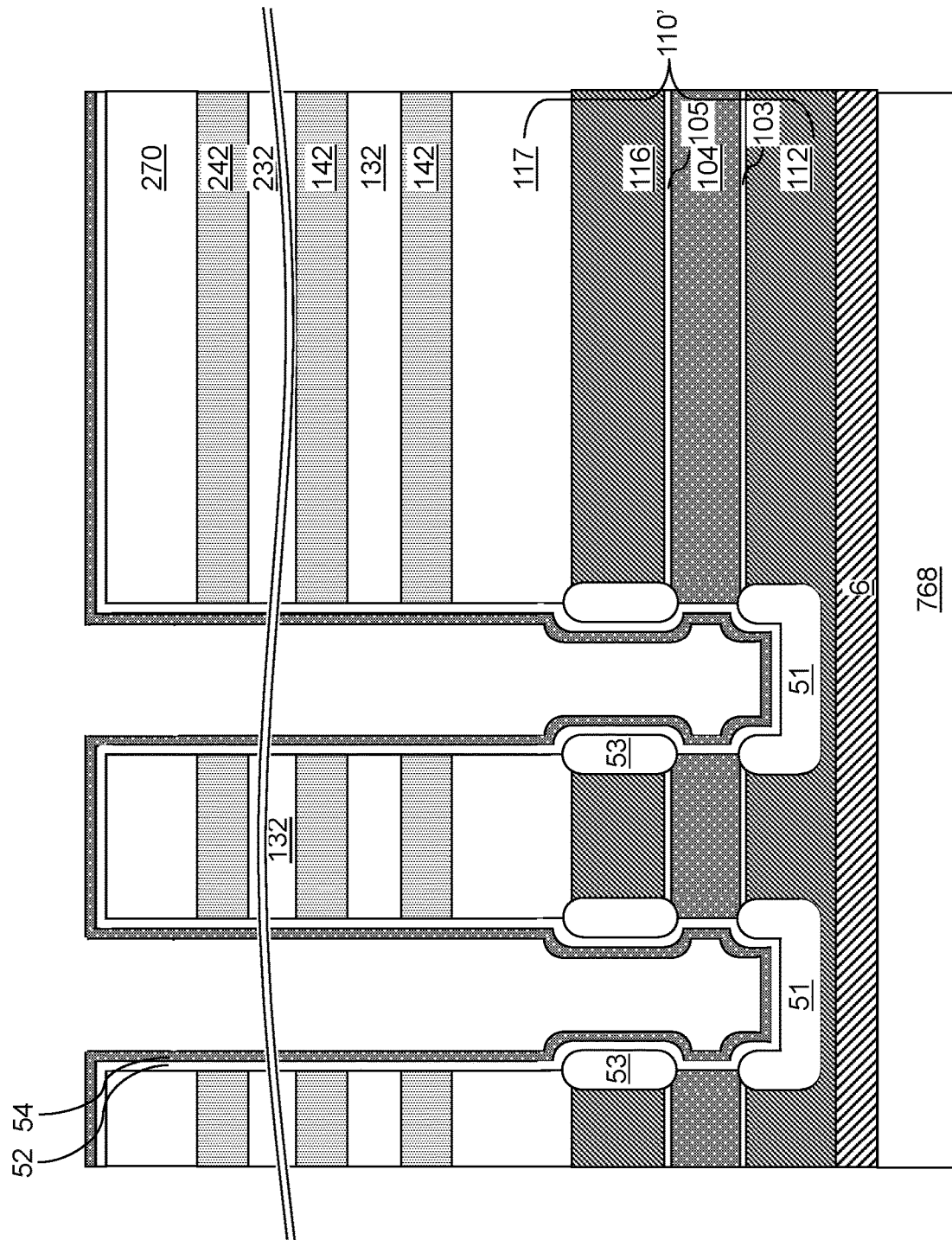

Referring to FIG. 9C, a blocking dielectric layer 52 can be optionally deposited in the memory openings 49 and over the second insulating cap layer 270. The blocking dielectric layer 52 can be formed directly on each of the tubular semiconductor oxide spacers 53 and the semiconductor oxide material portions 51. The blocking dielectric layer 52 can include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, a charge storage layer 54 can be conformally deposited. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

Figure 9D:
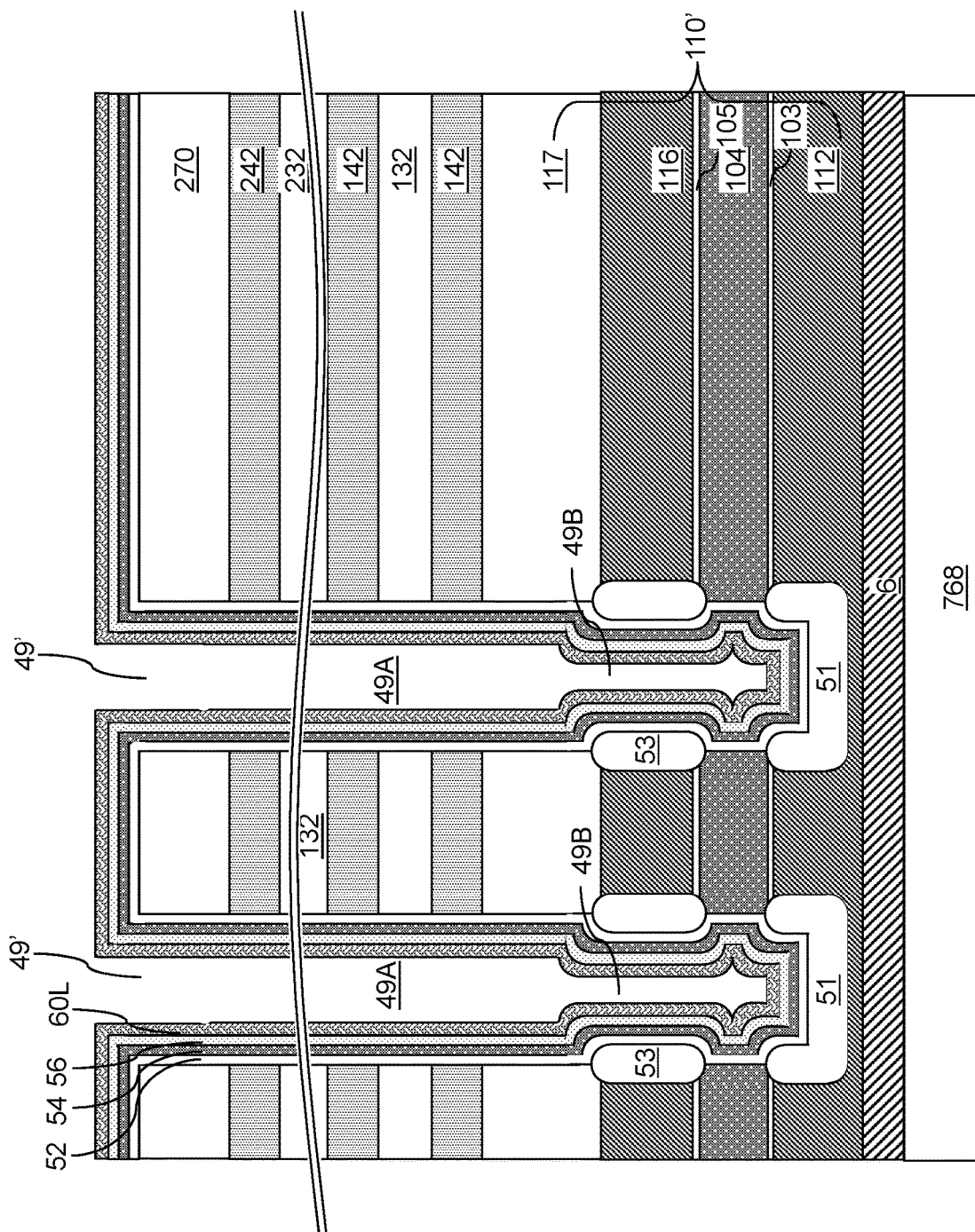

Referring to FIG. 9D, a tunneling dielectric layer 56 can be formed conformally on the charge storage layer 54. The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

A semiconductor channel material layer 60L can be subsequently deposited on the tunneling dielectric layer 56. The semiconductor channel material layer 60L includes a doped semiconductor material having a doping of the first conductivity type. The doped semiconductor material of the semiconductor channel material layer 60L can include at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, atomic concentration of dopants of the first conductivity type in the semiconductor channel material layer 60L may be in a range from $1.0\times10^{12}/cm^3$ to $1.0\times10^{18}/cm^3$, such as from $1.0\times10^{14}/cm^3$ to $1.0\times10^{17}/cm^3$. In one embodiment, the first conductivity type can be p-type, and the semiconductor channel material layer 60L includes, and/or consists essentially of, boron-doped amorphous silicon or boron-doped polysilicon. The semiconductor channel material layer 60L may be formed by a conformal deposition method such as low pressure chemical vapor deposition (LPCVD). The thickness of the semiconductor channel material layer 60L may be in a range from 2 nm to 20 nm, although lesser and greater thicknesses may also be used. A cavity 49' is formed in the volume of each memory opening 49 that is not filled with the deposited material layers (52, 54, 56, 60L). The cavity 49' includes a first portion 49A overlying a horizontal plane including the top surface of the upper source-level semiconductor layer 116, and a second portion 49B underlying the horizontal plane including the top surface of the upper source-level semiconductor layer 116.

Figure 9E:
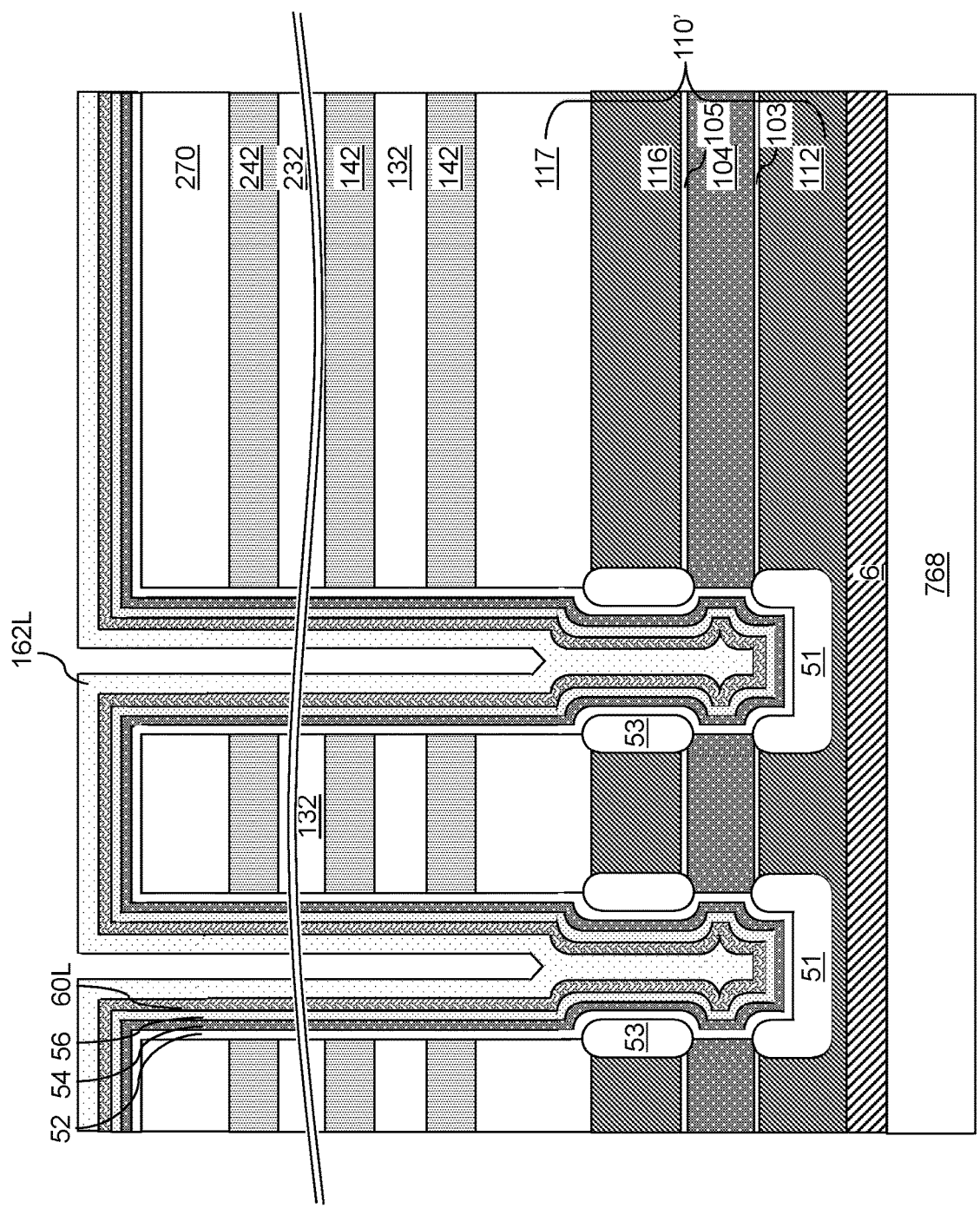

Referring to FIG. 9E, a doped silicate glass layer 162L can be conformally deposited over the semiconductor channel material layer 60L in each of the memory openings 49. The doped silicate glass layer 162L includes dopants of the second conductivity type at an atomic concentration in a range from $5.0\times10^{19}/cm^3$ to $5.0\times10^{21}/cm^3$. For example, if the first conductivity type is p-type, and if the second conductivity type is n-type, then doped silicate glass layer 162L can include phosphosilicate glass or arsenosilciate glass. In one embodiment, the doped silicate glass layer 162L can include phosphosilicate glass that is doped with phosphorus. The doped silicate glass layer 162L can be deposited by a conformal deposition process such as a low pressure chemical vapor deposition process.

The thickness of the doped silicate glass layer 162L can be greater than one half of the lateral separation distance between laterally spaced portions of the semiconductor channel material layer 60L in each memory opening 49 at the level of the upper source-level semiconductor layer 116, and is less than one half of the lateral distance between portions of the semiconductor channel material layer 60L in each memory opening 49 at the levels of the alternating stacks {(132, 142), (232, 242)}. Thus, the second portion 49B of the cavity 49' underlying the horizontal plane including the top surface of the upper source-level semiconductor layer 116 can be filled with the doped silicate glass layer 162L as the doped silicate glass layer 162L fills and pinches off the second portion 49B of the cavity 49' that underlies the horizontal plane including the top surface of the upper source-level semiconductor layer 116.

In one embodiment, the entire volume of the second portion 49B of each cavity 49' in the memory openings 49 that underlies the horizontal plane including the top surface of the upper source-level semiconductor layer 116 can be completely filled by the doped silicate glass layer 162L. The remaining volume (i.e., the first portion 49A) of the cavity 49' in each memory opening 49 vertically extends through each layer of the alternating stacks {(132, 142), (232, 242)}. The first portion 49A of the cavity 49' is only partially filled with the doped silicate glass layer 162L. In one embodiment, the thickness of the doped silicate glass layer 162L can be in a range from 20 nm to 200 nm, although lesser and greater thicknesses can also be employed.

Generally, the tubular semiconductor oxide spacers 53 reduce the lateral extent of the lower portion of the void in each memory opening 49. Thus, the layer stack of the blocking dielectric layer 52, the charge storage layer 54, the tunneling dielectric layer 56, and the semiconductor channel material layer 60L has a lesser lateral extent at a level of the tubular semiconductor oxide spacers 53 than at levels of the alternating stacks {(132, 142), (232, 242)}. The doped silicate glass layer 162L fills each portion of the memory openings 49 that is laterally surrounded by a respective one of the tubular semiconductor oxide spacers 53, and does not fully fill each portion of the memory openings 49 that is laterally surrounded by the alternating stacks {(132, 142), (232, 242)}.

Figure 9F:
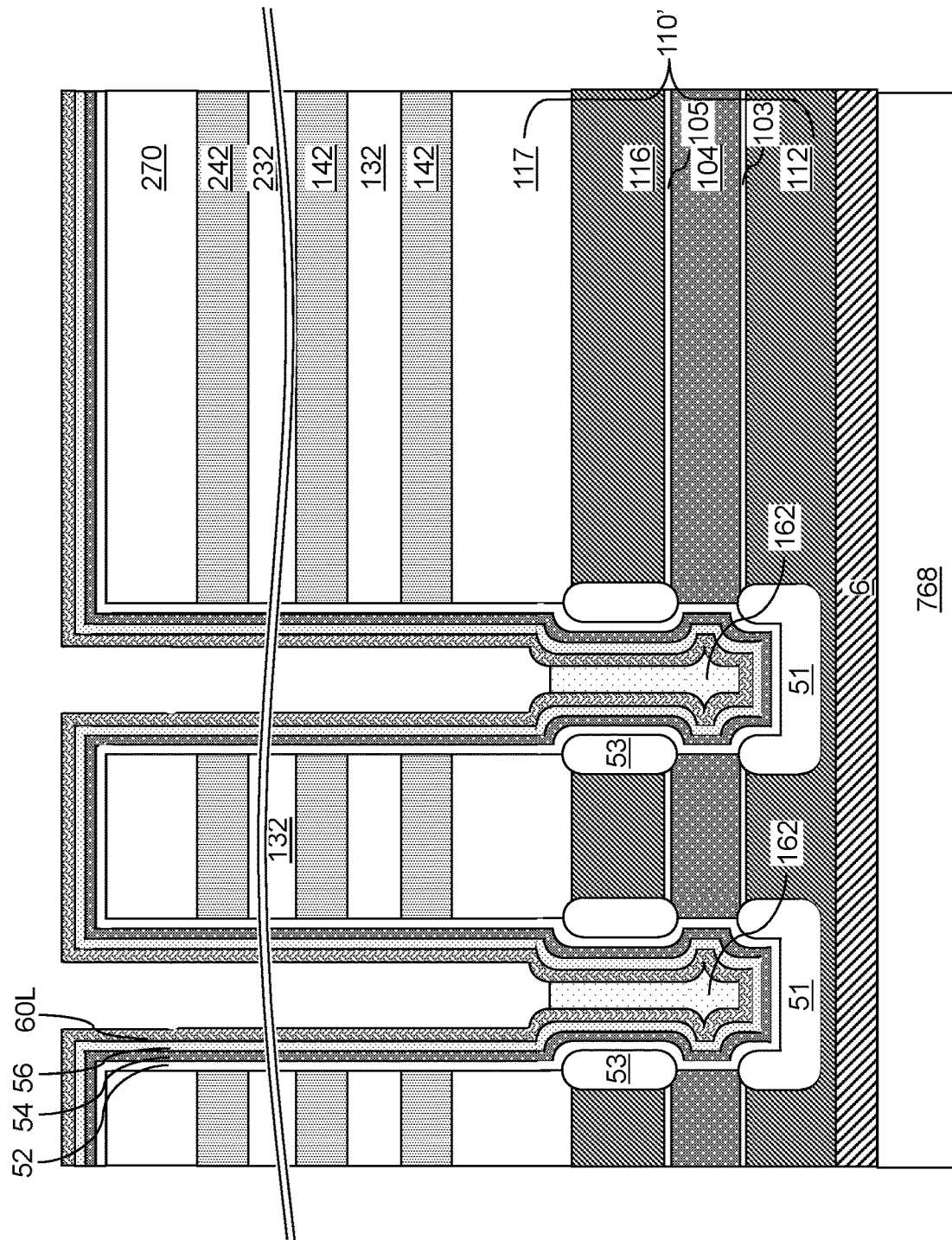

Referring to FIG. 9F, an isotropic etch process that etches the material of the doped silicate glass layer 162L can be performed to remove portions of the doped silicate glass layer 162L that overlie the horizontal plane including the top surface of the upper source-level semiconductor layer 116. In one embodiment, the isotropic etch process can etch the material of the doped silicate glass layer 162L selective to the material of the semiconductor channel material layer 60L. Portions of the doped silicate glass layer 162L that overlie the tubular semiconductor oxide spacers 53 are removed by the isotropic etch process. For example, a wet etch process employing dilute hydrofluoric acid and/or a chemical dry etch process can be employed. Each remaining portion of the doped silicate glass layer 162L at the bottom of the memory openings 49 comprises a doped silicate glass pillar 162. Generally, the doped silicate glass pillars 162 can be formed by removing portions of the doped silicate glass layer 162L located at levels of the alternating stacks {(132, 142), (232, 242)}. Remaining portions of the doped silicate glass layer 162L after the isotropic etch process comprise the doped silicate glass pillars 162.

Figure 9G:
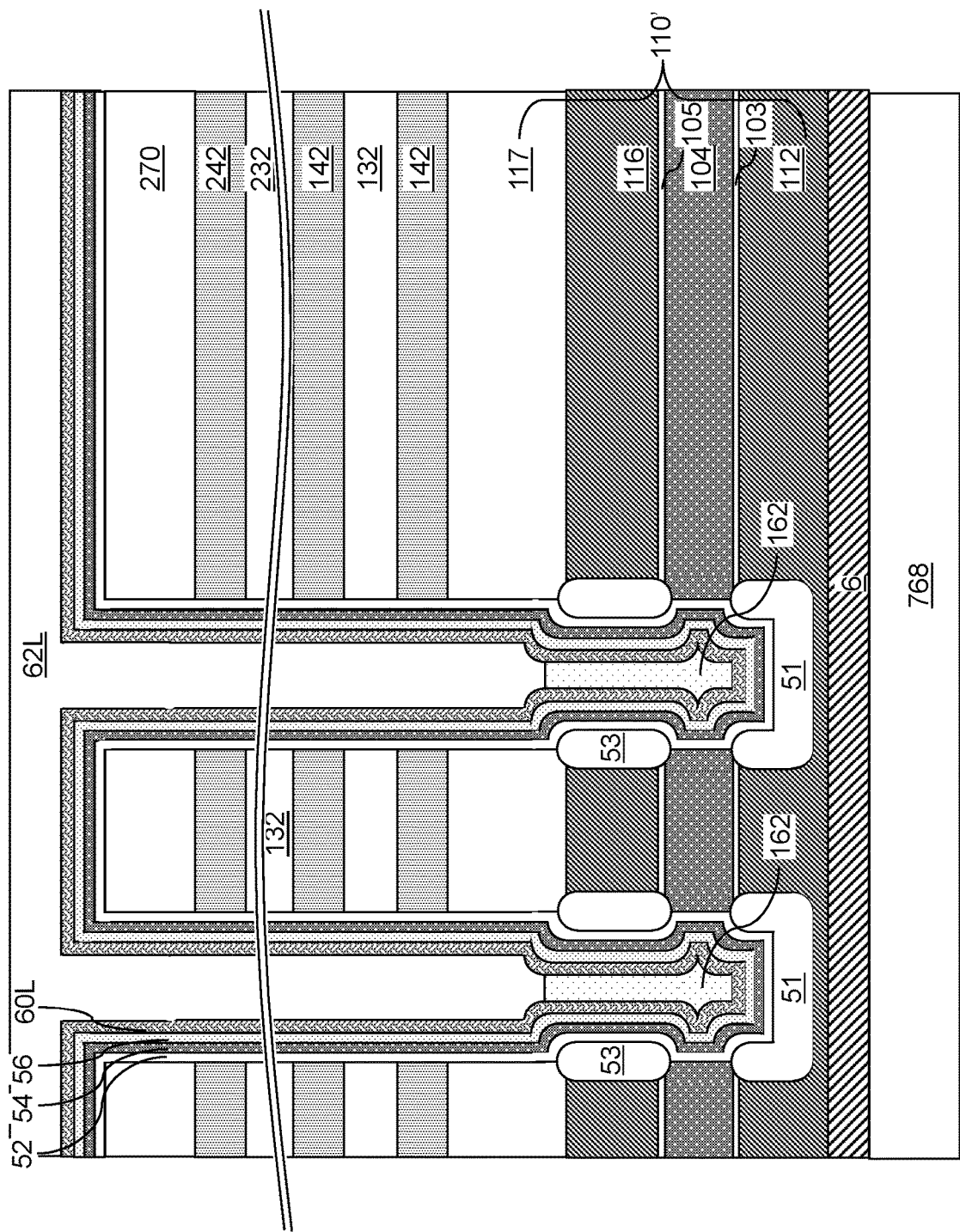

Referring to FIG. 9G, a dielectric material such as undoped silicate glass can be conformally deposited in remaining volumes of the voids in the memory openings 49 to form a dielectric core layer 62L. The dielectric core layer 62L may be deposited in each memory cavity 49' to fill any remaining portion of the cavity 49' within each memory opening 49. The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Figure 9H:
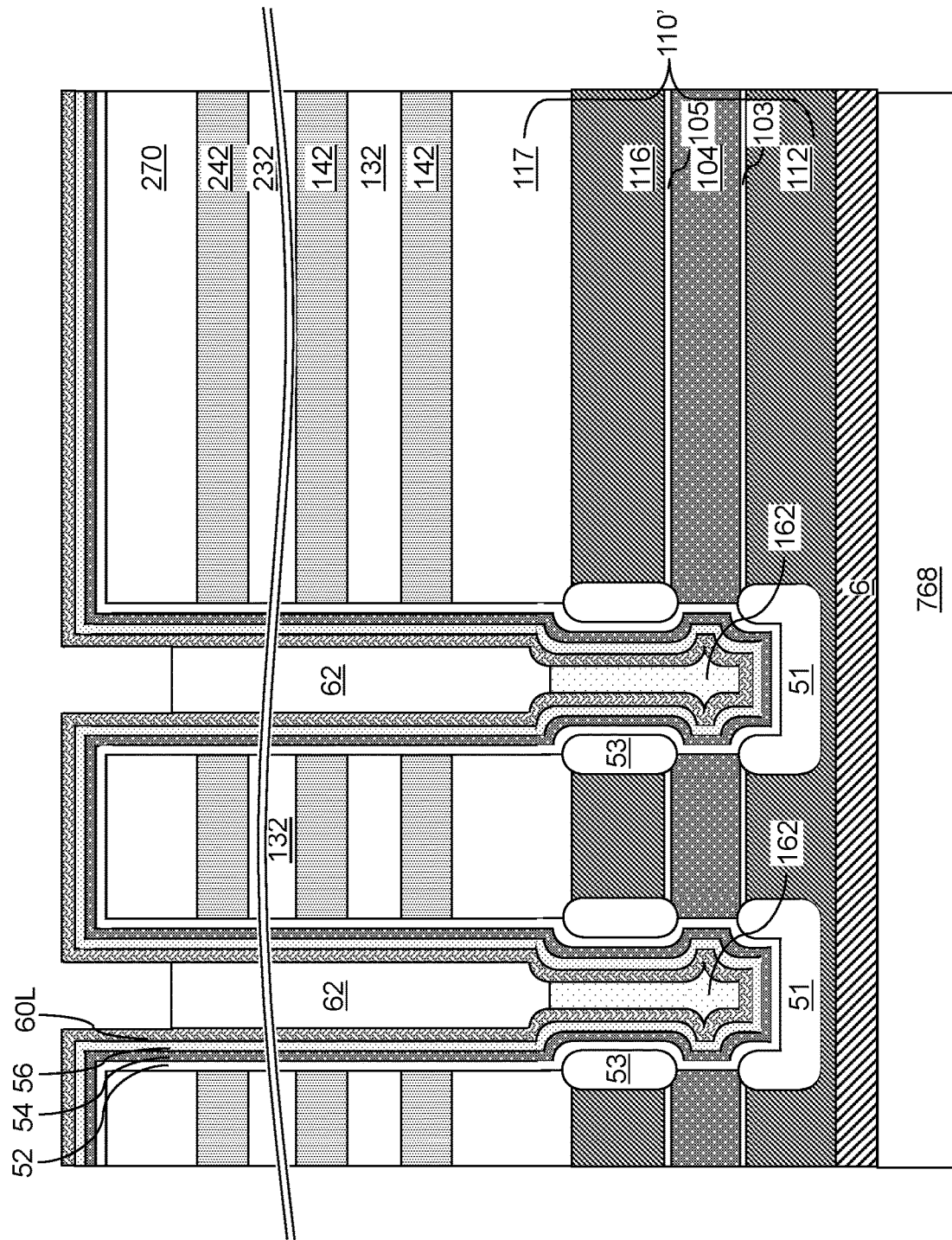

Referring to FIG. 9H, the horizontal portion of the dielectric core layer 62L overlying the second insulating cap layer 270 may be removed, for example, by a recess etch. The recess etch continues until top surfaces of the remaining portions of the dielectric core layer 62L are recessed to a height at, or about, the bottom surface of the second insulating cap layer 270. Each remaining portion of the dielectric core layer constitutes a dielectric core 62. Each dielectric core 62 can be formed on a top surface of a respective one of the doped silicate glass pillars 162. In one embodiment, the dielectric cores 62 can comprise, and/or can consist essentially of, undoped silicate glass.

Figure 9I:
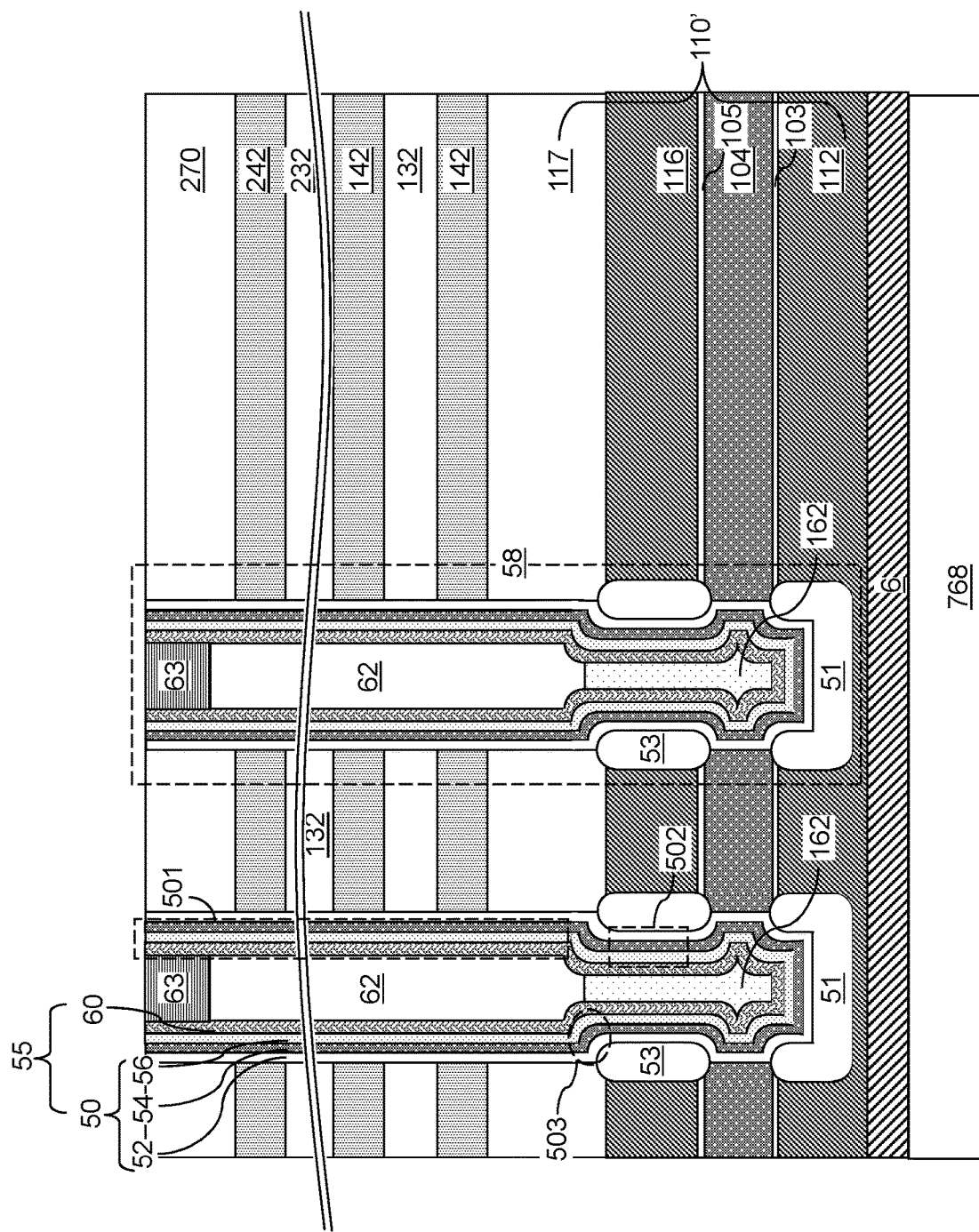

Referring to FIG. 9I, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon. Each remaining portion of the semiconductor channel material layer 60L constitutes a semiconductor channel 60 through which electrical current may flow when a vertical NAND device including the semiconductor channel 60 is turned on. Each drain region 63 can be formed on a top end of a respective semiconductor channel 60 and on a top surface of a respective one of the dielectric cores 62.

A tunneling dielectric layer 56 is surrounded by a charge storage layer 54, and laterally surrounds a semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a semiconductor channel 60 (which is a semiconductor channel) within a memory opening 49 constitutes a memory stack structure 55. The memory stack structure 55 is a combination of a semiconductor channel 60, a tunneling dielectric layer 56, a plurality of memory elements comprising portions of the charge storage layer 54, and an optional blocking dielectric layer 52. Each combination of a tubular semiconductor oxide spacer 53, a semiconductor oxide material portion 51, a memory stack structure 55, a doped silicate glass pillar 162, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, the memory opening fill structures 58, and support pillar structures that are formed in the support openings 19 collectively constitute a memory-level assembly.

Generally, each of the memory openings 49 can be filled with a respective memory opening fill structure 58. Each of the memory opening fill structures 58 comprises a drain region 63 and a dielectric core 62 that overlie a respective one of the doped silicate glass pillars 162. The source-level sacrificial layer 104 is located over a substrate 8, and alternating stacks of insulating layers (132, 232) and sacrificial material layers (142, 242) are located over the source-level sacrificial layer 104. Memory openings 49 vertically extend through the alternating stacks {(132, 142), (232, 242)} and the source-level sacrificial layer 104. The memory opening fill structures 58 are located in the memory openings 49.

Each of the memory opening fill structures 58 comprises a memory film 50 including a first tubular portion 501 that vertically extends through the alternating stacks {(132, 142), (232, 242)}, a semiconductor channel 60 contacting an inner sidewall of the memory film 50, and a doped silicate glass pillar 162 laterally surrounded by the semiconductor channel 60. The memory film 50 further includes a second tubular portion 502 that vertically extends below the horizontal plane including the bottommost surface of the alternating stacks {(132, 142), (232, 242)} having a lesser lateral extent (such as the diameter along any horizontal direction) than the first tubular portion 501, and a connection portion 503 that connects the first tubular portion 501 and the second tubular portion 502 and having a gradually increasing lateral extent (e.g., diameter) that increases with a vertical distance from the substrate 8.

Each of the memory opening fill structures 58 comprises a dielectric core 62 including a dielectric material having a different composition than the doped silicate glass pillar 162 and contacting an inner sidewall of the semiconductor channel 60. In one embodiment, the dielectric core 62 comprises undoped silicate glass, and contacts a top surface of the doped silicate glass pillar 162 and the semiconductor channel 60.

In one embodiment, each of the memory opening fill structures 58 comprises a tubular semiconductor oxide spacer 53 including a dielectric oxide of a semiconductor material of the upper source-level semiconductor layer 116 and comprising a curved inner sidewall that contacts the memory film 50. In one embodiment, each of the memory opening fill structures 58 also comprises a semiconductor oxide plate 51 including a dielectric oxide of a semiconductor material of the lower source-level semiconductor layer 112 and comprising a planar bottom surface contacting the lower source-level semiconductor layer 112.

Figure 10:
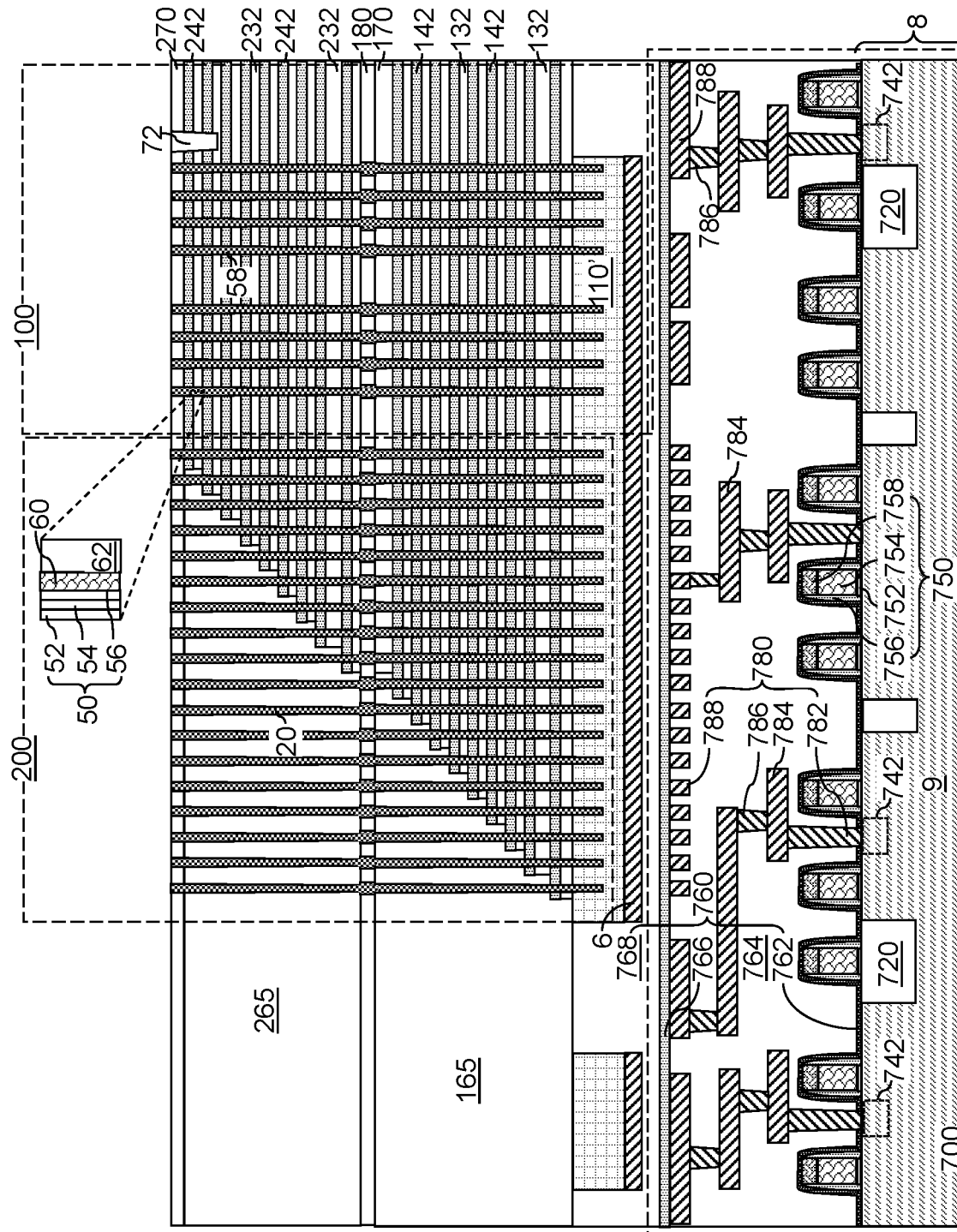
FIG. 10 is a vertical cross-sectional view of the first exemplary structure after formation of memory opening fill structures and support pillar structures according to the first embodiment of the present disclosure.

Referring to FIG. 10, the first exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 11A:
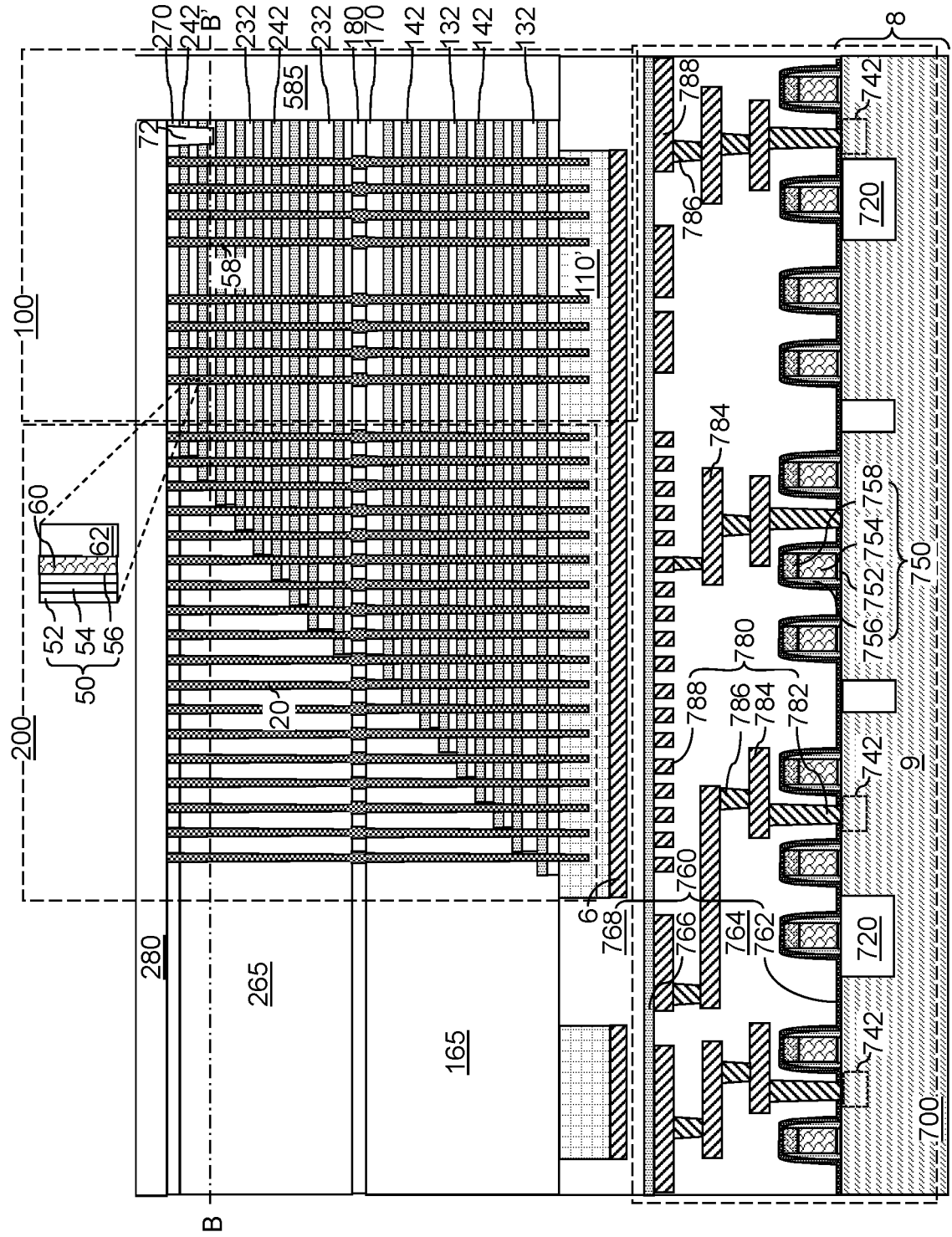
FIG. 11A is a vertical cross-sectional view of the first exemplary structure after formation of pillar cavities according to the first embodiment of the present disclosure.
Figure 11B:
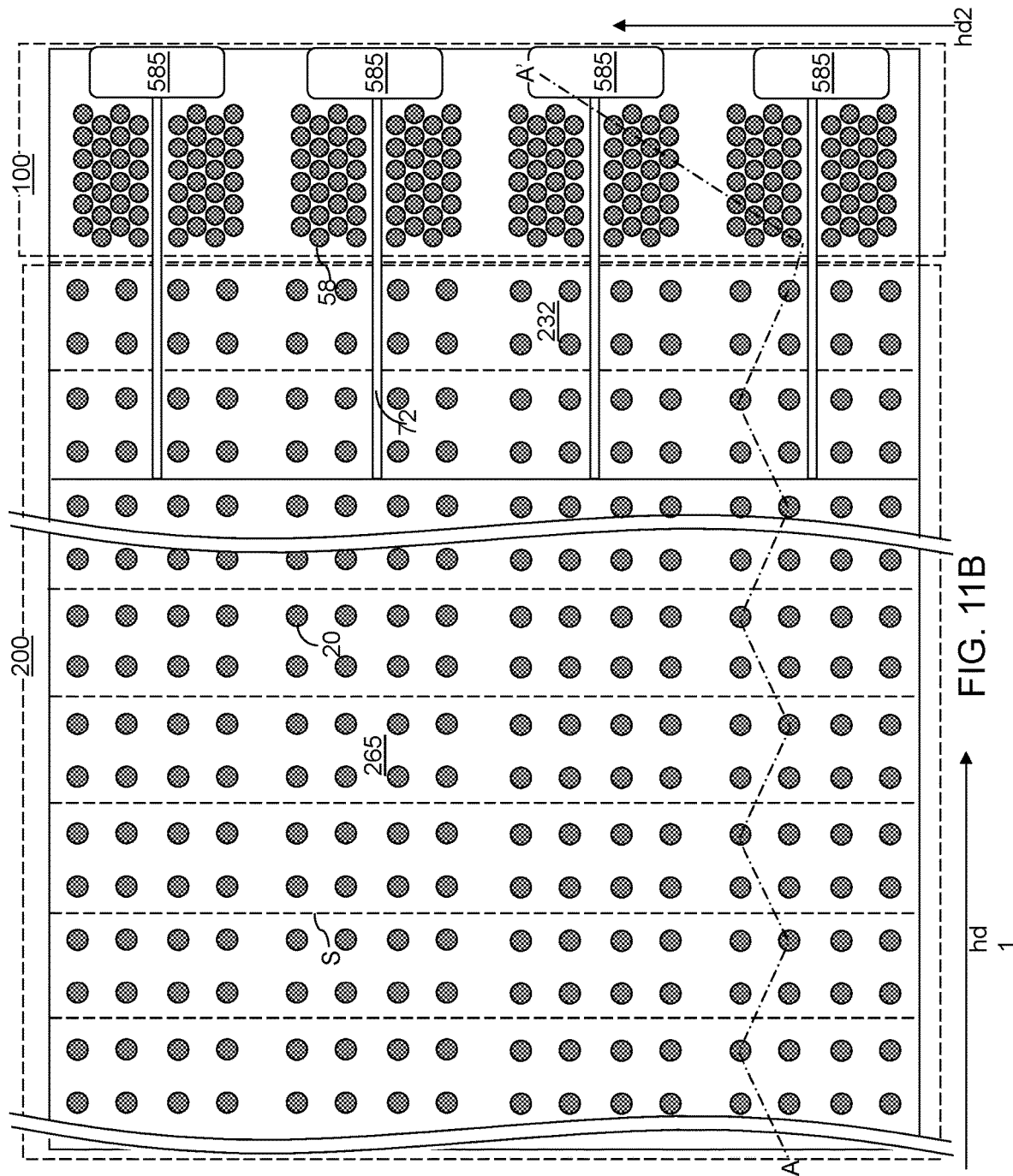
FIG. 11B is a horizontal cross-sectional view of the first exemplary structure along the horizontal plane B-B' of FIG. 11A. The hinged vertical plane A-A' corresponds to the plane of the vertical cross-sectional view of FIG. 11A.

Referring to FIGS. 11A and 11B, a first contact level dielectric layer 280 may be formed over the second-tier structure (232, 242, 270, 265, 72). The first contact level dielectric layer 280 includes a dielectric material such as silicon oxide, and may be formed by a conformal or non-conformal deposition process. For example, the first contact level dielectric layer 280 may include undoped silicate glass and may have a thickness in a range from 100 nm to 600 nm, although lesser and greater thicknesses may also be used.

A photoresist layer (not shown) may be applied over the first contact level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Figure 12:
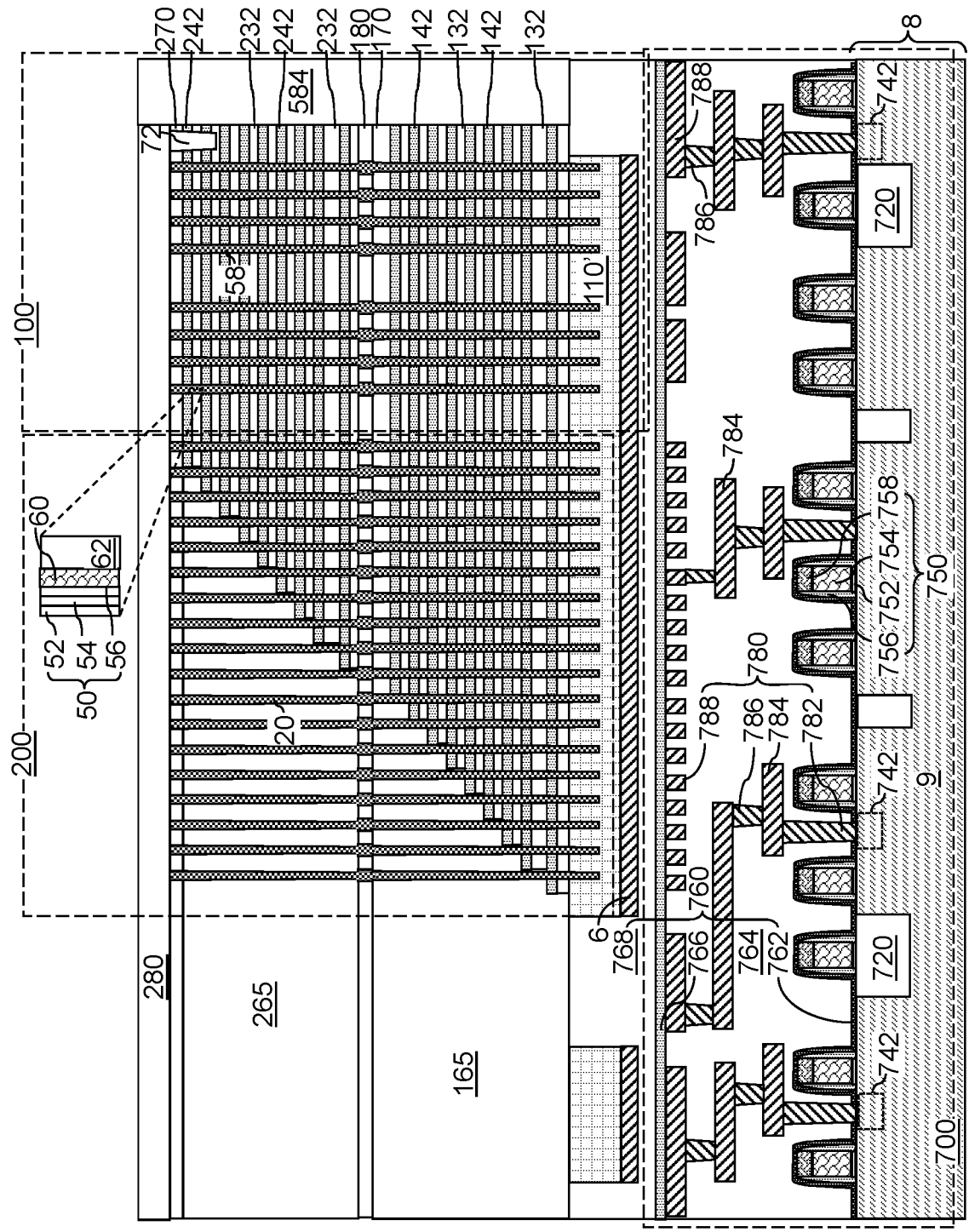
FIG. 12 is a vertical cross-sectional view of the first exemplary structure after formation of dielectric pillar structures according to the first embodiment of the present disclosure.

Referring to FIG. 12, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact level dielectric layer 280 by a planarization process. Remaining portions of the dielectric material in the vertical interconnection region cavities 585 constitute interconnection region dielectric fill material portions 584.

Figure 13A:
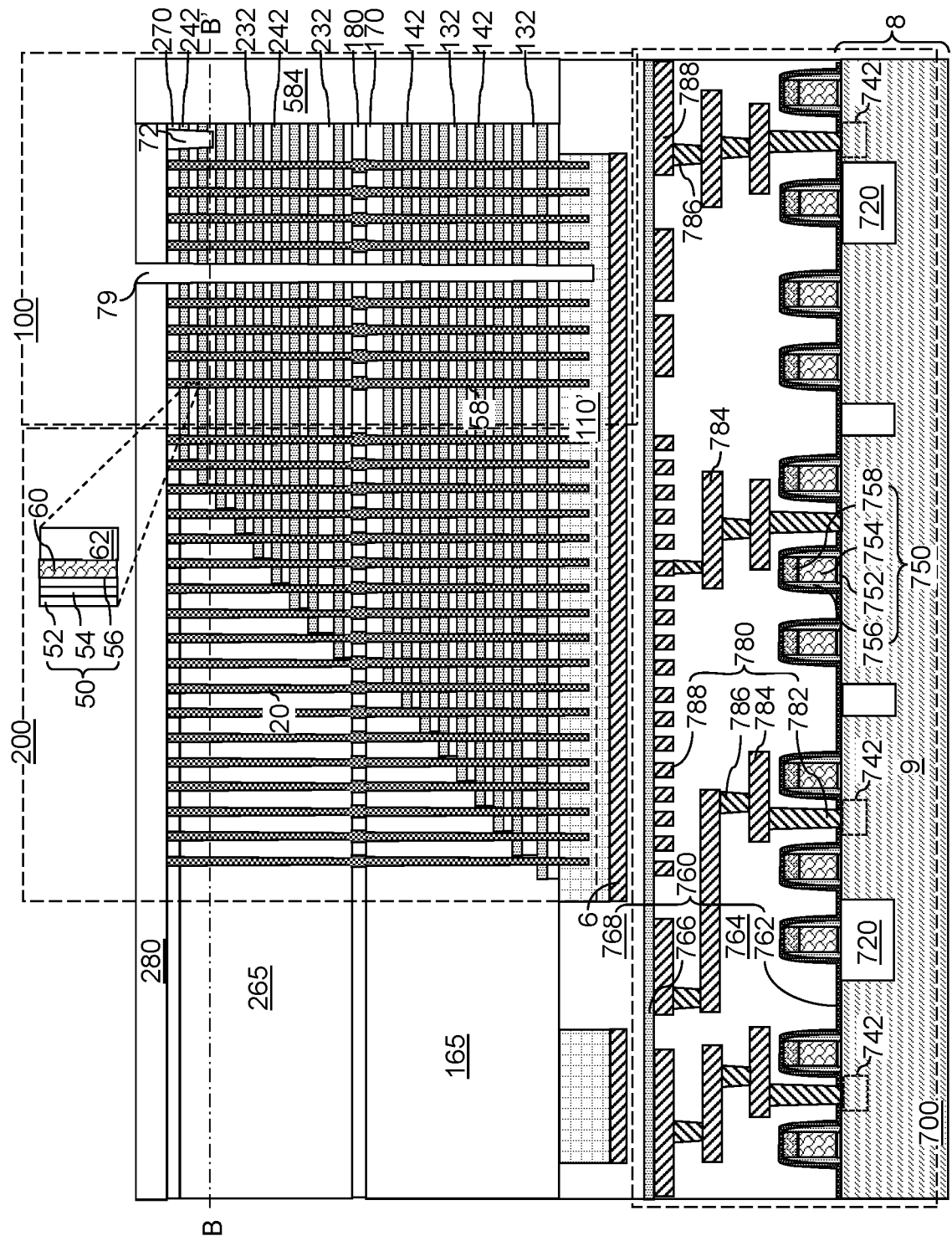
FIG. 13A is a vertical cross-sectional view of the first exemplary structure after formation of a first contact level dielectric layer and backside trenches according to the first embodiment of the present disclosure.
Figure 13B:
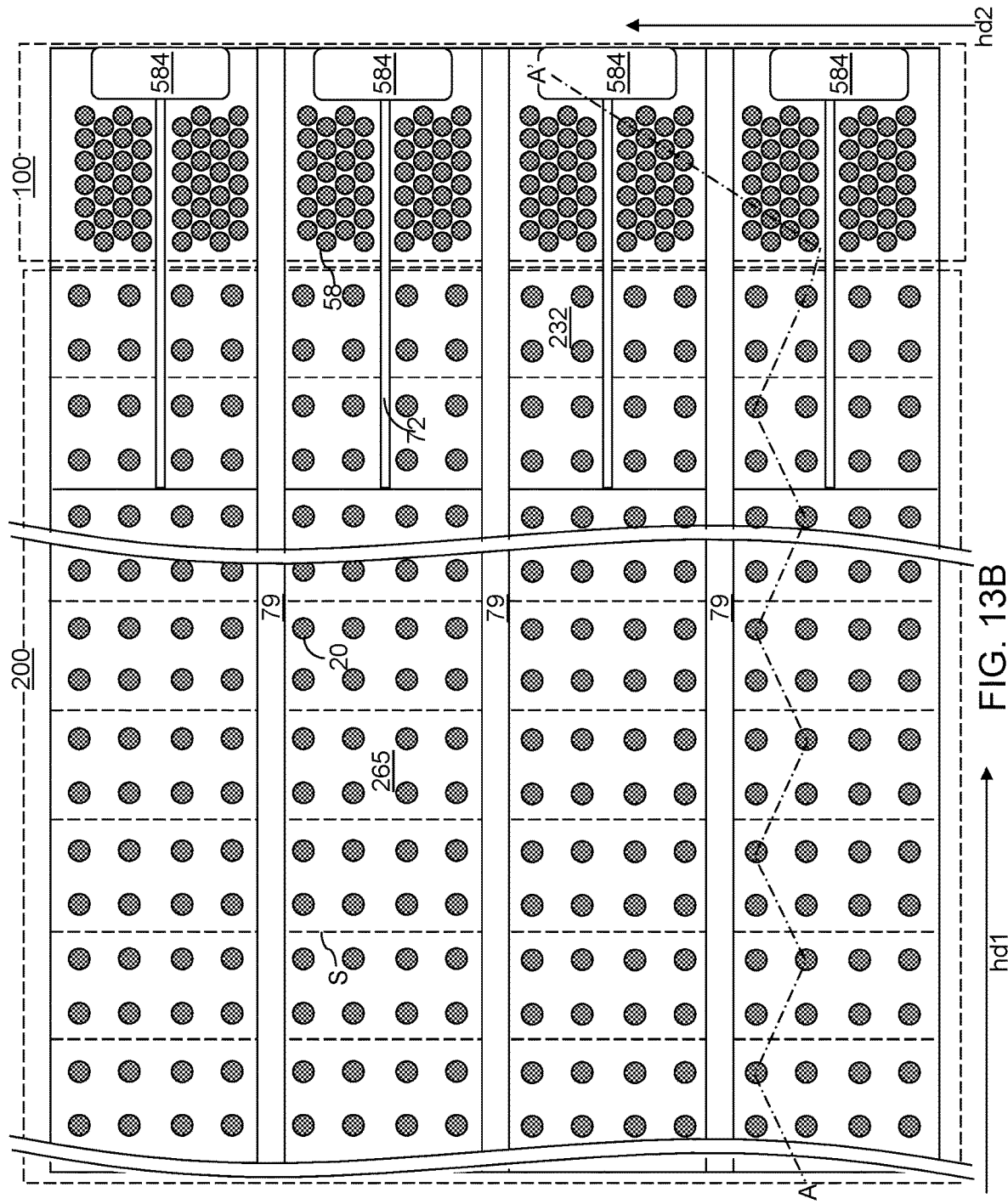
FIG. 13B is a horizontal cross-sectional view of the first exemplary structure along the horizontal plane B-B' of FIG. 13A. The hinged vertical plane A-A' corresponds to the plane of the vertical cross-sectional view of FIG. 13A.

Referring to FIGS. 13A and 13B, a photoresist layer may be applied over the first contact level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact level dielectric layer 280, the second-tier structure (232, 242, 270, 265, 72), and the first-tier structure (132, 142, 170, 165), and into the in-process source-level material layers 110'. Portions of the first contact level dielectric layer 280, the second-tier structure (232, 242, 270, 265, 72), the first-tier structure (132, 142, 170, 165), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

Figure 14:
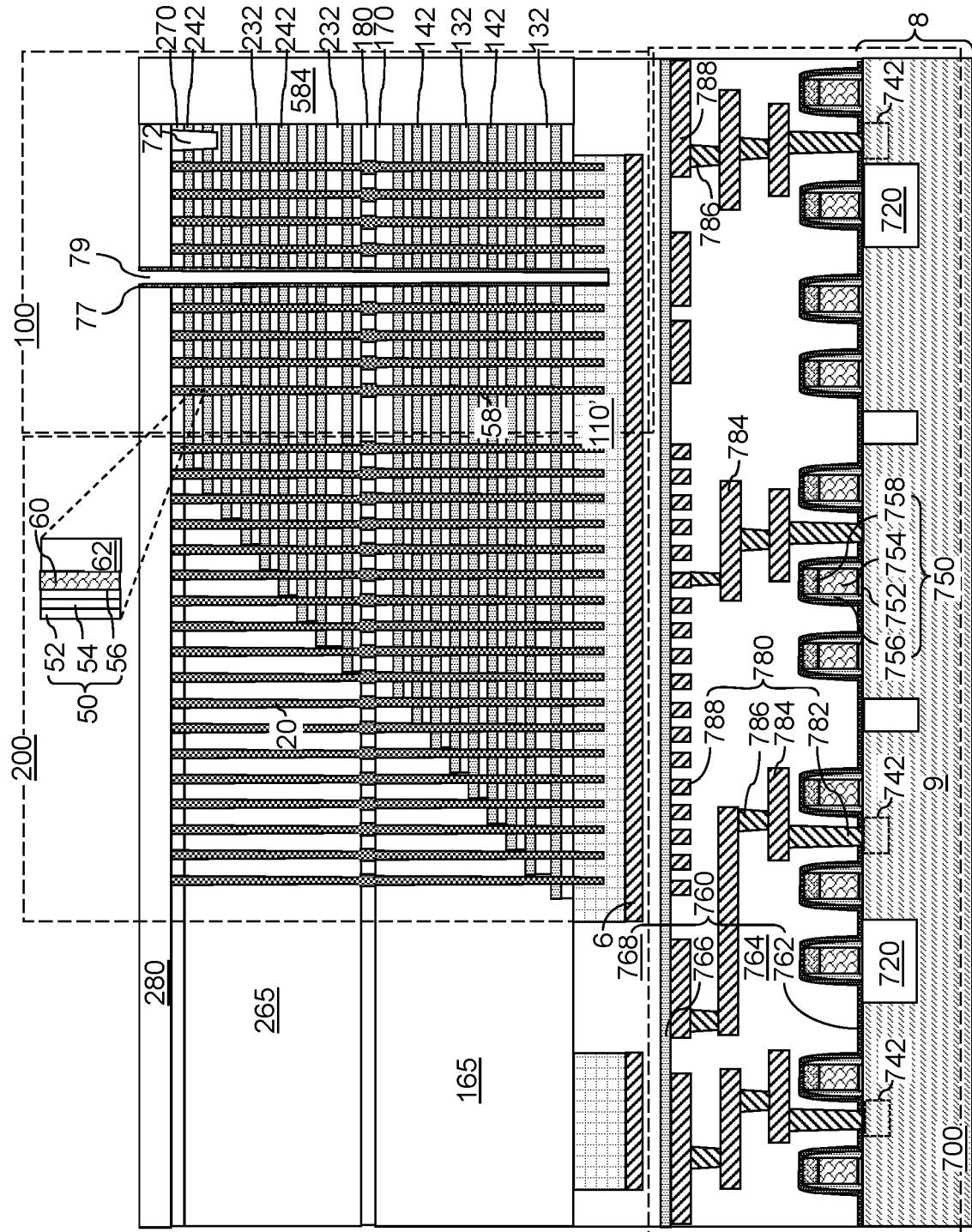
FIG. 14 is a vertical cross-sectional view of the first exemplary structure after formation of backside trench spacers according to the first embodiment of the present disclosure.
Figure 15A:
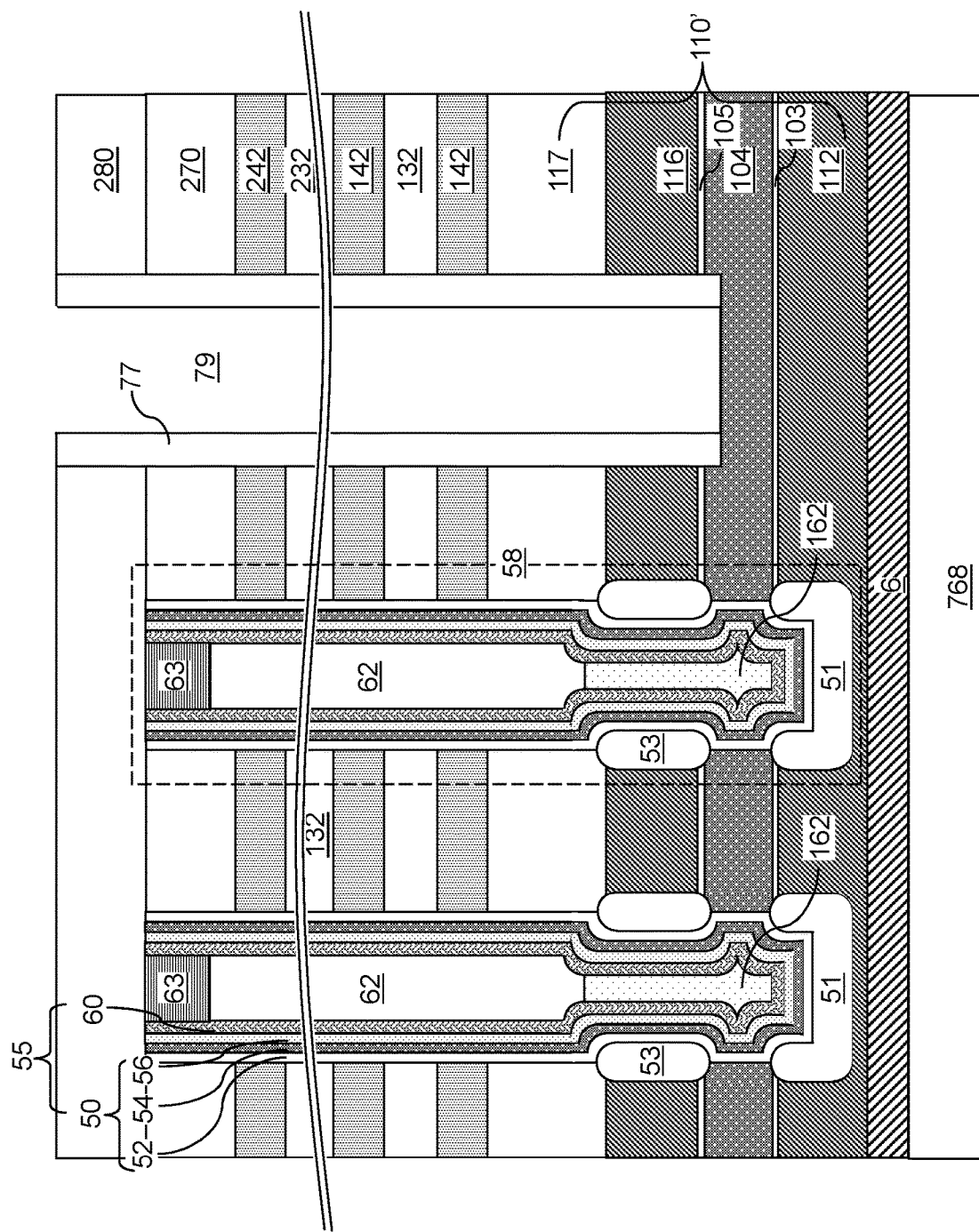
FIGS. 15A-15E illustrate sequential vertical cross-sectional views of a region including a pair of memory openings fill structures and a backside trench during formation of source-level material layers according to the first embodiment of the present disclosure.

Referring to FIGS. 14 and 15A, a backside trench spacer 77 may be formed on sidewalls of each backside trench 79. For example, a conformal spacer material layer may be deposited in the backside trenches 79 and over the first contact level dielectric layer 280, and may be anisotropically etched to form the backside trench spacers 77. The backside trench spacers 77 include a material that is different from the material of the source-level sacrificial layer 104. For example, the backside trench spacers 77 may include silicon oxide. The lateral thickness of the backside trench spacers 77 can be in a range from 20 nm to 120 nm, although lesser and greater thicknesses can also be employed.

Figure 15B:
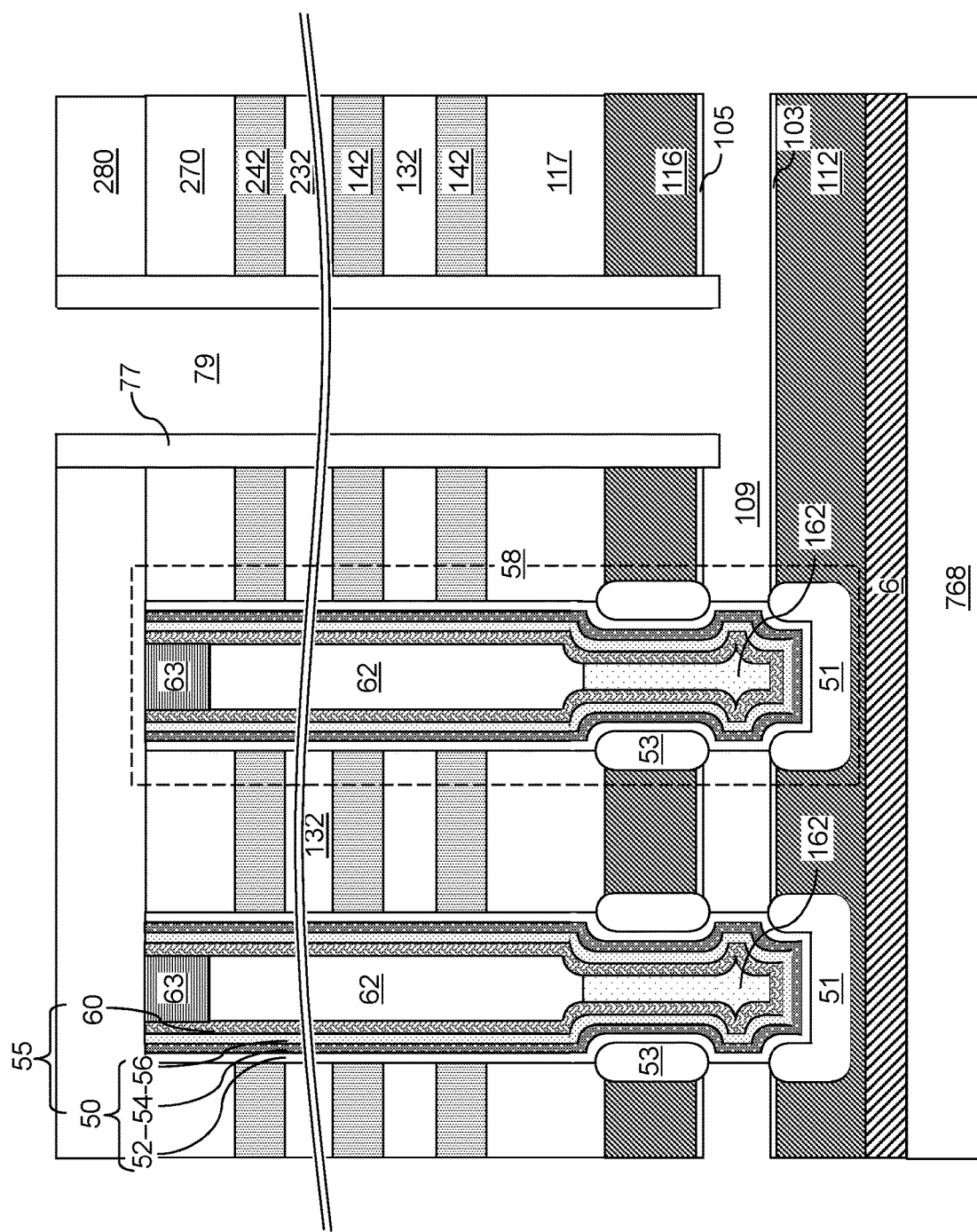

Referring to FIG. 15B, an etchant that etches the material of the source-level sacrificial layer 104 selective to the materials of the first alternating stack (132, 142), the second alternating stack (232, 242), the first and second insulating cap layers (170, 270), the first contact level dielectric layer 280, the upper sacrificial liner 105, and the lower sacrificial liner 103 may be introduced into the backside trenches in an isotropic etch process. For example, if the source-level sacrificial layer 104 includes silicon nitride, the backside trench spacers 77 include silicon oxide, and the upper and lower sacrificial liners (105, 103) include silicon oxide, a wet etch process employing hot phosphoric acid can be performed to remove the source-level sacrificial layer 104 selective to the backside trench spacers 77 and the upper and lower sacrificial liners (105, 103). A source cavity 109 is formed in the volume from which the source-level sacrificial layer 104 is removed. Each of the memory opening fill structures 58 is physically exposed to the source cavity 109. Specifically, each of the memory opening fill structures 58 includes a sidewall that is physically exposed to the source cavity 109. For example, outer sidewalls of the blocking dielectric layers 52 and surface portions of the tubular semiconductor oxide spacers 53 and the semiconductor oxide material portions 51 may be physically exposed to the source cavity 109.

Figure 15C:
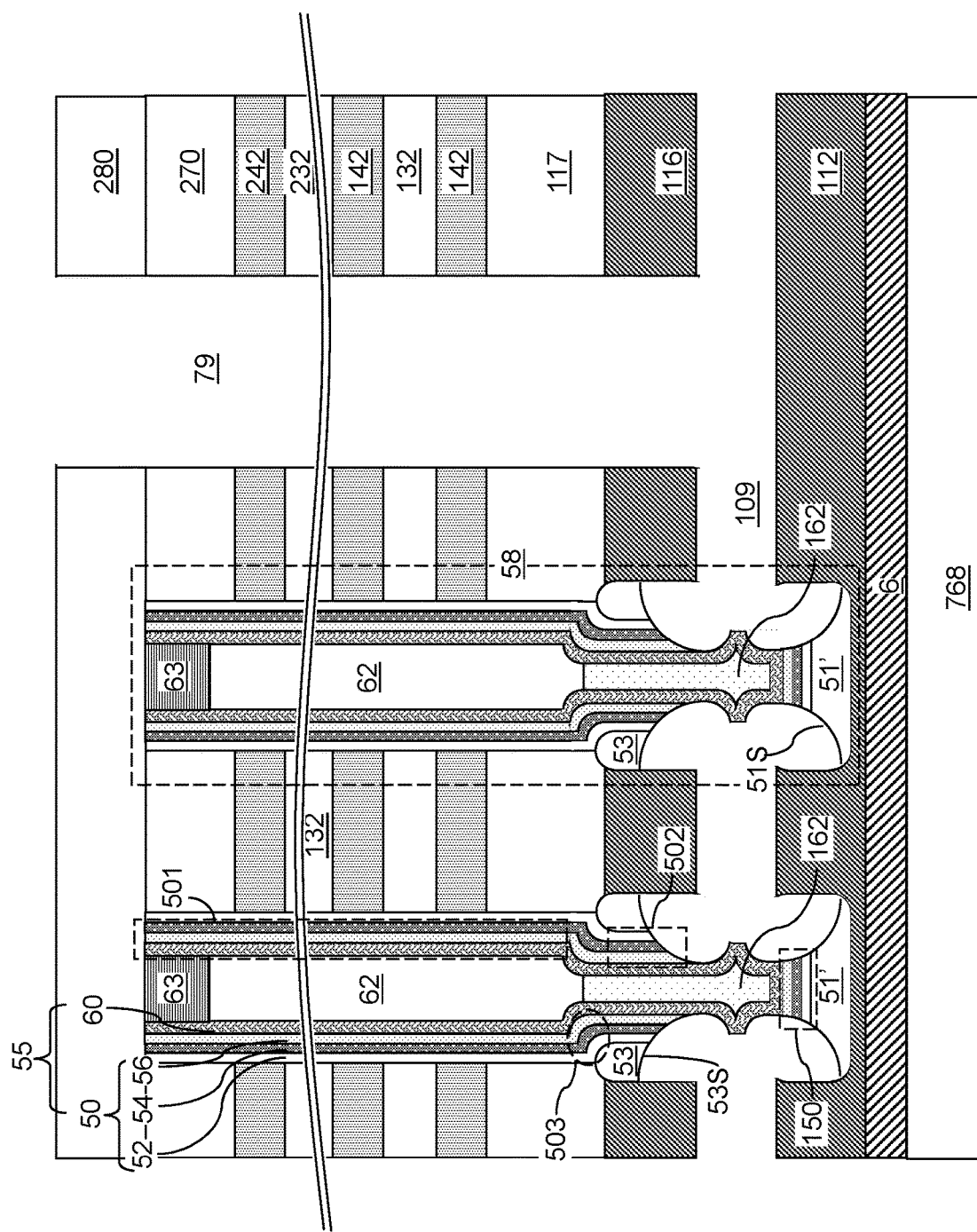

Referring to FIG. 15C, an isotropic etch process which optionally includes a plurality of etch sub-steps can be performed to etch portions of the memory films 50 around the source cavity 109. For example, a sequence of isotropic etchants, such as wet etchants, may be applied to the physically exposed portions of the memory films 50 to sequentially etch the various component layers of the memory films 50 from outside to inside, and to physically expose cylindrical surfaces of the semiconductor channels 60 at the level of the source cavity 109. In an illustrative example, the isotropic etch process can sequentially etch the material of the blocking dielectric layer 52, the material of the charge storage layer 54, and the material of the tunneling dielectric layer 56.

The upper and lower sacrificial liners (105, 103) may be collaterally etched during removal of the portions of the memory films 50 located at the level of the source cavity 109. Portions of the tubular semiconductor oxide spacers 53 and the semiconductor oxide material portions 51 that are proximal to the volume of the source cavity 109 as provided at the processing steps of FIG. 15B can be collaterally etched during the isotropic etch process. The backside trench spacers 77 may be collaterally etched partially or fully during the isotropic etch process. Each tubular semiconductor oxide spacer 53 can have a respective annular concave bottom surface 53S that is physically exposed to the source cavity 109. Each cylindrical portion of the semiconductor oxide material portions 51 may be collaterally etched by the isotropic etch process. Each remaining portion of the semiconductor oxide material portions 51 can include a semiconductor oxide plate 51'. In other words, each semiconductor oxide plate 51' can be a remaining semiconductor oxide material portion. Each semiconductor oxide plate 51' can have a respective annular concave surface 51S that is physically exposed to the source cavity 109.

A dielectric plate stack 150 including a remaining portion of a memory film 50 can be formed between each semiconductor oxide plate 51' and an overlying semiconductor channel 60. Each dielectric plate stack 150 includes a set of dielectric plates. The memory film 50 and the dielectric plate stack can comprise a same sequence of dielectric material compositions from one end to another, i.e., the composition of the blocking dielectric layer 52, the composition of the charge storage layer 54, and the composition of the tunneling dielectric layer 56.

The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the semiconductor channels 60.

Figure 15D:
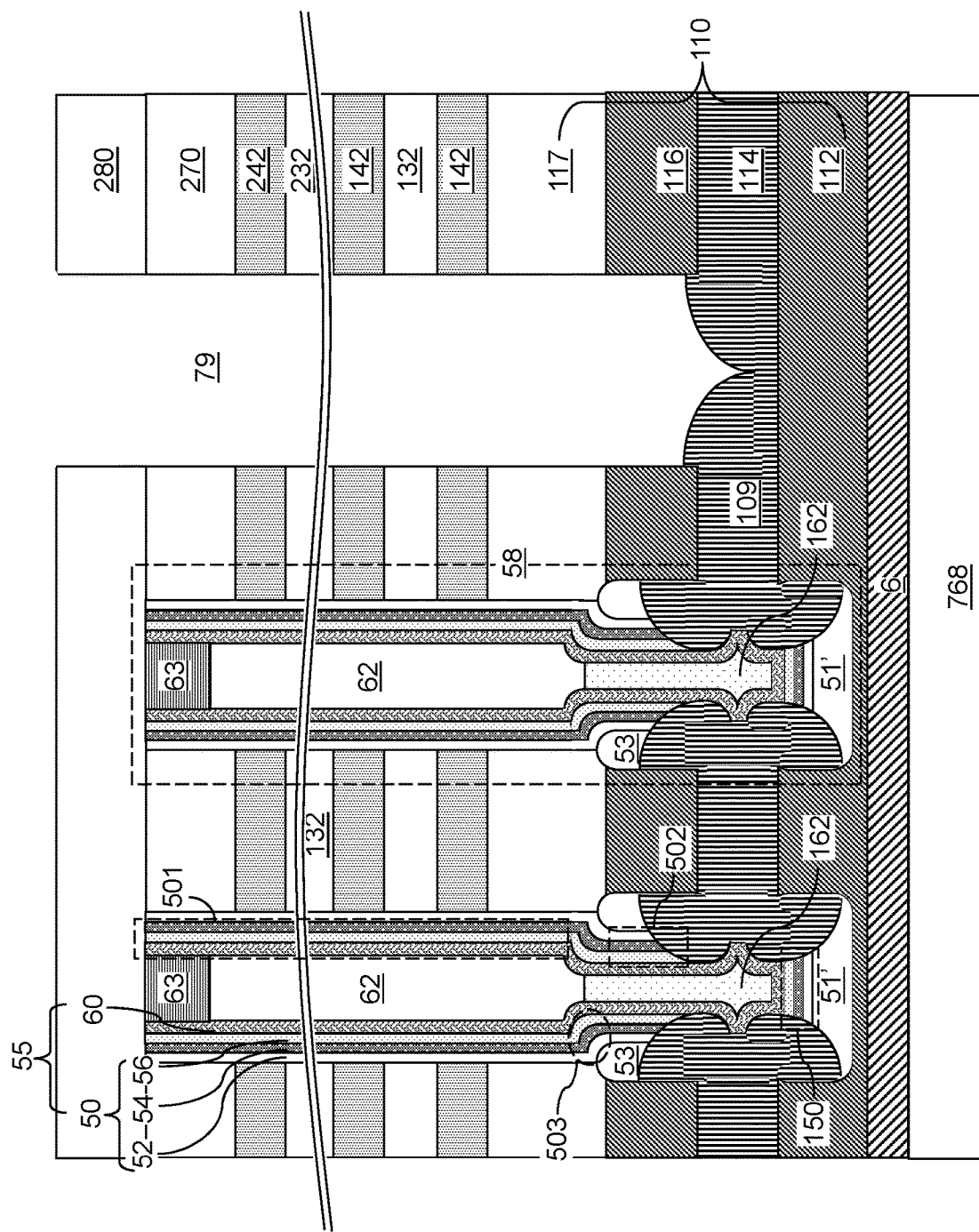

Referring to FIG. 15D, a semiconductor material having a doping of the second conductivity type may be deposited on the physically exposed semiconductor surfaces around the source cavity 109. The physically exposed semiconductor surfaces include bottom portions of outer sidewalls of the semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the first exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116) and the source-level insulating layer 117 constitutes source-level material layers 110, which replaces the in-process source-level material layers 110'.

Figure 15E:
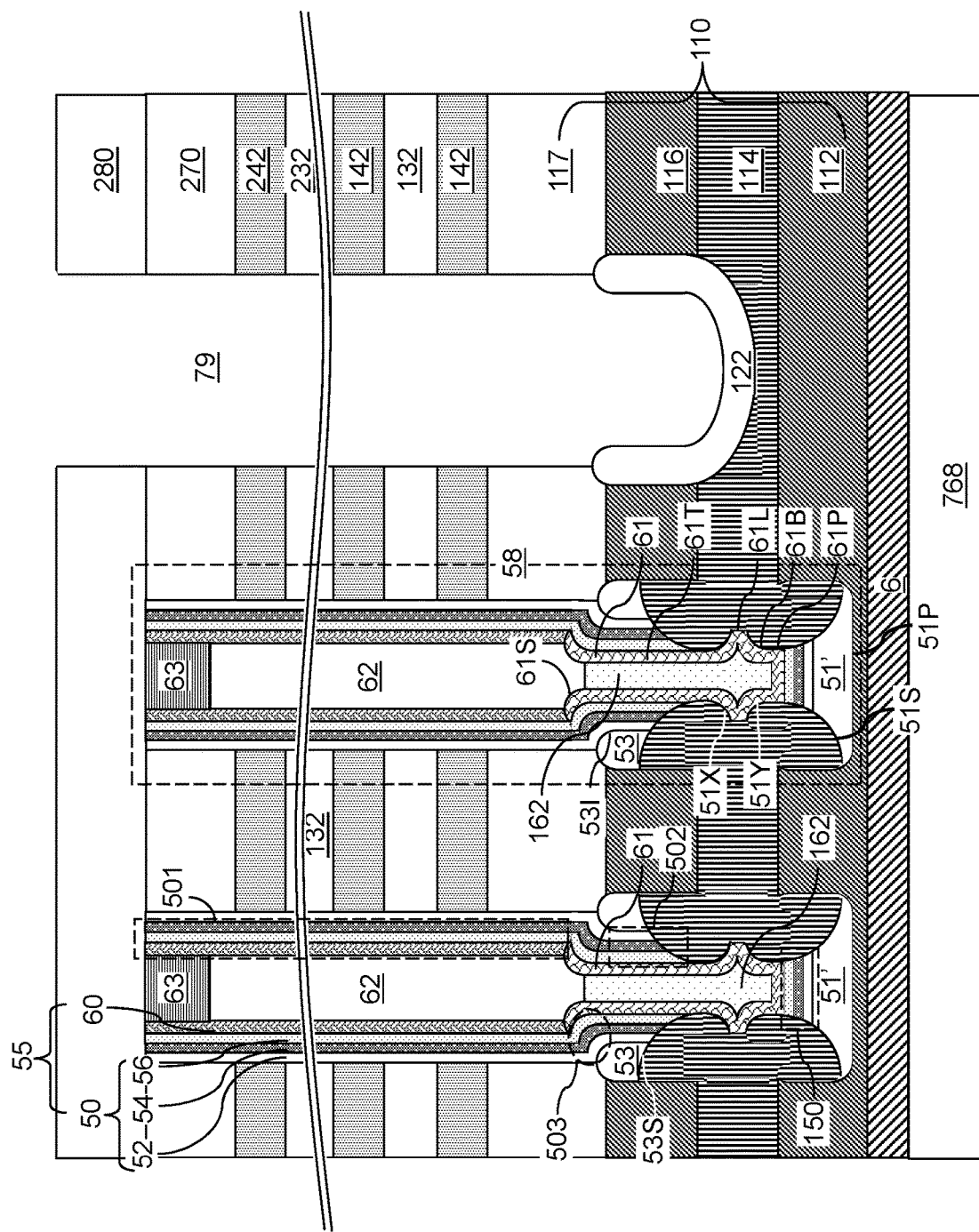
Figure 16:
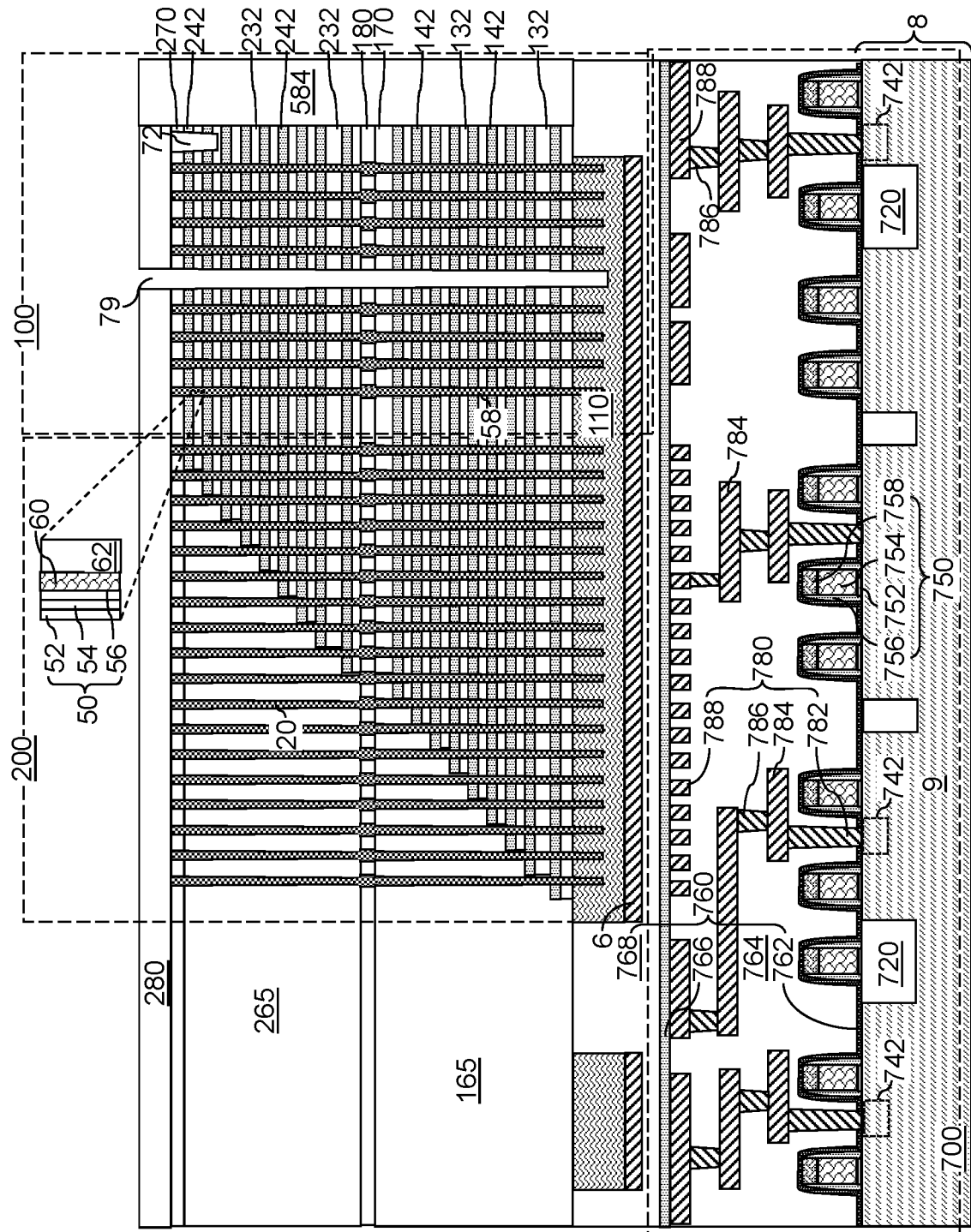
FIG. 16 is a vertical cross-sectional view of the first exemplary structure after formation of source-level material layers according to the first embodiment of the present disclosure.

Referring to FIGS. 15E and 16, any remaining portion of the backside trench spacers 77 may be removed selective to the source contact layer 114 using an isotropic etch process. For example, if the backside trench spacers 77 include silicon oxide, a wet etch process employing dilute hydrofluoric acid may be performed to remove the backside trench spacers 77. An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide (e.g., silicon oxide) portion 122.

An anneal process can be performed to outdiffuse dopants of the second conductivity type from the doped silicate glass pillars 162 to adjacent portions of the semiconductor channels 60, which are remaining portions of the semiconductor channel material layer 60L. A lower portion of each semiconductor channel 60 can be converted into a source region 61 by outdiffusing dopants from the doped silicate glass pillars 162 to adjacent portions of the semiconductor channels 60. In one embodiment, the doped silicate glass pillars 162 can have a higher atomic concentration of dopants of the second conductivity type than the source regions 61. For example, the doped silicate glass pillars 162 can include dopants (e.g., phosphorus) of the second conductivity type at an atomic concentration in a range from $5.0 \times 10^{18}/cm^3$ to $5.0 \times 10^{21}/cm^3$, and the source regions 61 can include dopants of the second conductivity type at an atomic concentration in a range from $2.0 \times 10^{18}/cm^3$ to $2.0 \times 10^{21}/cm^3$.

In one embodiment, the semiconductor channels 60 can have a doping of the first conductivity type, and the source regions 61 and the source contact layer 114 can have a doping of the second conductivity type that is an opposite of the first conductivity type. The lower source-level semiconductor layer 112 can contact a bottom surface of the source contact layer 114, and can have a doping of the second conductivity type, and the upper source-level semiconductor layer 116 can contact a top surface of the source contact layer 114 and can have a doping of the second conductivity type.

In one embodiment, each of the memory opening fill structures 58 comprises a tubular semiconductor oxide spacer 53 comprising a dielectric oxide of a semiconductor material (e.g., silicon oxide) of the upper source-level semiconductor layer 116 and comprising a curved inner sidewall 53I that contacts the memory film 50 and an annular concave bottom surface 53S that contacts the source contact layer 114. In one embodiment, each of the memory opening fill structures 58 also comprises a semiconductor oxide plate 51' including a dielectric oxide of a semiconductor material (e.g., silicon oxide) of the lower source-level semiconductor layer 112 and comprising a planar bottom surface 51P contacting the lower source-level semiconductor layer 112 and an annular concave surface 51S that contacts the source contact layer 114.

In one embodiment, each of the memory opening fill structures 58 comprises a dielectric plate stack 150 including a set of dielectric plates between the source region 61 and the semiconductor oxide plate 51'. The memory film 50 and the dielectric plate stack 150 can comprise a same sequence of dielectric material compositions from one end to another.

Each of the memory opening fill structures 58 can comprise a memory film 50 including a first tubular portion that vertically extends through the alternating stacks of insulating layers (132, 232) and sacrificial material layers (142, 242). The semiconductor channel 60 contacts an inner sidewall of the memory film 50. A source region 61 is adjoined to a bottom end of the semiconductor channel 60, and contacts the source contact layer 114. A doped silicate glass pillar 162 is laterally surrounded by the source region 61, and is located below a horizontal plane including a bottommost surface of the alternating stacks {(132, 142), (232, 242)}.

In one embodiment, each of the memory opening fill structures 58 comprises a dielectric core 62 including a dielectric material having a different composition than the doped silicate glass pillar 162 and contacting an inner sidewall of the semiconductor channel 60. In one embodiment, the dielectric core 62 comprises undoped silicate glass, and contacts a top surface of the doped silicate glass pillar 162 and a convex annular surface 61S of an upper portion of the source region 61, as shown in FIG. 15E.

In one embodiment shown in FIG. 15E, the source region 61 comprises a tubular 61T segment that vertically extends through an upper portion of the source contact layer 114 and above a horizontal plane including a top surface of the source contact layer 114, an annular lateral-protrusion segment 61L that laterally protrudes outward from an outer sidewall of the tubular segment 61T of the source region 61, and a bottom segment 61B adjoined to a bottom of the annular lateral-protrusion segment and including a planar plate 61P portion in contact with a dielectric plate stack 150. In one embodiment, the annular lateral-protrusion segment 61L comprises a first concave annular surface 61X facing upward and contacting an annular convex surface of the source contact layer 114, and a second concave annular surface 61Y facing downward and contacting another annular convex surface of the source contact layer 114.

In one embodiment, the memory film 50 comprises a second tubular portion 502 that vertically extends below the horizontal plane including the bottommost surface of the alternating stacks {(132, 142), (232, 242)} and contacting the source contact layer 114 and having a lesser lateral extent than the first tubular portion 501, and a connection portion 503 that connects the first tubular portion 501 and the second tubular portion 502 and having a gradually increasing lateral extent that increases with a vertical distance from the substrate 8. In one embodiment, the memory film 50 comprises a charge storage layer 54 comprising a charge storage material and having a concave annular bottom surface that contacts the source contact layer 114, and a tunneling dielectric layer 56 located between the charge storage layer 54 and the semiconductor channel 60 and contacting an upper portion of an outer sidewall of the source region 61.

Figure 17:
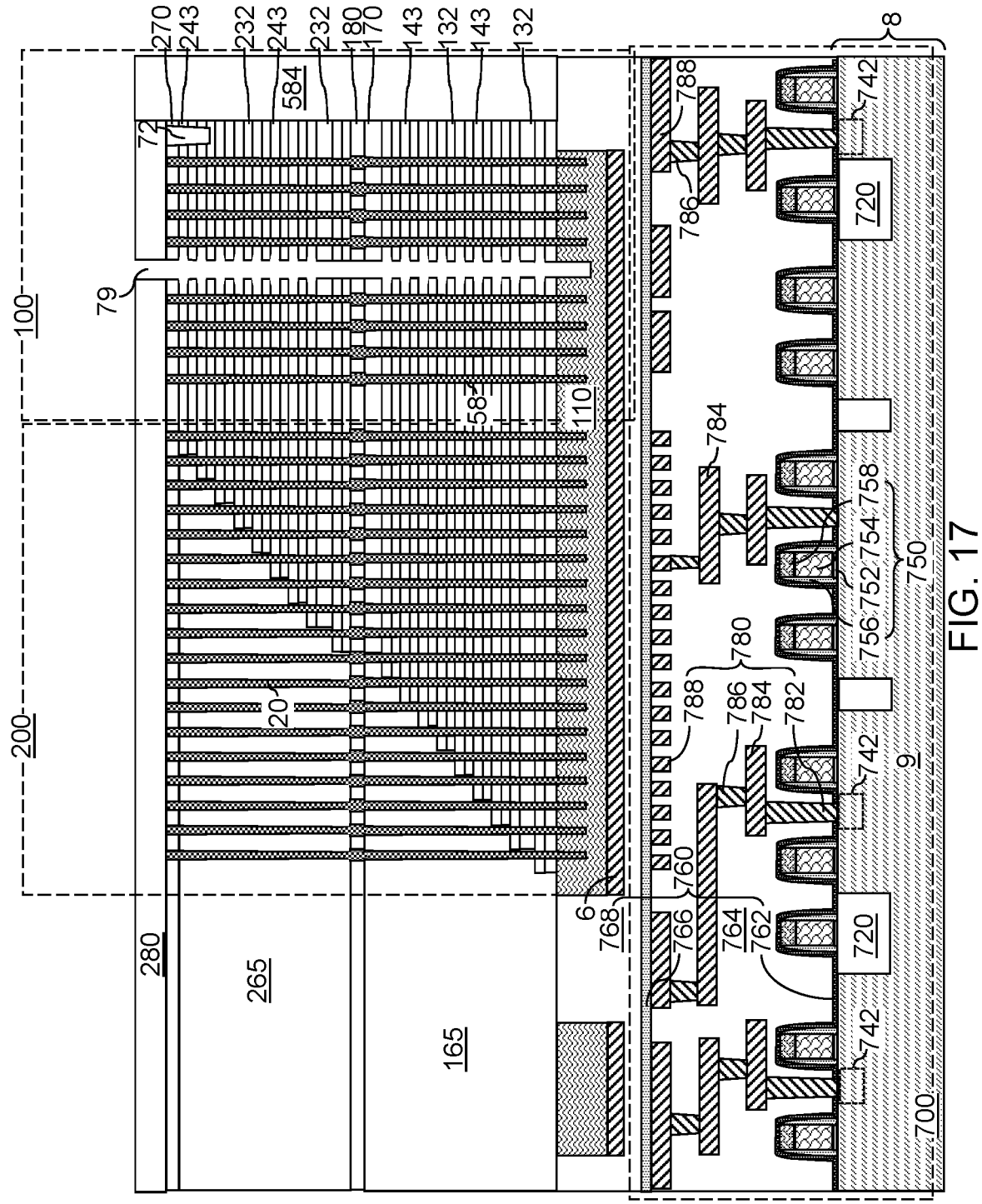
FIG. 17 is a vertical cross-sectional view of the first exemplary structure after formation of backside recesses according to the first embodiment of the present disclosure.
Figure 18A:
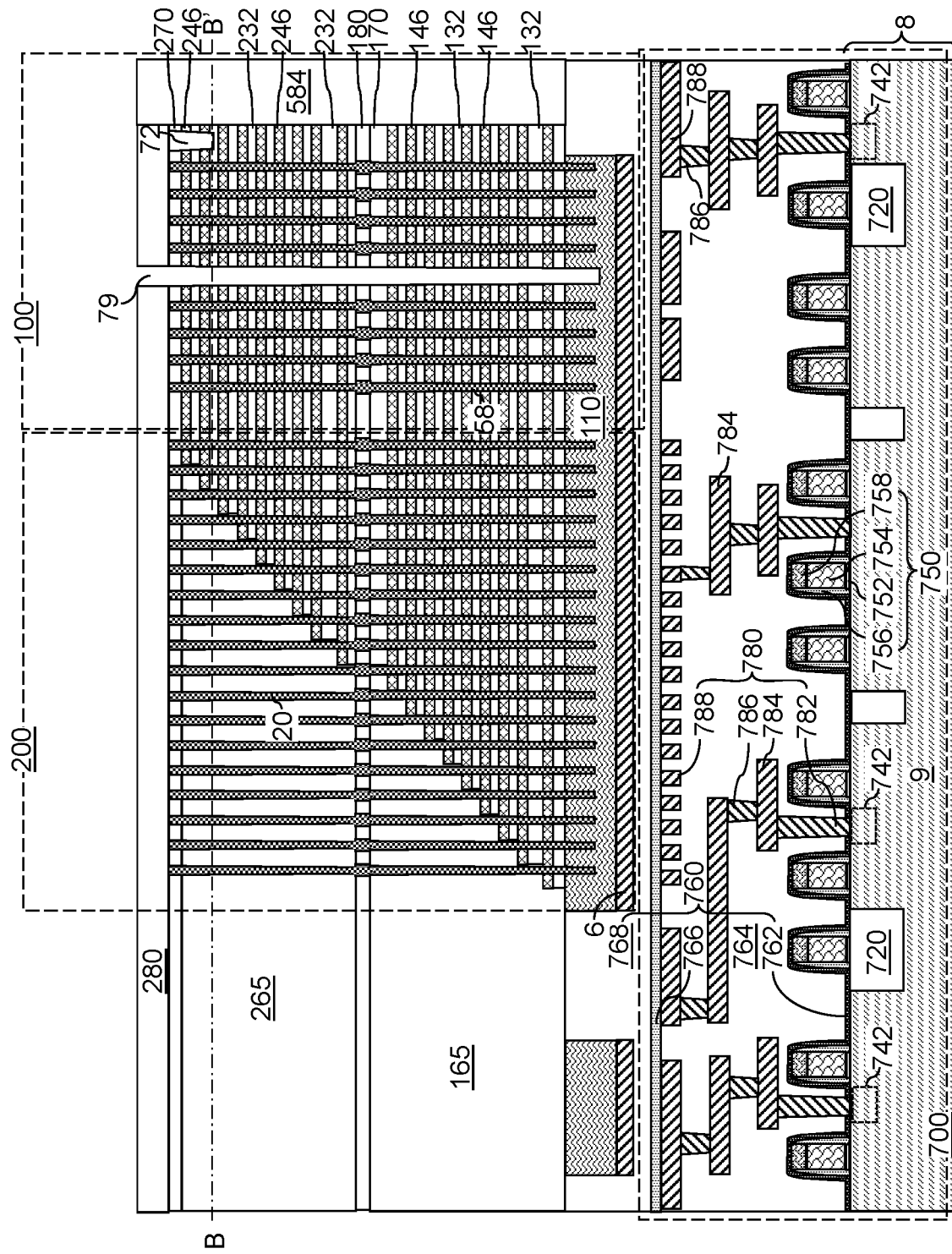
FIG. 18A is a vertical cross-sectional view of the first exemplary structure after formation of electrically conductive layers according to the first embodiment of the present disclosure.
Figure 18B:
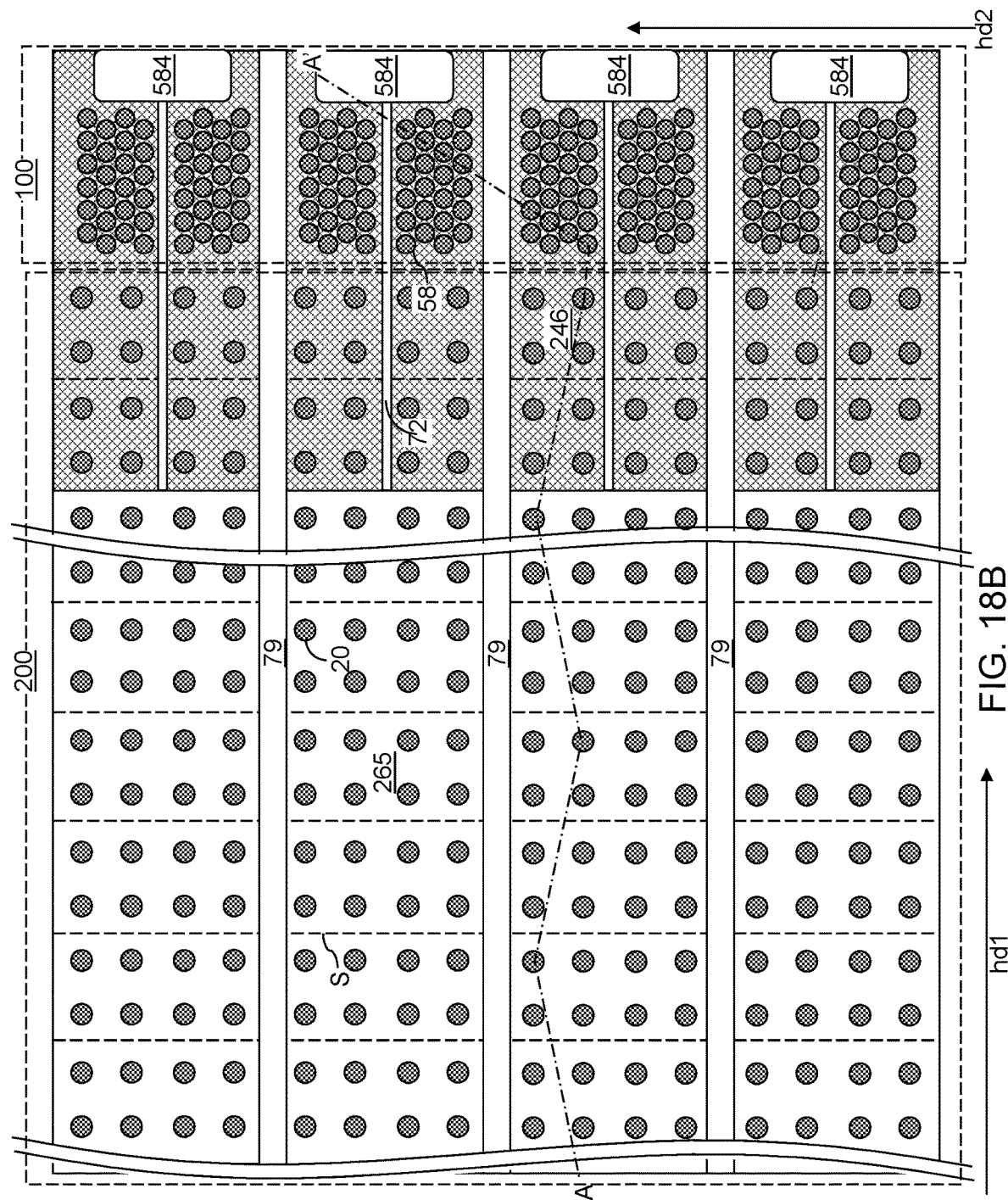
FIG. 18B is a horizontal cross-sectional view of the first exemplary structure along the horizontal plane B-B' of FIG. 18A. The hinged vertical plane A-A' corresponds to the plane of the vertical cross-sectional view of FIG. 18A.
Figure 19A:
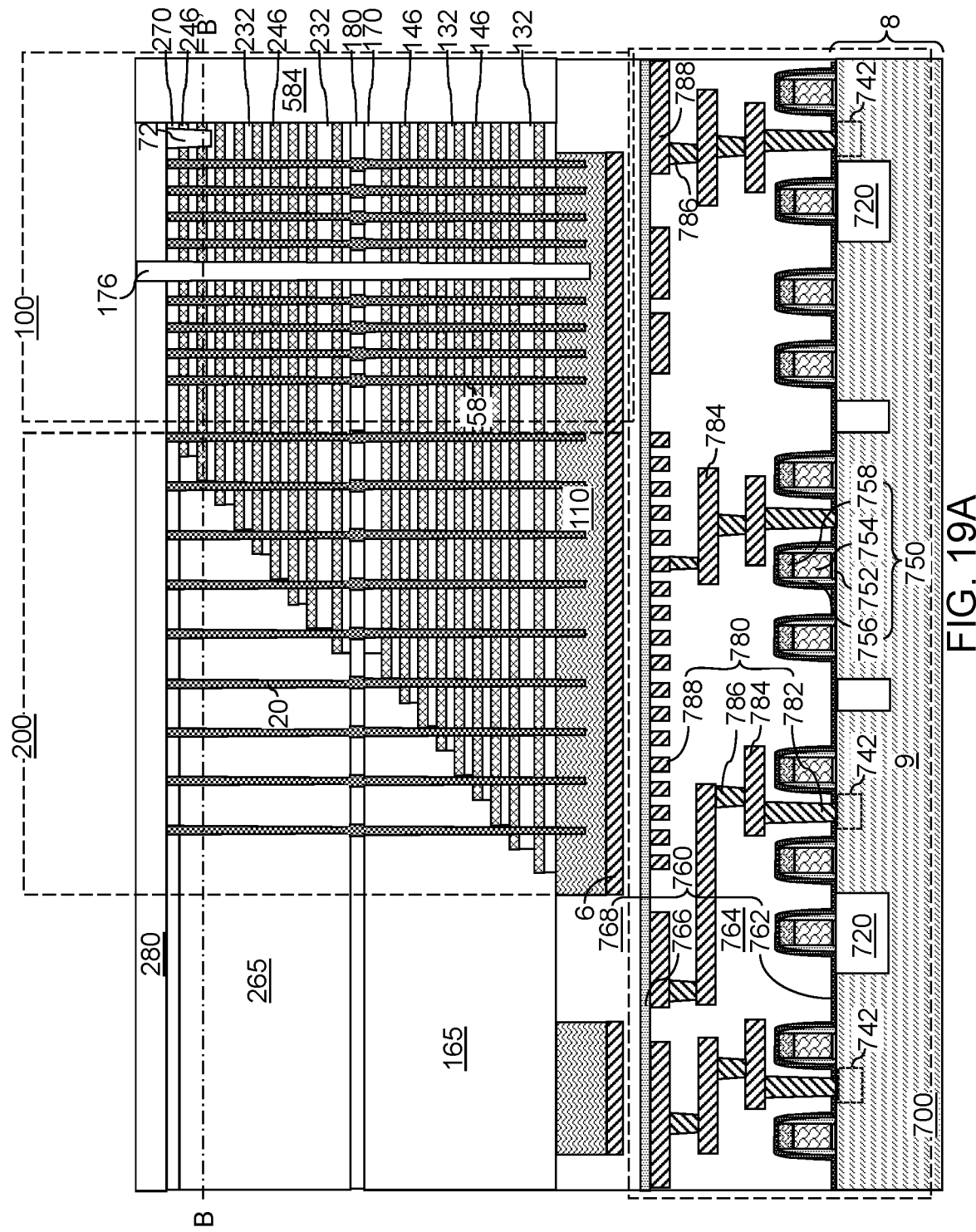
FIG. 19A is a vertical cross-sectional view of the first exemplary structure after formation of backside trench fill structures in the backside trenches according to the first embodiment of the present disclosure.
Figure 19B:
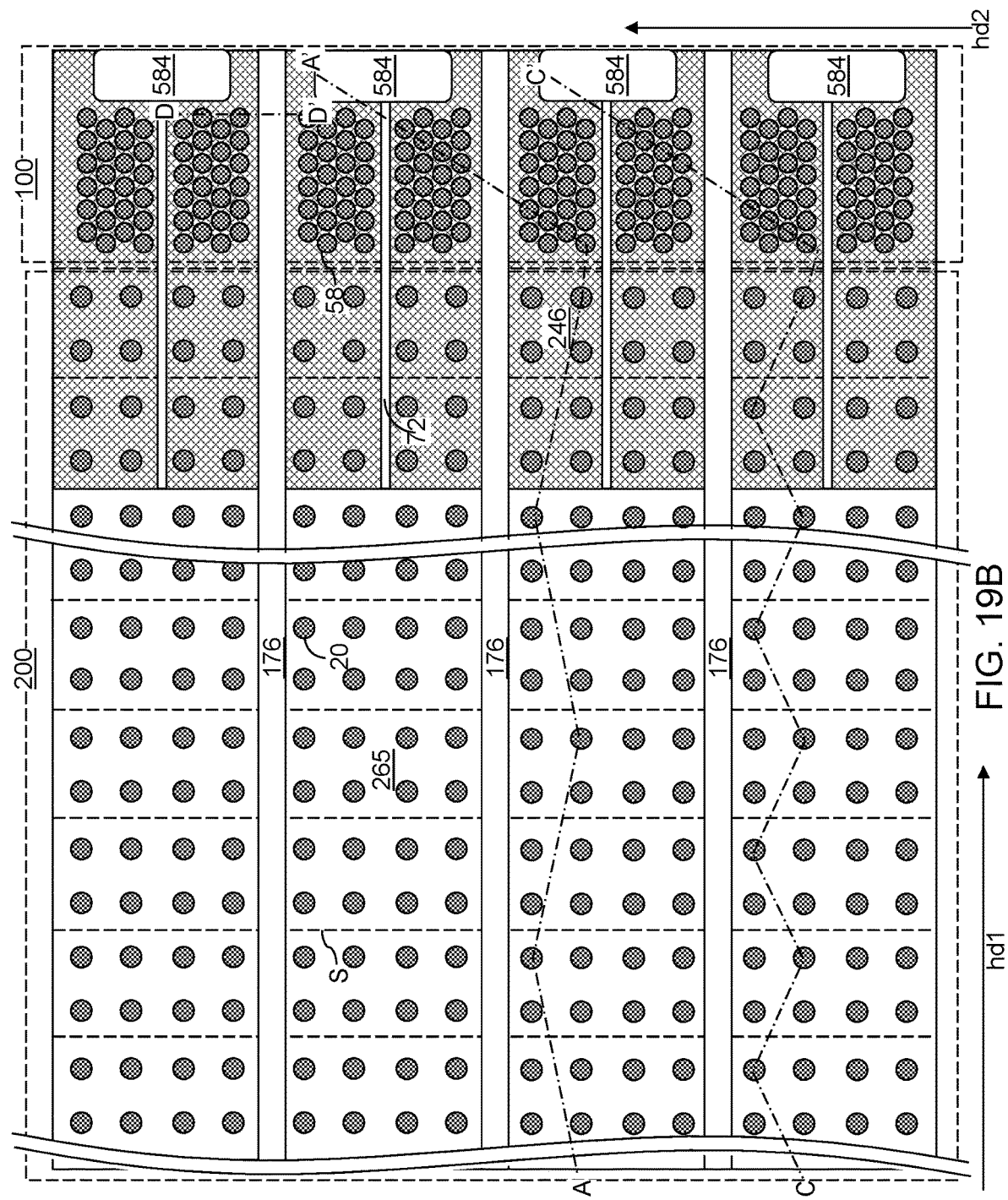
FIG. 19B is a horizontal cross-sectional view of the first exemplary structure along the horizontal plane B-B' of FIG. 19A. The hinged vertical plane A-A' corresponds to the plane of the vertical cross-sectional view of FIG. 19A.
Figure 19C:
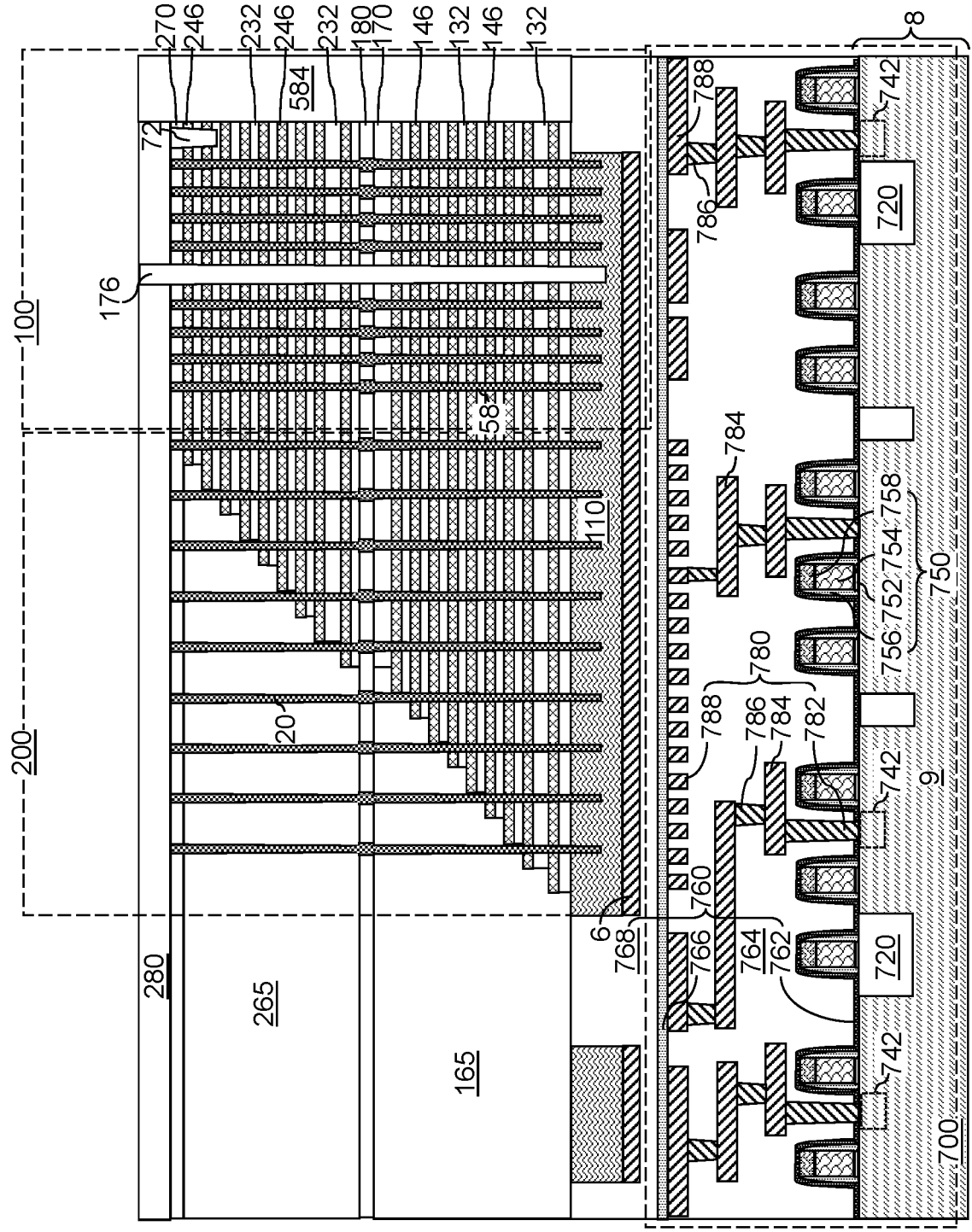
FIG. 19C is a vertical cross-sectional view of the first exemplary structure along the vertical plane C-C' of FIG. 19B.
Figure 19D:
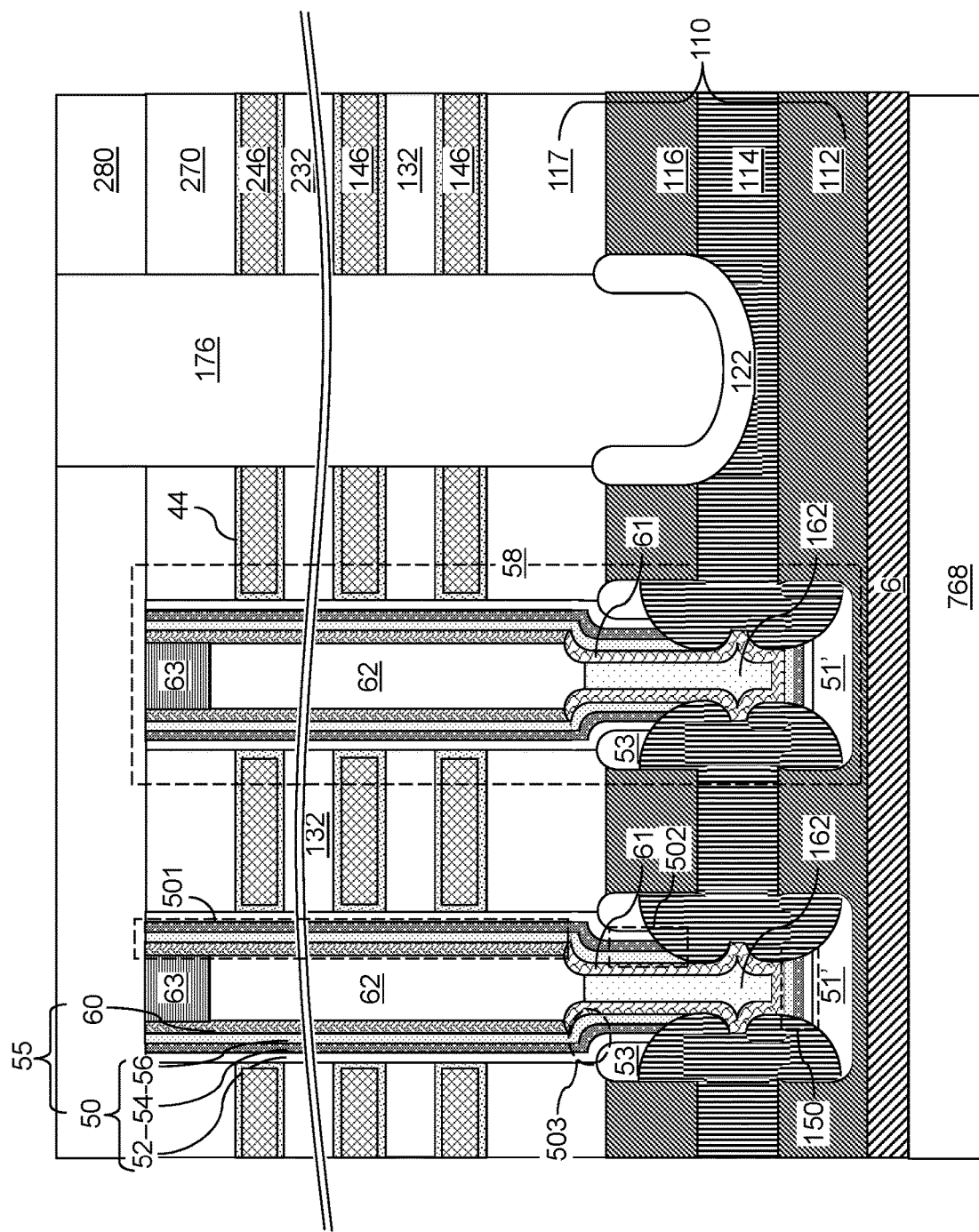
FIG. 19D is a vertical cross-sectional view of the first exemplary structure along the plane D-D' of FIG. 19B.

Referring to FIG. 17, the sacrificial material layers (142, 242) are may be removed selective to the insulating layers (132, 232), the first and second insulating cap layers (170, 270), the first contact level dielectric layer 280, and the source contact layer 114, the dielectric semiconductor oxide portions 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Referring to FIGS. 18A-18E, a backside blocking dielectric layer (not shown) may be optionally deposited in the backside recesses (143, 243) and the backside trenches 79 and over the first contact level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Referring to FIGS. 19A-19D, a dielectric material layer may be conformally deposited in the backside trenches 79 and over the first contact level dielectric layer 280 by a conformal deposition process. The dielectric material layer may include, for example, silicon oxide. The dielectric material layer may be planarized (e.g., by CMP) to form a dielectric wall structure 176 in the backside trenches. Furthermore, the optional backside blocking dielectric layers 44 are expressly illustrated in FIG. 19D.

Figure 20A:
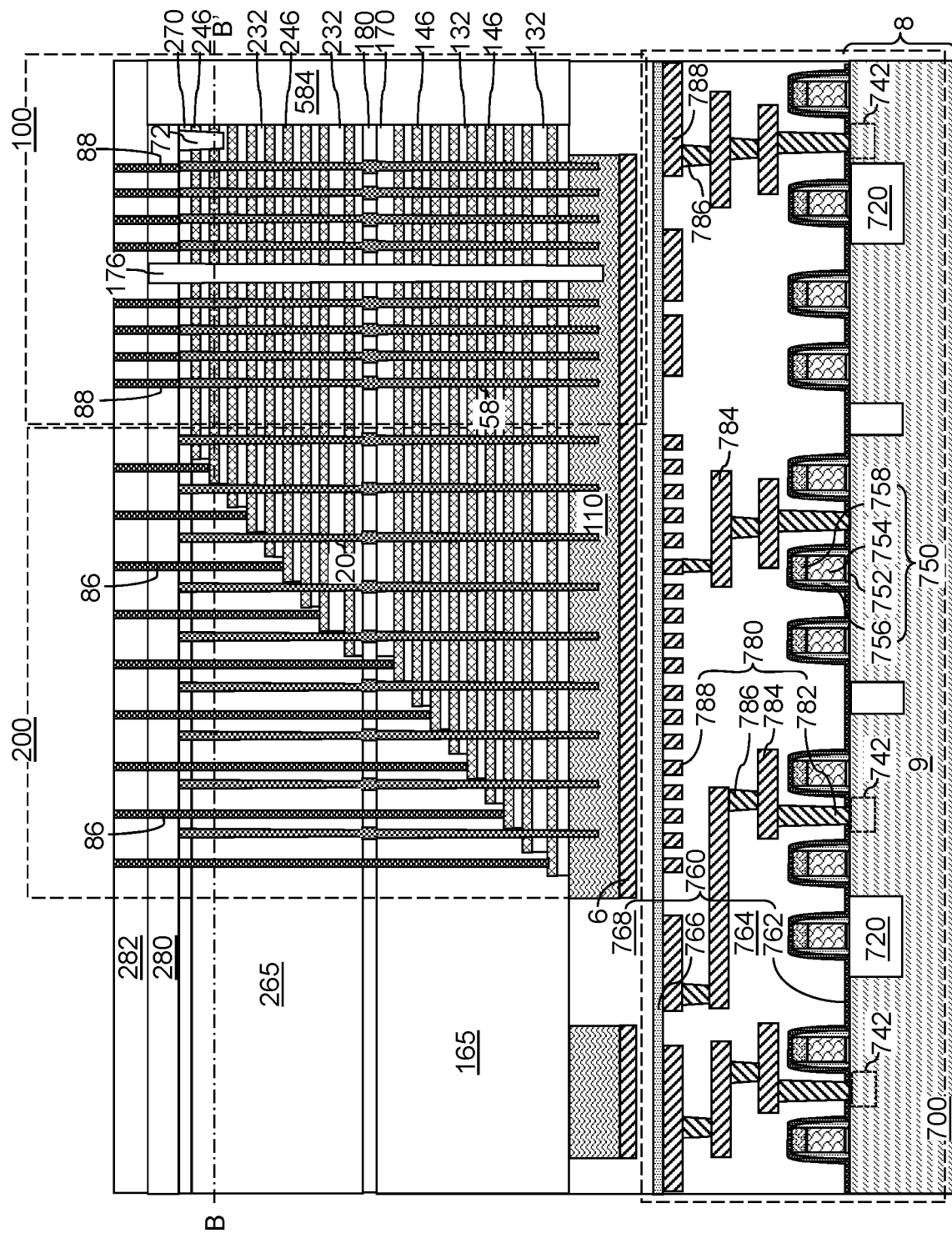
FIG. 20A is a vertical cross-sectional view of the first exemplary structure after formation of a second contact level dielectric layer and various contact via structures according to the first embodiment of the present disclosure.
Figure 20B:
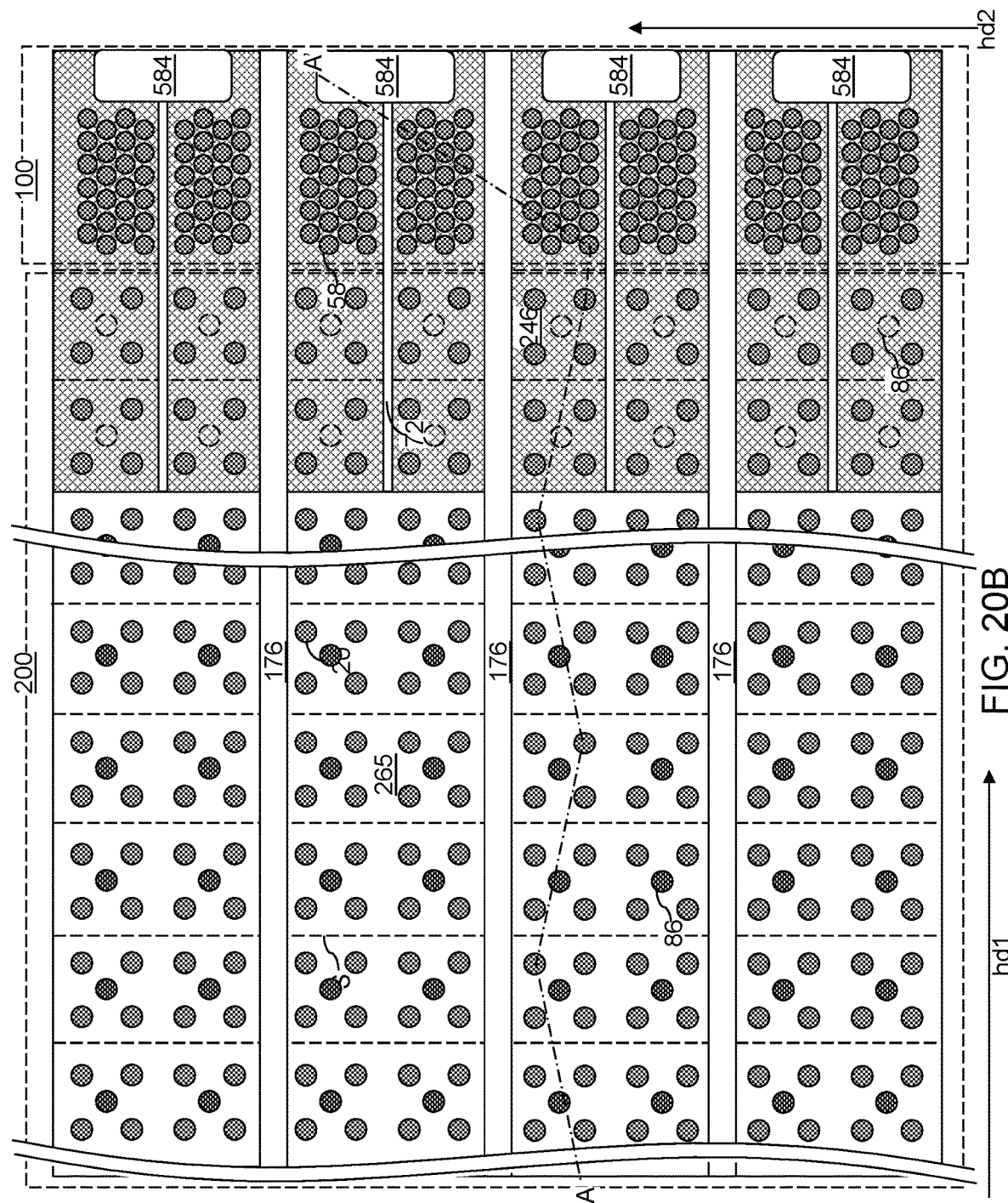
FIG. 20B is a horizontal cross-sectional view of the first exemplary structure along the vertical plane B-B' of FIG. 26A. The hinged vertical plane A-A' corresponds to the plane of the vertical cross-sectional view of FIG. 26A.

Referring to FIGS. 20A and 20B, a second contact level dielectric layer 282 may be formed over the first contact level dielectric layer 280. The second contact level dielectric layer 282 includes a dielectric material such as silicon oxide, and may have a thickness in a range from 100 nm to 600 nm, although lesser and greater thicknesses may also be used.

A photoresist layer (not shown) may be applied over the second contact level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 21:
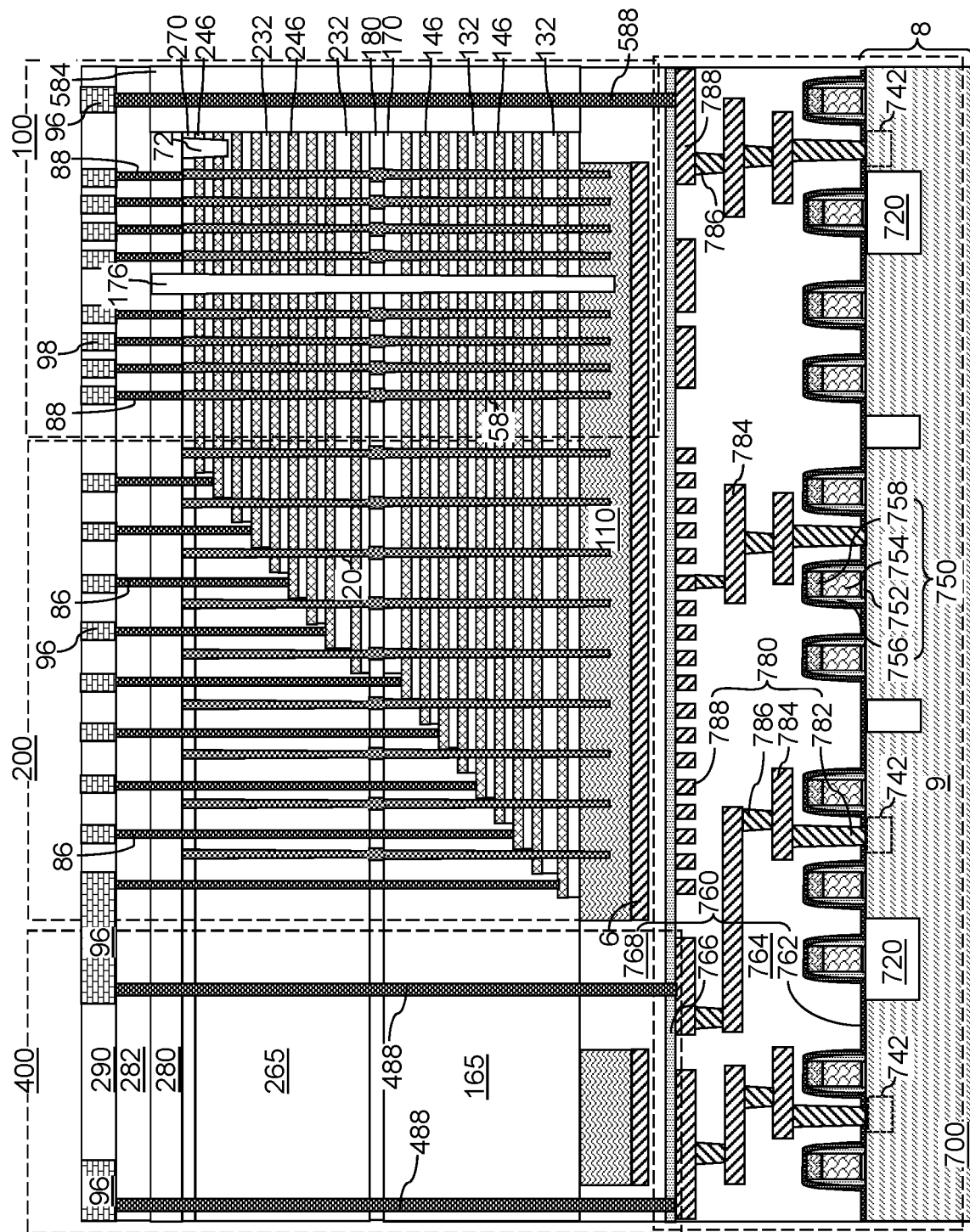
FIG. 21 is a vertical cross-sectional view of the first exemplary structure after formation of through-memory-level via structures and upper metal line structures according to the first embodiment of the present disclosure.

Referring to FIG. 21, peripheral-region via cavities may be formed through the second and first contact level dielectric layers (282, 280), the second and first retro-stepped dielectric material portions (265, 165), and the drain-side dielectric layers 768 to top surfaces of a first subset of the lower-level metal interconnect structure 780 in the peripheral device region 400. Through-memory-region via cavities may be formed through the interconnection region dielectric fill material portions 584 and the drain-side dielectric layers 768 to top surfaces of a second subset of the lower-level metal interconnect structure 780. At least one conductive material may be deposited in the peripheral-region via cavities and in the through-memory-region via cavities. Excess portions of the at least one conductive material may be removed from above the horizontal plane including the top surface of the second contact level dielectric layer 282. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588.

At least one additional dielectric layer may be formed over the contact level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488 and/or the through-memory-region via structures 588. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

Referring collectively to FIGS. 1A-21, a three-dimensional memory device is provided, which comprises: a source contact layer 114 located over a substrate 8 and comprising a doped semiconductor material; an alternating stack {(132, 146), (232, 246)} of insulating layers (132, 232) and electrically conductive layers (146, 246) located over the source contact layer 114; memory openings 49 vertically extending through the alternating stack {(132, 146), (232, 246)} and the source contact layer 114; and memory opening fill structures 58 located in the memory openings 49. Each of the memory opening fill structures 58 comprises: a memory film 50 including a first tubular portion that vertically extends through the alternating stack {(132, 146), (232, 246)}; a semiconductor channel 60 contacting an inner sidewall of the memory film 50; a source region 61 adjoined to a bottom end of the semiconductor channel 60 and contacting the source contact layer 114; and a doped silicate glass pillar 162 laterally surrounded by the source region 61 and located below a horizontal plane including a bottommost surface of the alternating stack {(132, 146), (232, 246)}.

FIGS. 22A-22G illustrate sequential vertical cross-sectional views of a region including a pair of memory openings within a second exemplary structure during formation of memory opening fill structures according to a second embodiment of the present disclosure. The second exemplary structure illustrated in FIG. 22A can be derived from the first exemplary structure of FIG. 9C by sequentially depositing a tunneling dielectric layer 56 and a source material layer 261L. The tunneling dielectric layer 56 can be the same as in the first exemplary structure. A cavity 49' is formed in the volume of each memory opening 49 that is not filled with the deposited material layers (52, 54, 56, 261L). The cavity 49' includes a first portion 49A overlying a horizontal plane including the top surface of the upper source-level semiconductor layer 116, and a second portion 49B underlying the horizontal plane including the top surface of the upper source-level semiconductor layer 116.

The source material layer 261L includes a doped semiconductor material having a doping of the second conductivity type. For example, the source material layer 261L can include doped polysilicon, doped amorphous silicon, a doped silicon-germanium alloy, a doped III-V compound semiconductor material, or any other doped semiconductor material having a doping of the second conductivity type, that is the same conductivity type as the doping of the lower source-level semiconductor layer 112 and the upper source-level semiconductor layer 116. The atomic concentration of the dopants of the second conductivity type in the source material layer 261L can be in a range from $5.0\times10^{18}/cm^3$ to $2.0\times10^{21}/cm^3$, although lesser and greater atomic concentrations can also be employed. For example, the second conductivity type may be n-type, and the dopant may comprise phosphorus or arsenic. The source material layer 261L may comprise phosphorus doped amorphous silicon in one example. The source material layer 261L can be deposited by a conformal deposition process such as a low pressure chemical vapor deposition (LPCVD) process. The thickness of the source material layer 261L can be in a range from 2 nm to 20 nm, although lesser and greater thicknesses can also be employed.

Figure 22A:
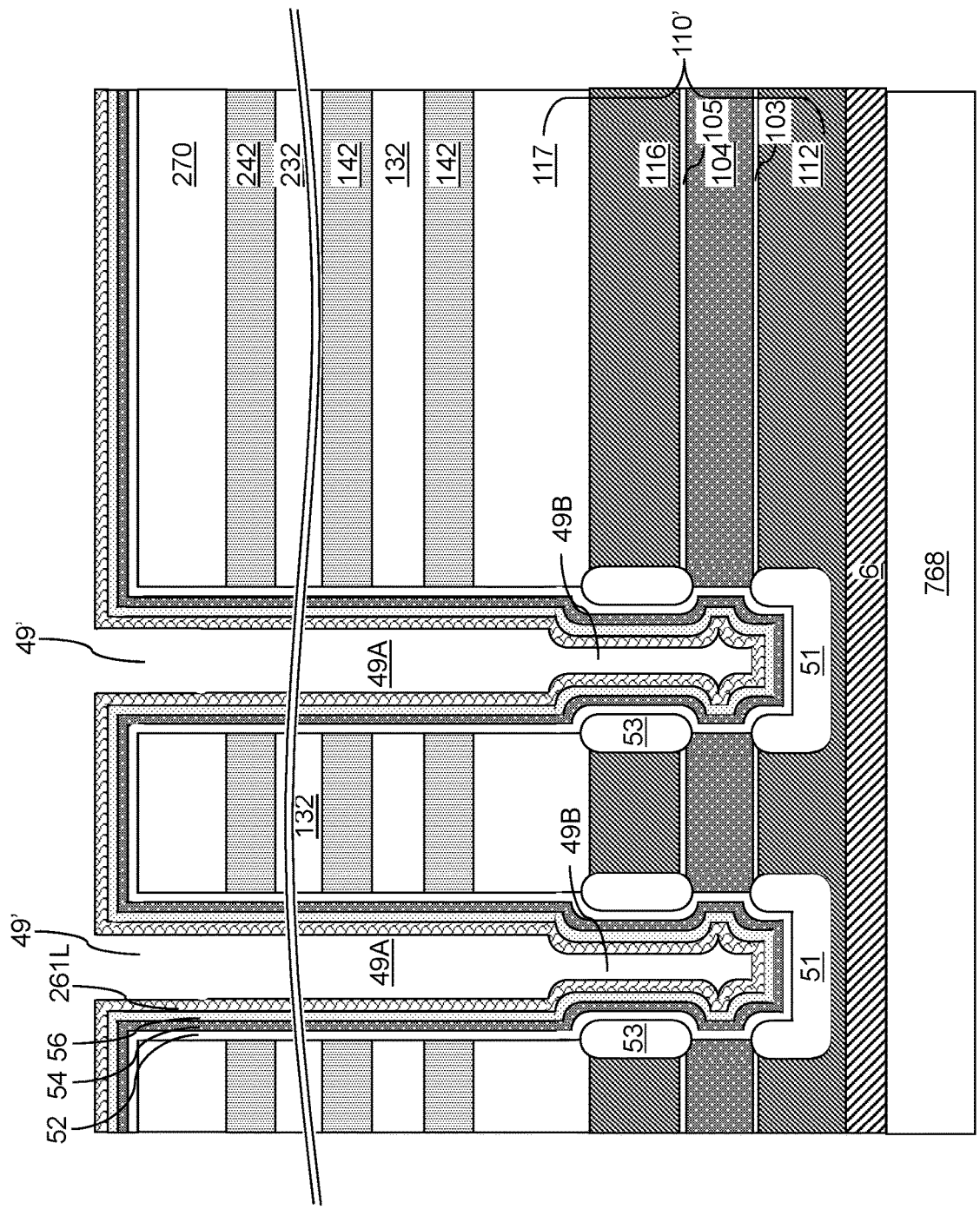
FIGS. 22A-22G illustrate sequential vertical cross-sectional views of a region including a pair of memory openings within a second exemplary structure during formation of memory opening fill structures according to a second embodiment of the present disclosure.
Figure 22B:
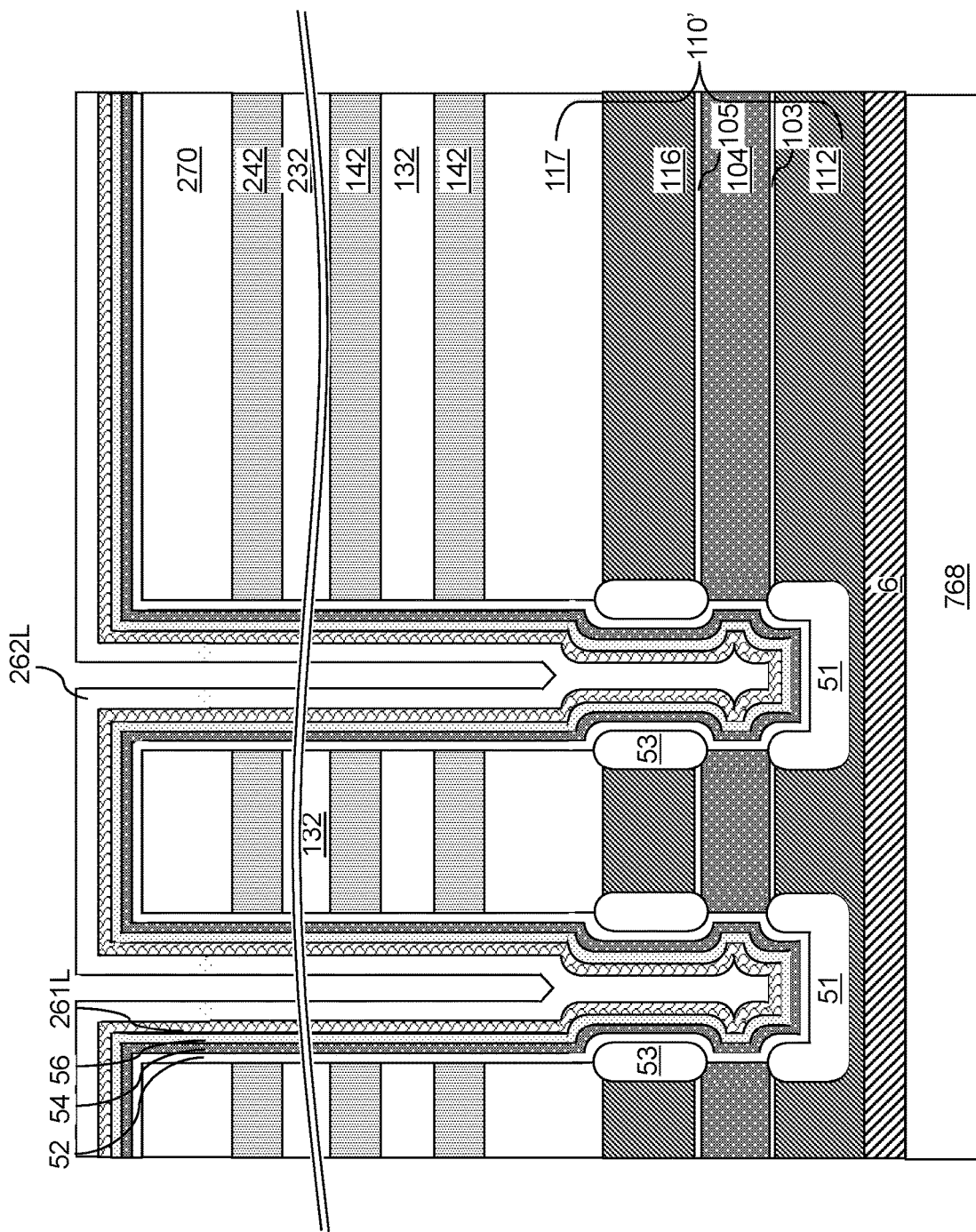

Referring to FIG. 22B, a dielectric fill material layer 262L can be conformally deposited over the source material layer 261L in each of the memory openings 49. The dielectric fill material layer 262L includes an undoped dielectric material such as undoped silicate glass. The dielectric fill material layer 262L can be deposited by a conformal deposition process such as a low pressure chemical vapor deposition process. The thickness of the dielectric fill material layer 262L can be greater than one half of the lateral separation distance between laterally spaced portions of the source material layer 261L in each memory opening 49 at the level of the upper source-level semiconductor layer 116, and is less than one half of the lateral distance between portions of the source material layer 261L in each memory opening 49 at the levels of the alternating stacks {(132, 142), (232, 242)}. Thus, the portion 49B of the cavity 49' underlying the horizontal plane including the top surface of the upper source-level semiconductor layer 116 can be filled with the dielectric fill material layer 262L as the dielectric fill material layer 262L fills and pinches off the second portion 49B of the cavity 49' that underlies the horizontal plane including the top surface of the upper source-level semiconductor layer 116. In one embodiment, the entire volume of the second portion 49B of each cavity 49' in the memory openings 49 that underlies the horizontal plane including the top surface of the upper source-level semiconductor layer 116 can be completely filled by the dielectric fill material layer 262L. The remaining volume (i.e., the first portion 49A) of the cavity 49' in each memory opening 49 vertically extends through each layer of the alternating stacks {(132, 142), (232, 242)}. The first portion 49A of the cavity 49' is only partially filled with the dielectric fill material layer 262L. In one embodiment, the thickness of the dielectric fill material layer 262L can be in a range from 20 nm to 200 nm, although lesser and greater thicknesses can also be employed.

Generally, the tubular semiconductor oxide spacers 53 reduce the lateral extent of the lower portion of the void in each memory opening 49. Thus, the layer stack of the blocking dielectric layer 52, the charge storage layer 54, the tunneling dielectric layer 56, and the source material layer 261L has a lesser lateral extent at a level of the tubular semiconductor oxide spacers 53 than at levels of the alternating stacks {(132, 142), (232, 242)}. The dielectric fill material layer 262L fills each portion of the memory openings 49 that is laterally surrounded by a respective one of the tubular semiconductor oxide spacers 53, and does not fully fill each portion of the memory openings 49 that is laterally surrounded by the alternating stacks {(132, 142), (232, 242)}.

Figure 22C:
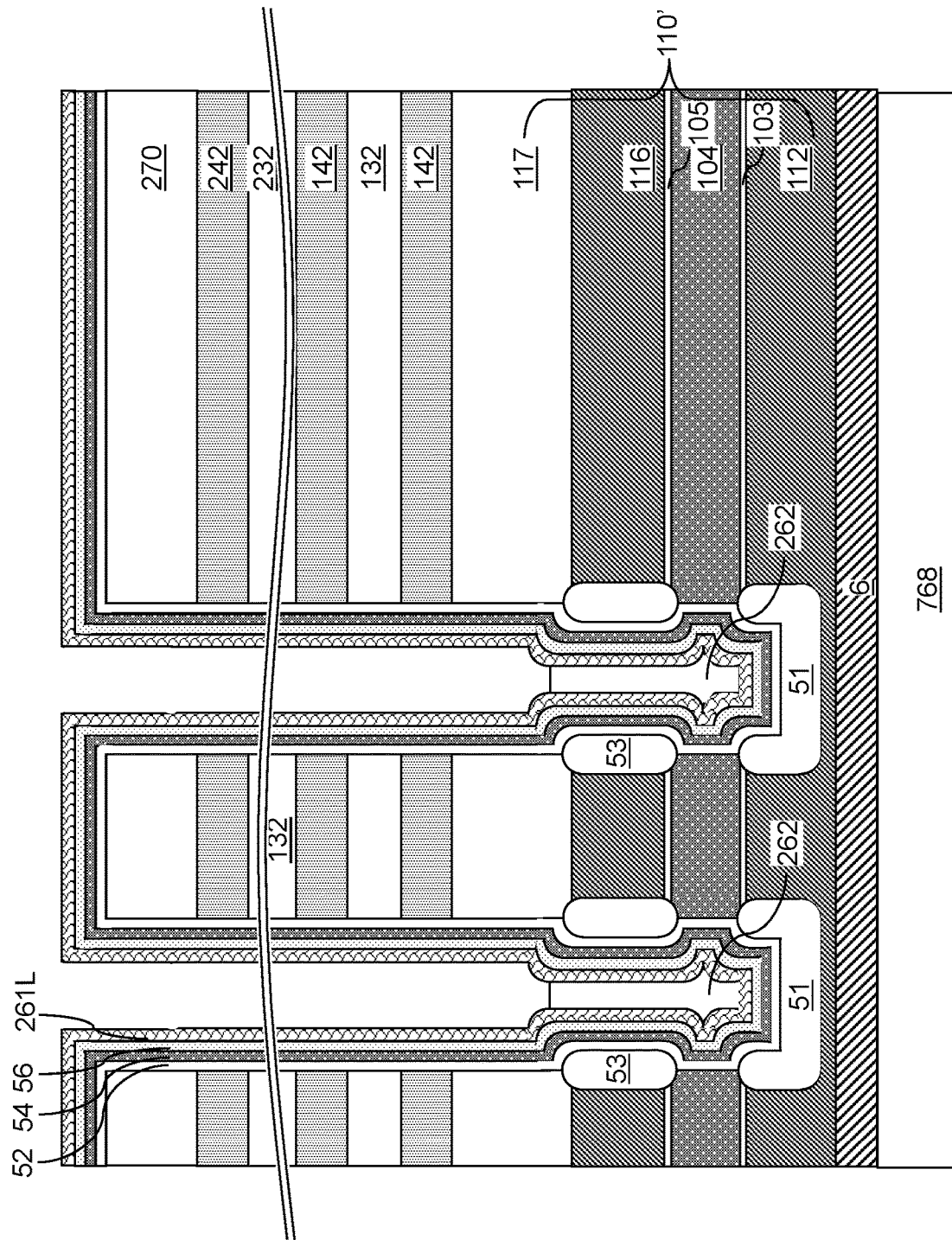

Referring to FIG. 22C, an isotropic etch process that etches the material of the dielectric fill material layer 262L can be performed to remove portions of the dielectric fill material layer 262L that overlie the horizontal plane including the top surface of the upper source-level semiconductor layer 116. In one embodiment, the isotropic etch process can etch the material of the dielectric fill material layer 262L selective to the material of the source material layer 261L. Portions of the dielectric fill material layer 262L that overlie the tubular semiconductor oxide spacers 53 are removed by the isotropic etch process. For example, a wet etch process employing dilute hydrofluoric acid can be employed. Each remaining portion of the dielectric fill material layer 262L at the bottom of the memory openings 49 comprises a dielectric pillar 262. Generally, the dielectric pillars 262 can be formed by removing portions of the dielectric fill material layer 262L located at levels of the alternating stacks {(132, 142), (232, 242)}. Remaining portions of the dielectric fill material layer 262L after the isotropic etch process comprise the dielectric pillars 262.

Figure 22D:
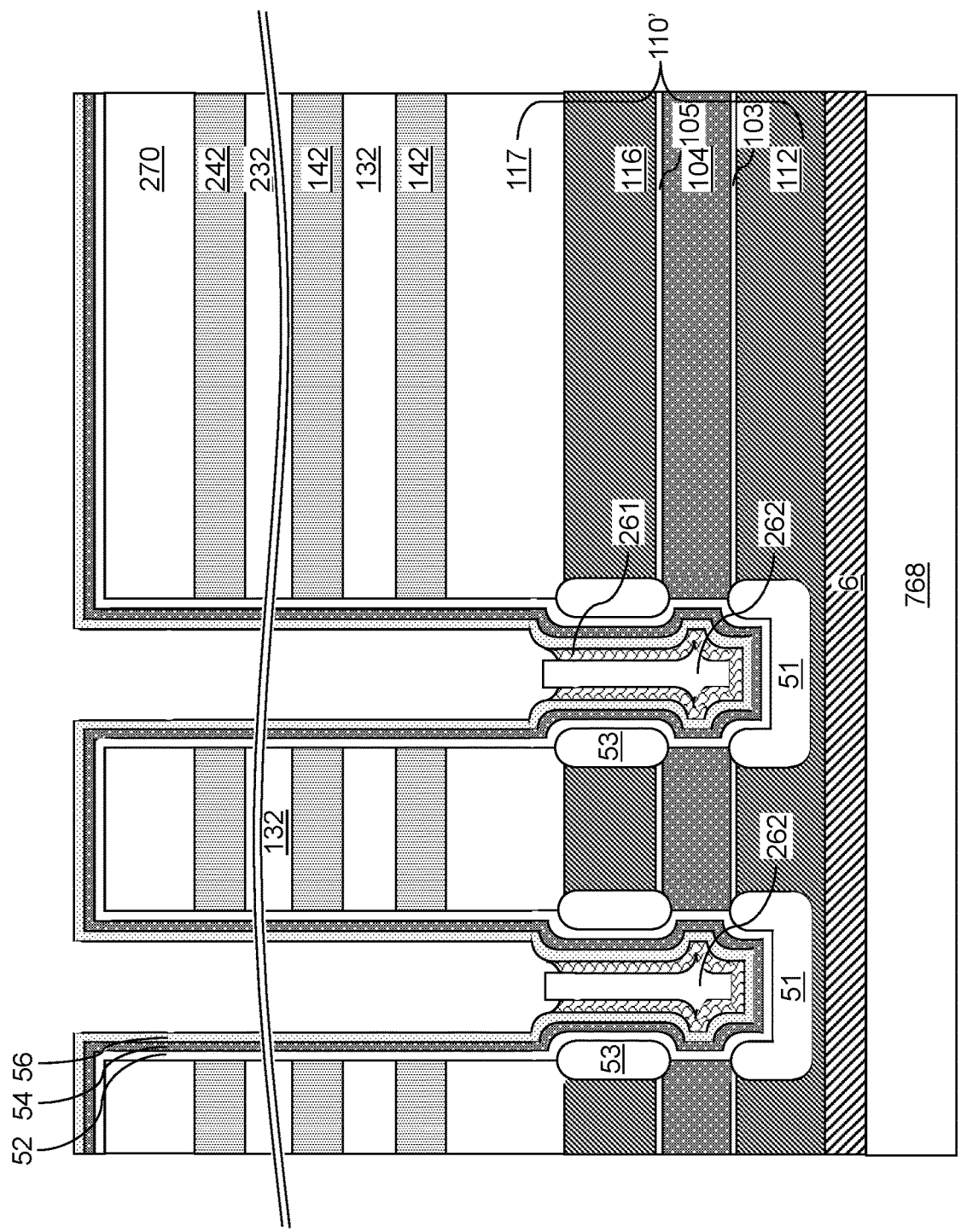

Referring to FIG. 22D, an isotropic etch process that etches the material of the source material layer 261L selective to the material of the tunneling dielectric layers 56 and the dielectric pillars 262 can be performed to remove unmasked portions of the source material layer 261L. Portions of the source material layer 261L that overlie the horizontal plane including the top surface of the upper source-level semiconductor layer 116 can be removed. Portions of the source material layer 261L that overlie the tubular semiconductor oxide spacers 53 are removed by the isotropic etch process. A wet etch process that etches the semiconductor material of the source material layer 261L selective to silicon oxide materials can be performed. For example, a wet etch process employing hot trimethyl-2 hydroxyethyl ammonium hydroxide ("hot TMY") or tetramethyl ammonium hydroxide (TMAH) may be used to remove the unmasked portions of the source material layer 261L. Each remaining portion of the source material layer 261L at the bottom of the memory openings 49 comprises a source region 261. Generally, the source regions 261 can be formed by removing portions of the source material layer 261L located at levels of the alternating stacks {(132, 142), (232, 242)}. Remaining portions of the source material layer 261L after the isotropic etch process comprise the source regions 261. In one embodiment, each source region 261 can have an annular tapered concave top surface that laterally surrounds a respective dielectric pillar 262. An inner periphery of the annular tapered concave top surface of each source region 261 can contact a cylindrical sidewall of the respective dielectric pillar 262. An outer periphery of the annular tapered concave top surface of each source region 261 can contact a cylindrical sidewall of the tunneling dielectric layer 56.

Figure 22E:
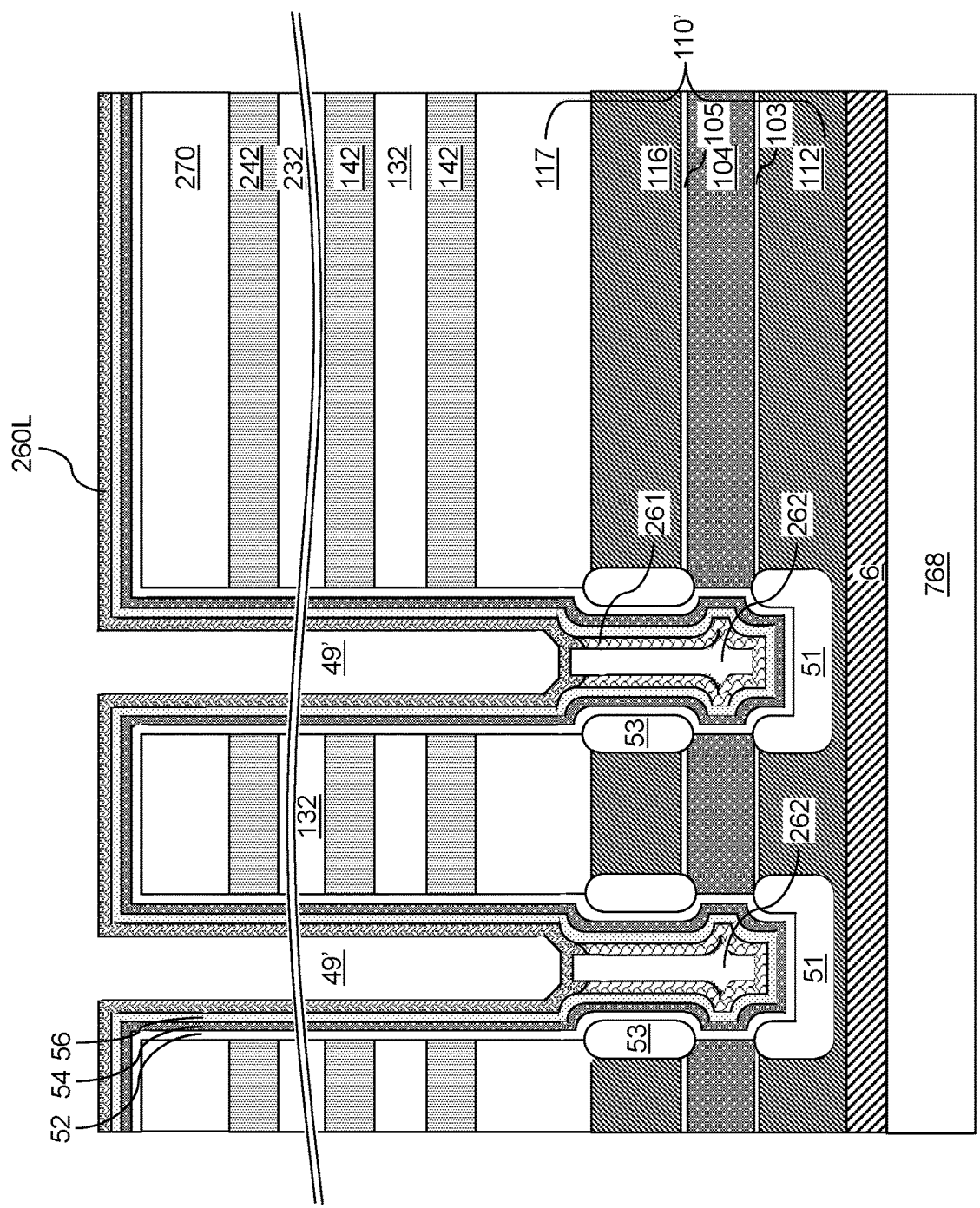

Referring to FIG. 22E, a semiconductor channel material layer 260L can be subsequently deposited on the tunneling dielectric layer 56. The semiconductor channel material layer 260L includes a doped semiconductor material having a doping of the first conductivity type. The doped semiconductor material of the semiconductor channel material layer 260L can include at least one elemental semiconductor material, at least one III-V compound semiconductor material, at least one II-VI compound semiconductor material, at least one organic semiconductor material, or other semiconductor materials known in the art. In one embodiment, the semiconductor channel material layer 260L may have a uniform doping. In one embodiment, atomic concentration of dopants of the first conductivity type in the semiconductor channel material layer 260L may be in a range from $1.0\times10^{12}/cm^3$ to $1.0\times10^{18}/cm^3$, such as from $1.0\times10^{14}/cm^3$ to $1.0\times10^{17}/cm^3$. In one embodiment, the first conductivity type can be p-type, and the semiconductor channel material layer 260L includes, and/or consists essentially of, boron-doped amorphous silicon or boron-doped polysilicon. The semiconductor channel material layer 260L may be formed by a conformal deposition method such as low pressure chemical vapor deposition (LPCVD). The thickness of the semiconductor channel material layer 260L may be in a range from 2 nm to 20 nm, although lesser and greater thicknesses may also be used. A cavity 49' is formed in the volume of each memory opening 49 that is not filled with the deposited material layers (52, 54, 56, 260L).

Figure 22F:
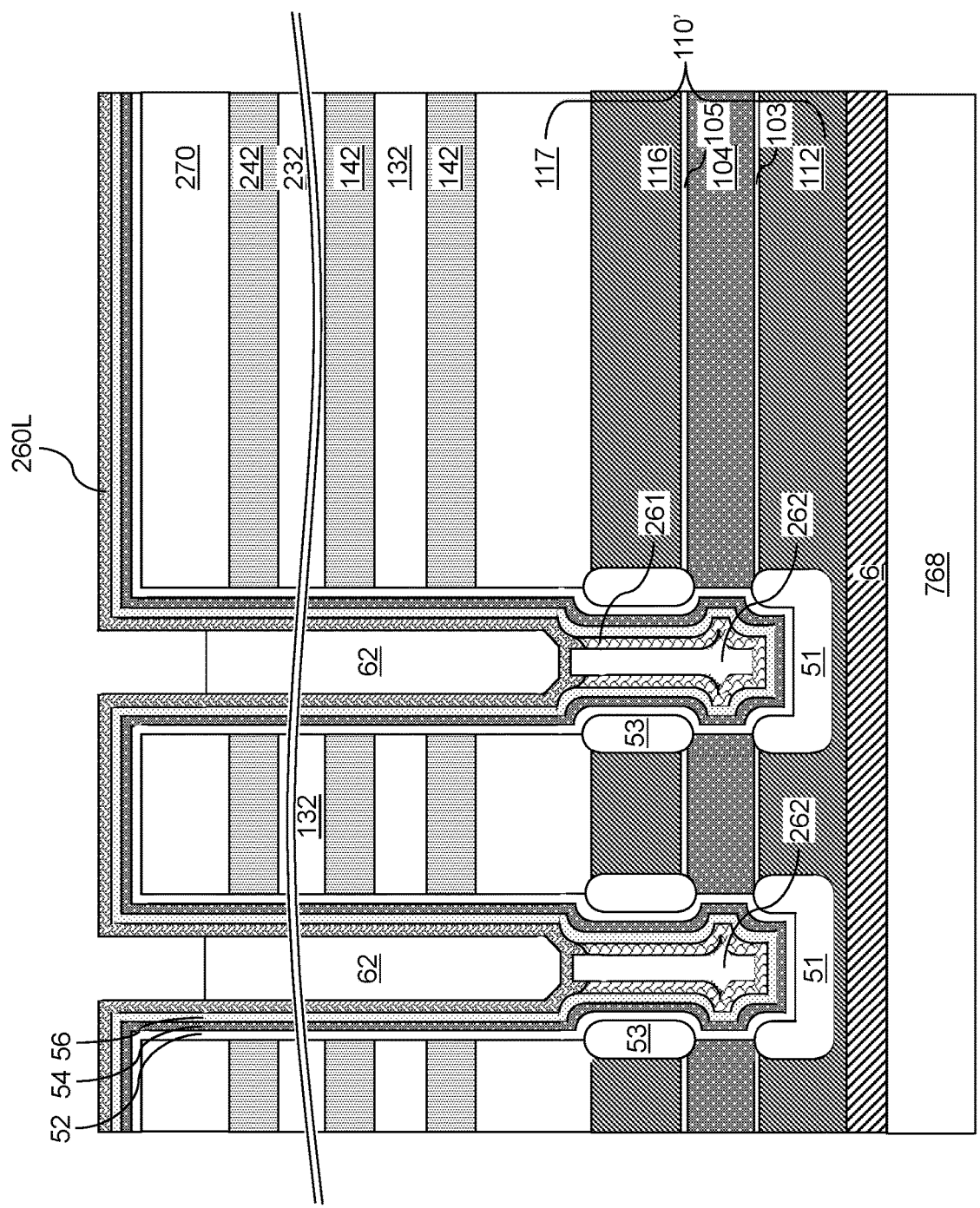

Referring to FIG. 22F, a dielectric material such as undoped silicate glass can be conformally deposited in remaining volumes of the voids in the memory openings 49 to form a dielectric core layer. The dielectric core layer may be deposited in each memory cavity 49' to fill any remaining portion of the cavity 49' within each memory opening 49. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating.

The horizontal portion of the dielectric core layer overlying the second insulating cap layer 270 may be removed, for example, by a recess etch. The recess etch continues until top surfaces of the remaining portions of the dielectric core layer are recessed to a height at, or about, the bottom surface of the second insulating cap layer 270. Each remaining portion of the dielectric core layer constitutes a dielectric core 62. Each dielectric core 62 can be formed on an inner sidewall of a respective vertically-extending portion of the semiconductor channel material layer 260L, and is vertically spaced from a respective underlying dielectric pillar 262 by a respective portion of the semiconductor channel material layer 260L. In one embodiment, the dielectric cores 62 can comprise, and/or can consist essentially of, undoped silicate glass or a doped silicate glass including dopants of the first conductivity type. For example, if the first conductivity type is p-type, the dielectric cores 62 can include borosilicate glass.

Figure 22G:
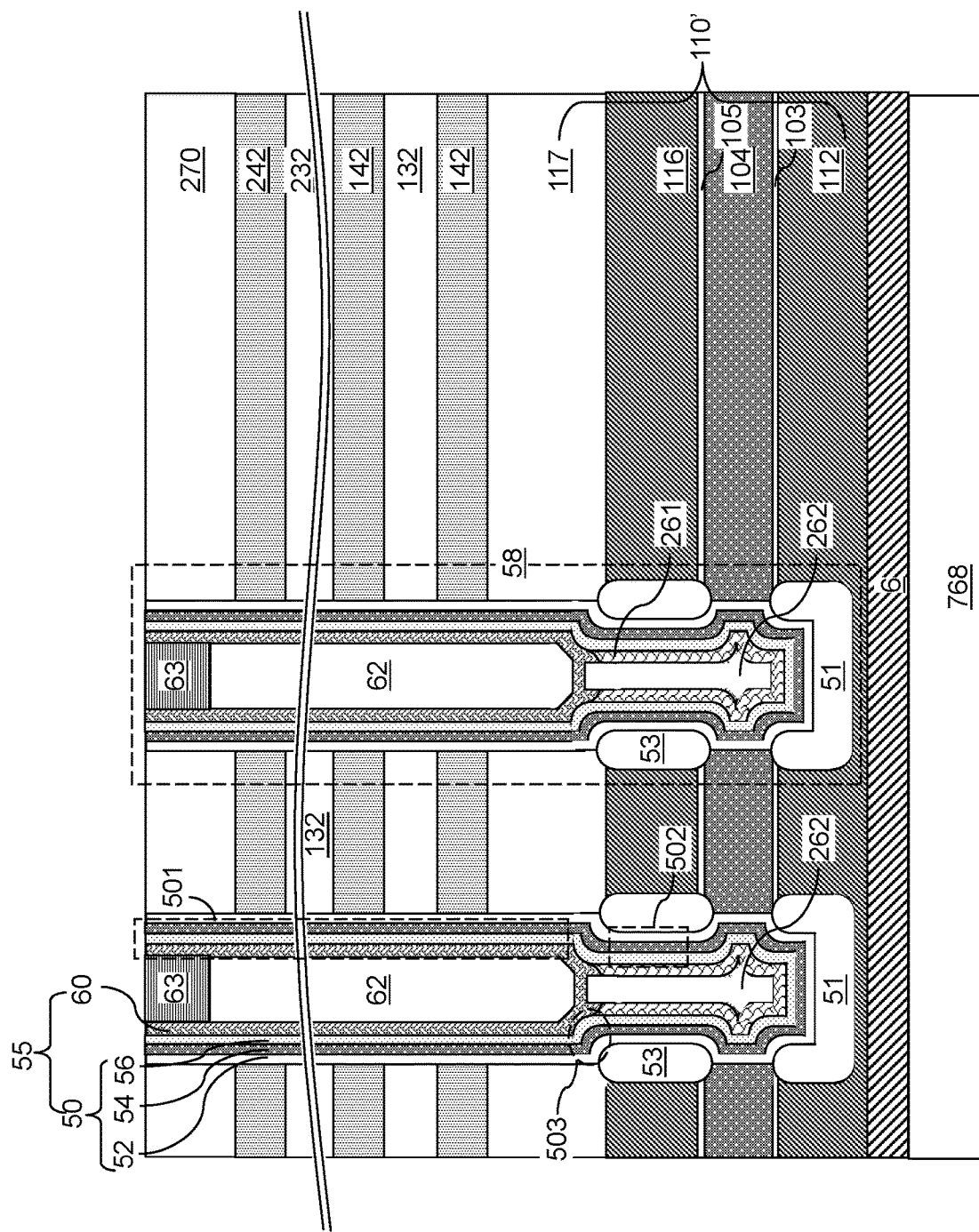

Referring to FIG. 22G, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 260L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0\times10^{18}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 260L constitutes a semiconductor channel 60 through which electrical current may flow when a vertical NAND device including the semiconductor channel 60 is turned on. The semiconductor channels 60 of the second exemplary structure may have the same material composition as the semiconductor channels 60 of the first exemplary structure. Each drain region 63 can be formed on a top end of a respective semiconductor channel 60 and on a top surface of a respective one of the dielectric cores 62. In one embodiment, the semiconductor channels 60 can include dopants of the first conductivity type at a first atomic concentration, while the drain regions 63 and the source regions 261 include dopants of the second conductivity type that is the opposite of the first conductivity type at a second atomic concentration that is higher than the first atomic concentration.

A tunneling dielectric layer 56 is surrounded by a charge storage layer 54, and laterally surrounds a semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a semiconductor channel 60 (which is a semiconductor channel) within a memory opening 49 constitutes a memory stack structure 55. The memory stack structure 55 is a combination of a semiconductor channel 60, a tunneling dielectric layer 56, a plurality of memory elements comprising portions of the charge storage layer 54, and an optional blocking dielectric layer 52. Each combination of a tubular semiconductor oxide spacer 53, a semiconductor oxide material portion 51, a memory stack structure 55, a dielectric pillar 262, a dielectric core 62, a source region 261 and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, the memory opening fill structures 58, and support pillar structures that are formed in the support openings 19 collectively constitute a memory-level assembly.

Generally, each of the memory openings 49 can be filled with a respective memory opening fill structure 58. Each of the memory opening fill structures 58 comprises a dielectric core 62 and a drain region 63 that overlies a respective one of the dielectric pillars 262. The source-level sacrificial layer 104 is located over a substrate 8, and alternating stacks of insulating layers (132, 232) and sacrificial material layers (142, 242) are located over the source-level sacrificial layer 104. Memory openings 49 vertically extend through the alternating stacks {(132, 142), (232, 242)} and the source-level sacrificial layer 104. The memory opening fill structures 58 are located in the memory openings 49.

In one embodiment, each of the memory opening fill structures 58 comprises a memory film 50, a semiconductor channel 60 contacting an inner sidewall of the memory film 50, a source region 261 adjoined to a bottom end of the semiconductor channel 60 and contacting the source contact layer 114, a dielectric pillar 262 laterally surrounded by the source region 261, and a dielectric core 62 laterally surrounded by a vertically-extending portion of the semiconductor channel 60 and vertically spaced from the dielectric pillar 262 by a bottom portion of the semiconductor channel 60.

The memory film 50 comprises a first tubular portion that vertically extends through the alternating stacks of insulating layers {(132, 142), (232, 242)}, a second tubular portion 502 that vertically extends below the horizontal plane including the bottommost surface of the alternating stacks {(132, 142), (232, 242)} having a lesser lateral extent (such as the width along any horizontal direction) than the first tubular portion 501, and a connection portion 503 that connects the first tubular portion 501 and the second tubular portion 502 and having a gradually increasing lateral extent that increases with a vertical distance from the substrate 8.

In one embodiment, the bottom portion of the semiconductor channel 60 contacts a top surface of the dielectric pillar 262 and an upper portion of a sidewall of the dielectric pillar 262. In one embodiment, the semiconductor channel 60 contacts the source region 261 at an annular interface containing a p-n junction.

Subsequently, the processing steps of FIGS. 11A-14 can be performed to form interconnection region dielectric fill material portions 584 and the backside trenches 79.

FIGS. 23A-23E illustrate sequential vertical cross-sectional views of a region including a pair of memory openings fill structures 58 and a backside trench 79 within the second exemplary structure during formation of source-level material layers 110 according to the second embodiment of the present disclosure.

Figure 23A:
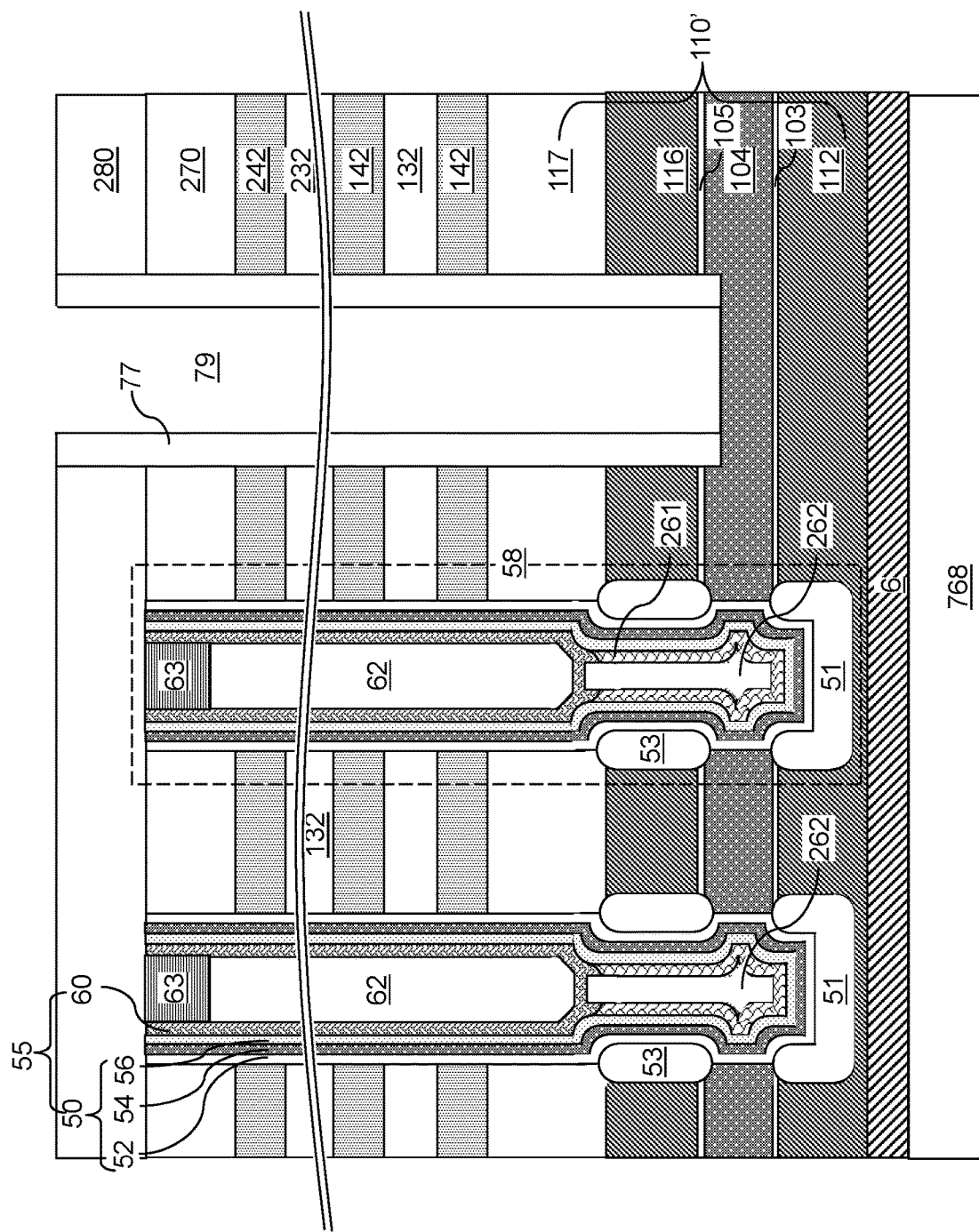
FIGS. 23A-23E illustrate sequential vertical cross-sectional views of a region including a pair of memory openings fill structures and a backside trench within the second exemplary structure during formation of source-level material layers according to the second embodiment of the present disclosure.

Referring to FIG. 23A, a backside trench spacer 77 may be formed on sidewalls of each backside trench 79. For example, a conformal spacer material layer may be deposited in the backside trenches 79 and over the first contact level dielectric layer 280, and may be anisotropically etched to form the backside trench spacers 77. The backside trench spacers 77 include a material that is different from the material of the source-level sacrificial layer 104. For example, the backside trench spacers 77 may include silicon oxide. The lateral thickness of the backside trench spacers 77 can be in a range from 20 nm to 120 nm, although lesser and greater thicknesses can also be employed.

Figure 23B:
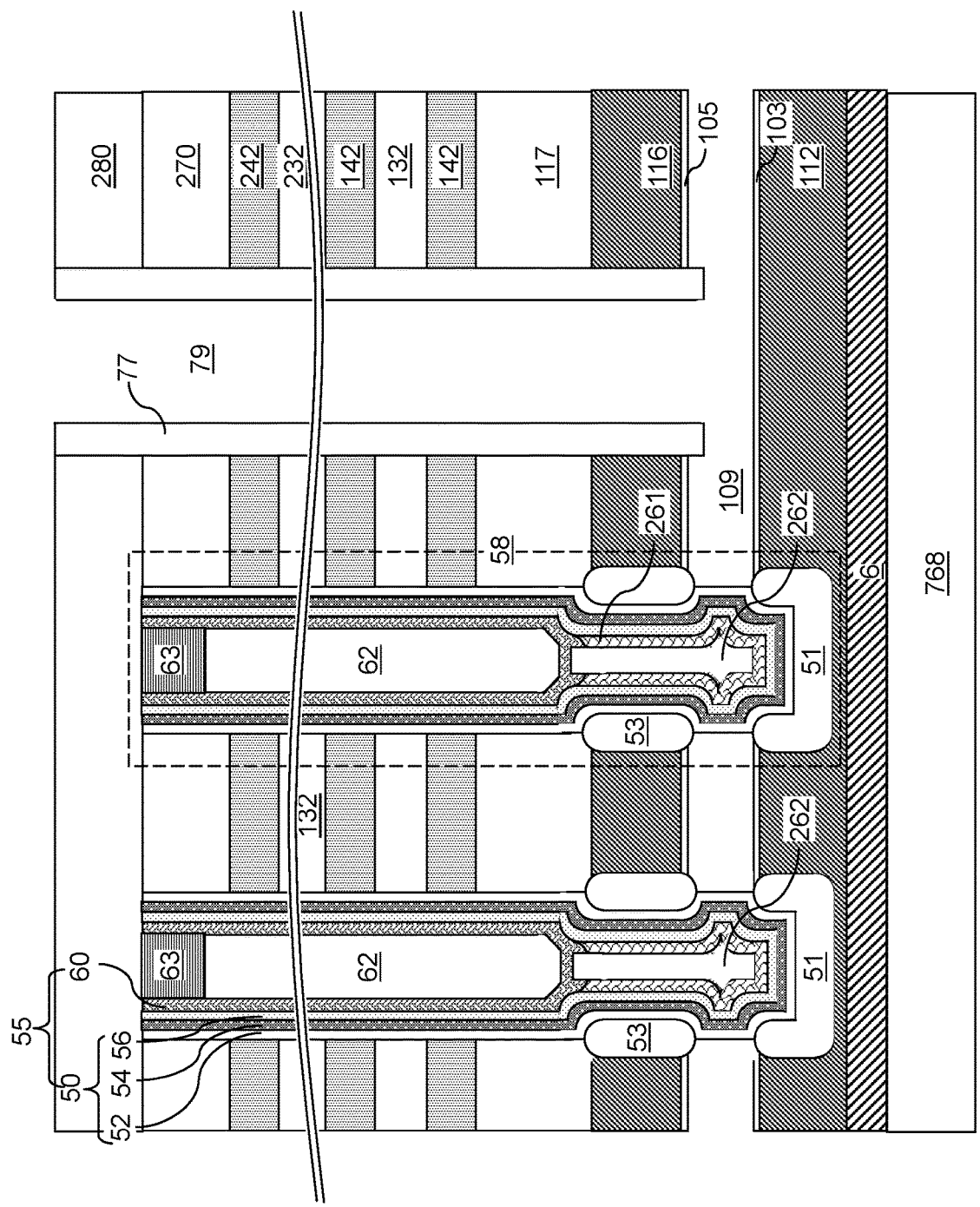

Referring to FIG. 23B, an etchant that etches the material of the source-level sacrificial layer 104 selective to the materials of the first alternating stack (132, 142), the second alternating stack (232, 242), the first and second insulating cap layers (170, 270), the first contact level dielectric layer 280, the upper sacrificial liner 105, and the lower sacrificial liner 103 may be introduced into the backside trenches in an isotropic etch process. For example, if the source-level sacrificial layer 104 includes silicon nitride, the backside trench spacers 77 include silicon oxide, and the upper and lower sacrificial liners (105, 103) include silicon oxide, then a wet etch process employing hot phosphoric acid can be performed to remove the source-level sacrificial layer 104 selective to the backside trench spacers 77 and the upper and lower sacrificial liners (105, 103). A source cavity 109 is formed in the volume from which the source-level sacrificial layer 104 is removed. Each of the memory opening fill structures 58 is physically exposed to the source cavity 109.

Specifically, each of the memory opening fill structures 58 includes a sidewall and that are physically exposed to the source cavity 109. For example, outer sidewalls of the blocking dielectric layers 52 and surface portions of the tubular semiconductor oxide spacers 53 and the semiconductor oxide material portions 51 may be physically exposed to the source cavity 109.

Figure 23C:
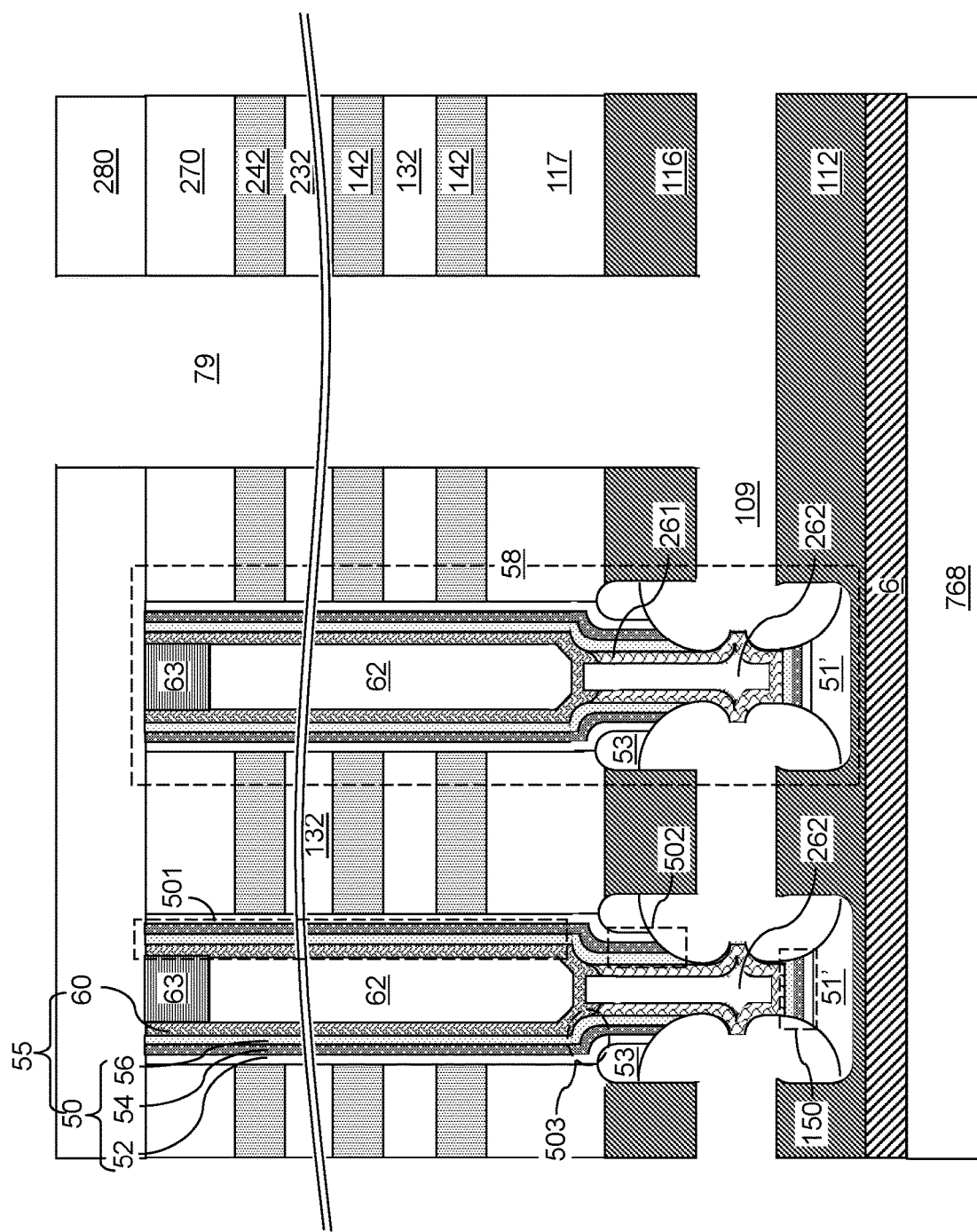

Referring to FIG. 23C, an isotropic etch process, which may include a plurality of etch steps, can be performed to etch portions of the memory films 50 around the source cavity 109. For example, a sequence of isotropic etchants, such as wet etchants, may be applied to the physically exposed portions of the memory films 50 to sequentially etch the various component layers of the memory films 50 from outside to inside, and to physically expose cylindrical surfaces of the semiconductor channels 60 at the level of the source cavity 109. In an illustrative example, the isotropic etch process can sequentially etch the material of the blocking dielectric layer 52, the material of the charge storage layer 54, and the material of the tunneling dielectric layer 56.

The upper and lower sacrificial liners (105, 103) may be collaterally etched during removal of the portions of the memory films 50 located at the level of the source cavity 109. Portions of the tubular semiconductor oxide spacers 53 and the semiconductor oxide material portions 51 that are proximal to the volume of the source cavity 109 as provided at the processing steps of FIG. 23B can be collaterally etched during the isotropic etch process. The backside trench spacers 77 may be collaterally etched partially or fully during the isotropic etch process. Each tubular semiconductor oxide spacer 53 can have a respective annular concave bottom surface that is physically exposed to the source cavity 109. Each cylindrical portion of the semiconductor oxide material portions 51 may be collaterally etched by the isotropic etch process. Each remaining portion of the semiconductor oxide material portions 51 can include a semiconductor oxide plate 51'. In other words, each semiconductor oxide plate 51' can be a remaining semiconductor oxide material portion. Each semiconductor oxide plate 51' can have a respective annular concave surface that is physically exposed to the source cavity 109.

A dielectric plate stack 150 including a remaining portion of a memory film 50 can be formed between each semiconductor oxide plate 51' and an overlying source region 261. Each dielectric plate stack 150 includes a set of dielectric plates. The memory film 50 and the dielectric plate stack can comprise a same sequence of dielectric material compositions from one end to another, i.e., the composition of the blocking dielectric layer 52, the composition of the charge storage layer 54, and the composition of the tunneling dielectric layer 56.

The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the source regions 261.

Figure 23D:
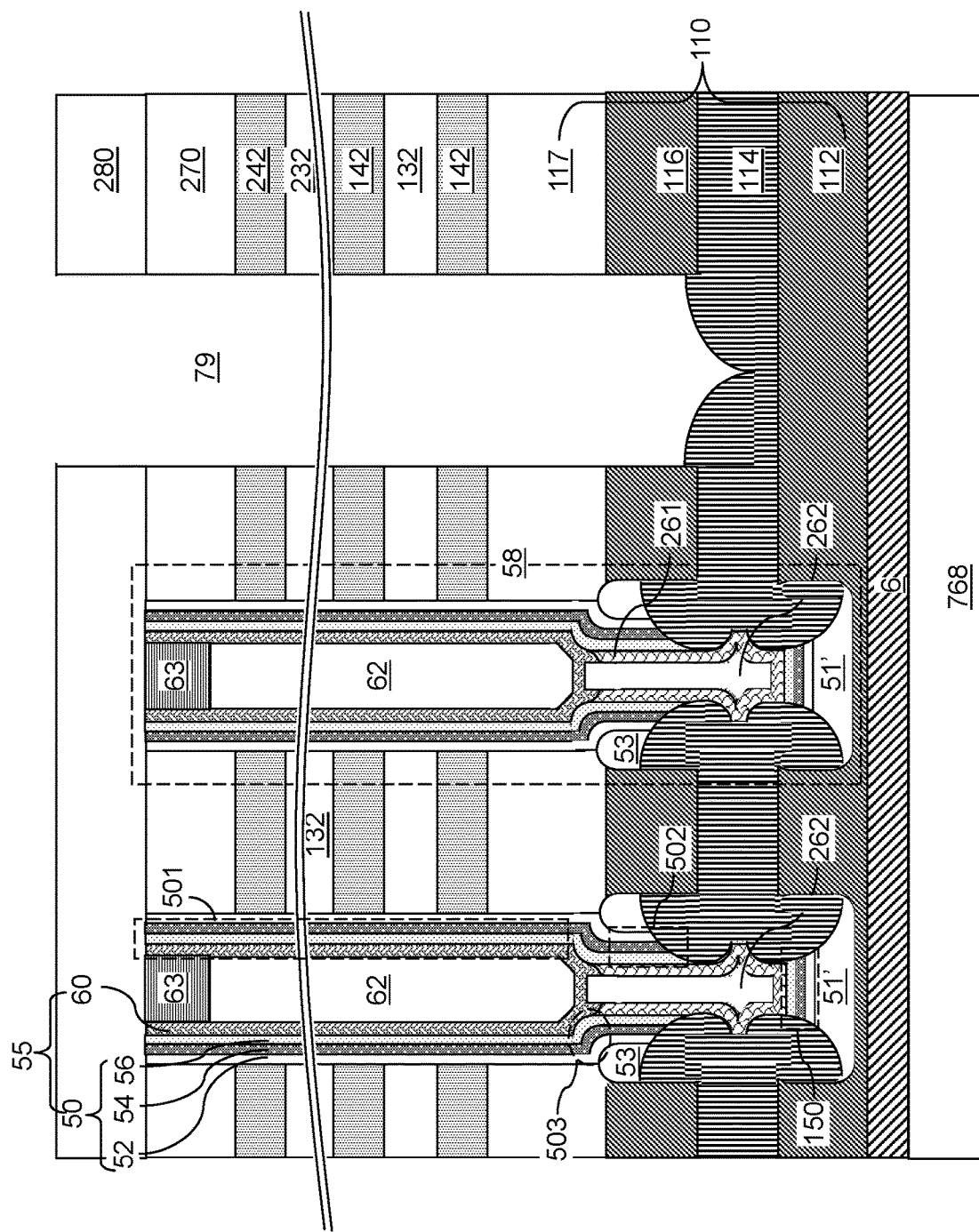

Referring to FIG. 23D, a semiconductor material having a doping of the second conductivity type may be deposited on the physically exposed semiconductor surfaces around the source cavity 109. The physically exposed semiconductor surfaces include bottom portions of outer sidewalls of the source regions 261 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the outer sidewalls of the source regions 261, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the first exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the source regions 261. The atomic concentration of the dopants of the second conductivity type in the deposited semiconductor material may be in a range from $1.0 \times 10^{19}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114, such as an n-type polysilicon or amorphous silicon layer.

The layer stack including the lower source-level semiconductor layer 112, the source contact layer 114, and the upper source-level semiconductor layer 116 constitutes a buried source layer (112, 114, 116). The set of layers including the buried source layer (112, 114, 116) and the source-level insulating layer 117 constitutes source-level material layers 110, which replaces the in-process source-level material layers 110'.

Figure 23E:
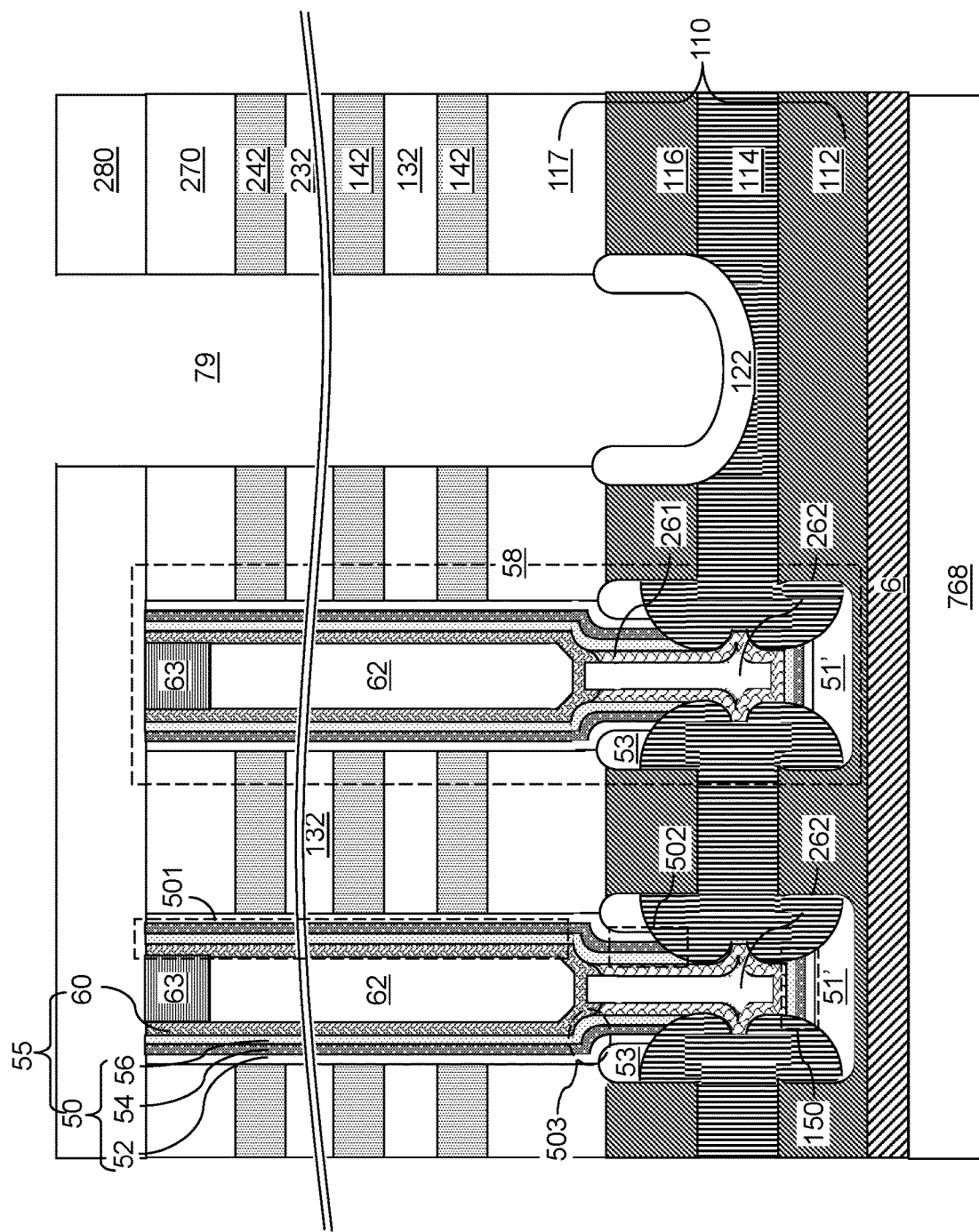

Referring to FIG. 23E, any remaining portion of the backside trench spacers 77 may be removed selective to the source contact layer 114 using an isotropic etch process. For example, if the backside trench spacers 77 include silicon oxide, a wet etch process employing dilute hydrofluoric acid may be performed to remove the backside trench spacers 77. An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide portion 122.

Figure 24:
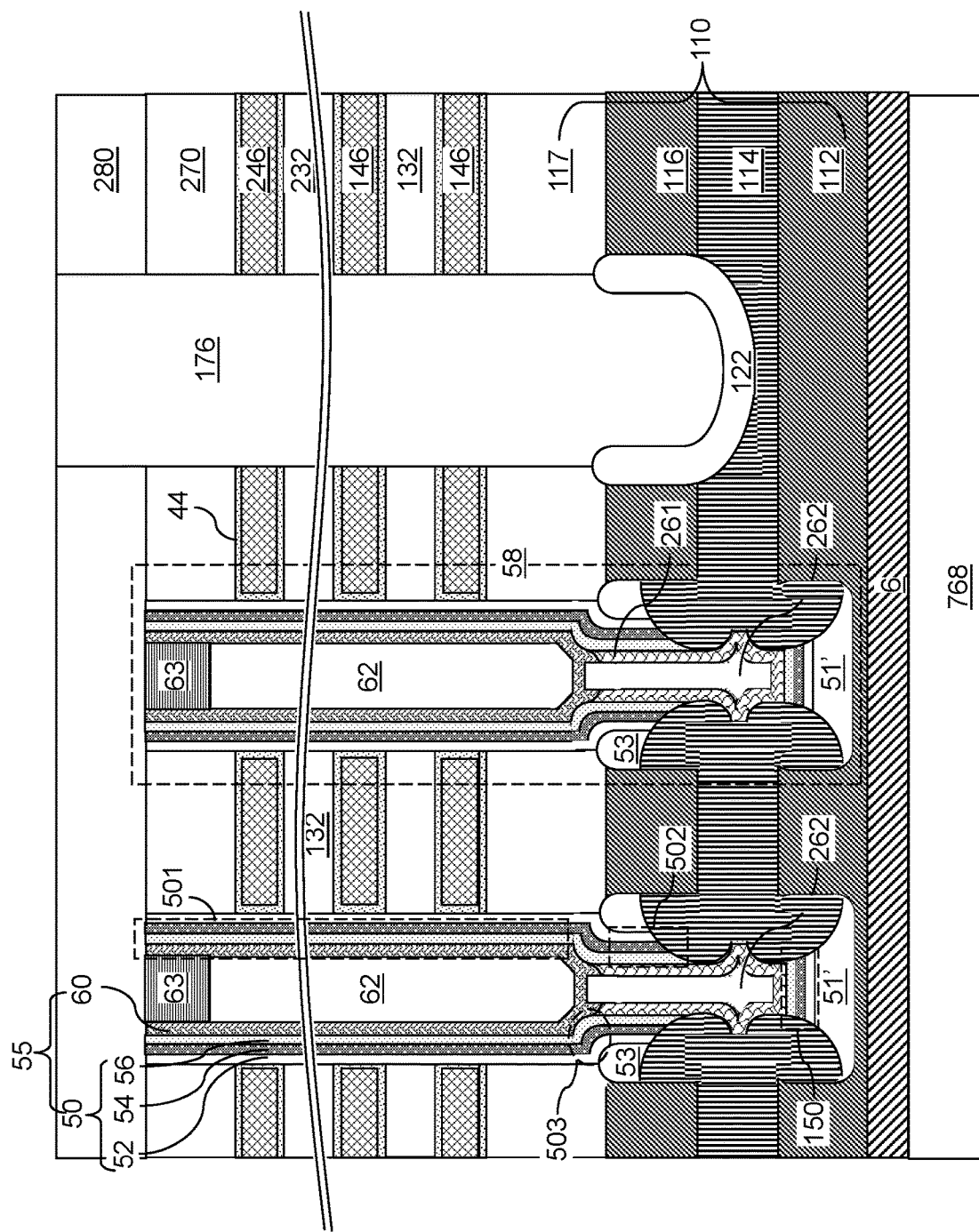
FIG. 24 is a vertical cross-sectional view of a region including a pair of memory openings fill structures and a backside trench in the second exemplary structure at a processing step corresponding to the processing steps of FIGS. 19A-19C.

Referring to FIG. 24, the processing steps of FIGS. 17-19D can be performed to replace the sacrificial material layers (142, 242) with optional backside blocking dielectric layers 44 and electrically conductive layers (146, 246), and to form the dielectric wall structure 176.

In one embodiment, the source region 261 comprises a tubular segment that vertically extends through an upper portion of the source contact layer 114 and above a horizontal plane including a top surface of the source contact layer 114, an annular lateral-protrusion segment laterally protrudes outward from an outer sidewall of the tubular segment of the source region 261, and a bottom segment adjoined to a bottom of the annular lateral-protrusion segment and including a planar plate portion. In one embodiment, the annular lateral-protrusion segment comprises a first concave annular surface facing upward and contacting a first convex annular surface of the source contact layer 114, and a second concave annular surface facing downward and contacting a second convex annular surface of the source contact layer 114.

In one embodiment, the semiconductor channel 60 has a doping of a first conductivity type, and the source region 261 and the source contact layer 114 have a doping of a second conductivity type that is an opposite of the first conductivity type. The lower source-level semiconductor layer 112 contacts a bottom surface of the source contact layer 114 and has a doping of the second conductivity type, and an upper source-level semiconductor layer 116 contacts a top surface of the source contact layer 114 and has a doping of the second conductivity type.

In one embodiment, each of the memory opening fill structures 58 comprises a tubular semiconductor oxide spacer 53 including a dielectric oxide (e.g., silicon oxide) of a semiconductor material of the upper source-level semiconductor layer 116 and comprising a curved inner sidewall that contacts the memory film 50. In one embodiment, each of the memory opening fill structures 58 comprises a semiconductor oxide plate 51' including a dielectric oxide (e.g., silicon oxide) of a semiconductor material of the lower source-level semiconductor layer 112 and comprising a planar bottom surface contacting the lower source-level semiconductor layer 112.

In one embodiment, the dielectric pillar 262 comprise a first undoped silicate glass material portion, and the dielectric core 62 comprises a second undoped silicate glass material portion. In one embodiment, the memory film 50 comprises a charge storage layer 54 comprising a charge storage material and having a concave annular bottom surface that contacts the source contact layer 114, and a tunneling dielectric layer 56 located between the charge storage layer 54 and the semiconductor channel 60 and contacting an upper portion of an outer sidewall of the source region 261.

According to the second embodiment and referring to all related drawings, a three-dimensional memory device is illustrated, which comprises a source contact layer 114 located over a substrate 8 and comprising a doped semiconductor material, an alternating stack of insulating layers (132, 232) and electrically conductive layers (146, 246) located over the source contact layer 114, memory openings 49 vertically extending through the alternating stack {(132, 146), (232, 246)} and the source contact layer 114, and memory opening fill structures 58 located in the memory openings 49. Each of the memory opening fill structures 58 comprises a memory film 50 including a first tubular portion 501 that vertically extends through the alternating stack {(132, 146), (232, 246)}, a semiconductor channel 60 contacting an inner sidewall of the memory film 50, a source region 261 adjoined to a bottom end of the semiconductor channel 60 and contacting the source contact layer 114, a dielectric pillar 262 laterally surrounded by the source region 261, and a dielectric core 62 laterally surrounded by a vertically-extending portion of the semiconductor channel 60 and vertically spaced from the dielectric pillar 262 by a bottom portion of the semiconductor channel 60.

In one embodiment, the bottom portion of the semiconductor channel 60 contacts a top surface of the dielectric pillar 262 and an upper portion of a sidewall of the dielectric pillar 262. In one embodiment, the semiconductor channel 60 contacts the source region 261 at an annular interface containing a p-n junction.

In one embodiment, the source region 261 comprises a tubular segment that vertically extends through an upper portion of the source contact layer 114 and above a horizontal plane including a top surface of the source contact layer 114, an annular lateral-protrusion segment that laterally protrudes outward from an outer sidewall of the tubular segment of the source region 261, and a bottom segment adjoined to a bottom of the annular lateral-protrusion segment and including a planar plate portion. In one embodiment, the annular lateral-protrusion segment comprises a first concave annular surface facing upward and contacting a first convex annular surface of the source contact layer 114, and a second concave annular surface facing downward and contacting a second convex annular surface of the source contact layer 114.

In one embodiment, the semiconductor channel 60 has a doping of a first conductivity type, and the source region 261 and the source contact layer 114 have a doping of a second conductivity type that is an opposite of the first conductivity type. A lower source-level semiconductor layer 112 can contact a bottom surface of the source contact layer 114 and can have a doping of the second conductivity type. An upper source-level semiconductor layer 116 can contact a top surface of the source contact layer 114 and can have a doping of the second conductivity type.

In one embodiment, each of the memory opening fill structures 58 comprises a tubular semiconductor oxide spacer 53, which includes a dielectric oxide of a semiconductor material of the upper source-level semiconductor layer 116 and comprises a curved inner sidewall that contacts the memory film 50 and an annular concave bottom surface that contacts the source contact layer 114.

In one embodiment, each of the memory opening fill structures 58 also comprises a semiconductor oxide plate 51', which includes a dielectric oxide of a semiconductor material of the lower source-level semiconductor layer 112 and comprises a planar bottom surface contacting the lower source-level semiconductor layer 112 and an annular concave surface that contacts the source contact layer 114. In one embodiment, each of the memory opening fill structures 58 comprises a dielectric plate stack 150 including a set of dielectric plates between the source region 261 and the semiconductor oxide plate 51'. The memory film 50 and the dielectric plate stack 150 comprise a same sequence of dielectric material compositions from one end to another.

In one embodiment, the dielectric pillar 262 comprises a first undoped silicate glass material portion, and the dielectric core 62 comprises a second undoped silicate glass material portion.

In one embodiment, the memory film 50 also comprises a second tubular portion 502 that vertically extends below a horizontal plane including a bottommost surface of the alternating stack {(132, 146), (232, 246)} and contacting the source contact layer 114 and having a lesser lateral extent than the first tubular portion 501, and a connection portion 503 that connects the first tubular portion 501 and the second tubular portion 502 and having a gradually increasing lateral extent that increases with a vertical distance from the substrate 8.

In one embodiment, the memory film 50 comprises a charge storage layer 54 comprising a charge storage material and having a concave annular bottom surface that contacts the source contact layer 114, and a tunneling dielectric layer 56 located between the charge storage layer 54 and the semiconductor channel 60 and contacting an upper portion of an outer sidewall of the source region 261.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 8, and one of the plurality of semiconductor channels including the semiconductor channel 60. The array of monolithic three-dimensional NAND strings comprises a plurality of charge storage elements (comprising portions of the memory films 50), each charge storage element located adjacent to a respective one of the plurality of semiconductor channels 60.

A subset of the first electrically conductive layers 146 that are proximal to the buried source layer (112, 114, 116) can be employed to provide electrical bias for generating gate-induced drain leakage (GIDL) current during an erase operation. According to an aspect of the present disclosure, the vertical extent of the source regions (61, 261) can be precisely controlled through a recess process that defines the vertical extent of the doped silicate glass pillars 162 or the source regions 261. The tubular semiconductor oxide spacers 53 of the embodiments of the present disclosure are formed by oxidation of surface portions of the upper source-level semiconductor layer 116. Thus, the vertical extent of the tubular semiconductor oxide spacers 53 is self-aligned to the vertical extent of the upper source-level semiconductor layer 116. The pinch-off points of the doped silicate glass layer 162L or the source material layer 261L are formed in proximity to the topmost portions of the tubular semiconductor oxide spacers 53. As such, the top surfaces of the doped silicate glass pillars 162 and the top surfaces of the source regions (61, 261) are formed in proximity to the topmost portions of the tubular semiconductor oxide spacers 53. Thus, the interfaces between the source regions (61, 261) and the semiconductor channels 60 are formed in proximity to the horizontal plane including the top surface of the buried source layer (112, 114, 116). Thus, the location of the p-n junction between the source regions (61, 261) and the semiconductor channels 60 and the length of the lower portion of each semiconductor channel 60 that is employed for gate-induced drain leakage current can be precisely controlled. Thus, the operational parameters for an erase operation can be well-controlled, and the three-dimensional memory device can provide reliable and fast operation.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    a source contact layer located over a substrate and comprising a doped semiconductor material;
    an alternating stack of insulating layers and electrically conductive layers located over the source contact layer;
    memory openings vertically extending through the alternating stack and the source contact layer; and
    memory opening fill structures located in the memory openings,
wherein each of the memory opening fill structures comprises:
    a memory film including a first tubular portion that vertically extends through the alternating stack;
    a semiconductor channel contacting an inner sidewall of the memory film;
    a source region adjoined to a bottom end of the semiconductor channel and contacting the source contact layer;
    a dielectric pillar laterally surrounded by the source region; and
    a dielectric core laterally surrounded by a vertically-extending portion of the semiconductor channel and vertically spaced from the dielectric pillar by a bottom portion of the semiconductor channel.

2. The three-dimensional memory device of claim 1, wherein the bottom portion of the semiconductor channel contacts a top surface of the dielectric pillar and an upper portion of a sidewall of the dielectric pillar.

3. The three-dimensional memory device of claim 2, wherein the semiconductor channel contacts the source region at an annular interface containing a p-n junction.

4. The three-dimensional memory device of claim 1, wherein the source region comprises:
- a tubular segment that vertically extends through an upper portion of the source contact layer and above a horizontal plane including a top surface of the source contact layer;
- an annular lateral-protrusion segment that laterally protrudes outward from an outer sidewall of the tubular segment of the source region; and
- a bottom segment adjoined to a bottom of the annular lateral-protrusion segment and including a planar plate portion.

5. The three-dimensional memory device of claim 4, wherein the annular lateral-protrusion segment comprises:
- a first concave annular surface facing upward and contacting the source contact layer; and
- a second concave annular surface facing downward and contacting the source contact layer.

6. The three-dimensional memory device of claim 1, wherein:
- the semiconductor channel has a doping of a first conductivity type; and
- the source region and the source contact layer have a doping of a second conductivity type that is an opposite of the first conductivity type.

7. The three-dimensional memory device of claim 6, further comprising:
- a lower source-level semiconductor layer contacting a bottom surface of the source contact layer and having a doping of the second conductivity type; and
- an upper source-level semiconductor layer contacting a top surface of the source contact layer and having a doping of the second conductivity type.

8. The three-dimensional memory device of claim 7, wherein each of the memory opening fill structures further comprises a tubular semiconductor oxide spacer comprising a dielectric oxide of a semiconductor material of the upper source-level semiconductor layer and comprising a curved inner sidewall that contacts the memory film and an annular concave bottom surface that contacts the source contact layer.

9. The three-dimensional memory device of claim 8, wherein each of the memory opening fill structures further comprises a semiconductor oxide plate including a dielectric oxide of a semiconductor material of the lower source-level semiconductor layer and comprising a planar bottom surface contacting the lower source-level semiconductor layer and an annular concave surface that contacts the source contact layer.

10. The three-dimensional memory device of claim 9, wherein:
- each of the memory opening fill structures comprises a dielectric plate stack including a set of dielectric plates between the source region and the semiconductor oxide plate; and
- the memory film and the dielectric plate stack comprise a same sequence of dielectric material compositions from one end to another.

11. The three-dimensional memory device of claim 1, wherein:
- the dielectric pillar comprises a first undoped silicate glass material portion; and
- the dielectric core comprises a second undoped silicate glass material portion.

12. The three-dimensional memory device of claim 1, wherein the memory film further comprises:
- a second tubular portion that vertically extends below a horizontal plane including a bottommost surface of the alternating stack and contacting the source contact layer and having a lesser lateral extent than the first tubular portion; and
- a connection portion that connects the first tubular portion and the second tubular portion and having a gradually increasing lateral extent that increases with a vertical distance from the substrate.

13. The three-dimensional memory device of claim 1, wherein the memory film comprises:
- a charge storage layer comprising a charge storage material and having a concave annular bottom surface that contacts the source contact layer; and
- a tunneling dielectric layer located between the charge storage layer and the semiconductor channel and contacting an upper portion of an outer sidewall of the source region.

* * * * *